United States Patent
Bell et al.

(10) Patent No.: US 11,903,318 B2
(45) Date of Patent: *Feb. 13, 2024

(54) THERMOELECTRIC ELEMENTS AND DEVICES WITH ENHANCED MAXIMUM TEMPERATURE DIFFERENCES BASED ON SPATIALLY VARYING DISTRIBUTED TRANSPORT PROPERTIES

(71) Applicant: DTP Thermoelectrics LLC, Pasadena, CA (US)

(72) Inventors: Lon Bell, Altadena, CA (US); Douglas Crane, El Cerrito, CA (US)

(73) Assignee: DTP Thermoelectrics LLC, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/077,987

(22) Filed: Dec. 8, 2022

(65) Prior Publication Data

US 2023/0120260 A1  Apr. 20, 2023

Related U.S. Application Data

(63) Continuation of application No. 17/385,241, filed on Jul. 26, 2021, now Pat. No. 11,581,467, which is a
(Continued)

(51) Int. Cl.
*H10N 19/00* (2023.01)
*H10N 10/17* (2023.01)
*H10N 10/857* (2023.01)

(52) U.S. Cl.
CPC .......... *H10N 19/101* (2023.02); *H10N 10/17* (2023.02); *H10N 10/857* (2023.02)

(58) Field of Classification Search
CPC ..... H10N 19/101; H10N 10/17; H10N 10/857
See application file for complete search history.

(56) References Cited

U.S. PATENT DOCUMENTS 3,212,274 A  10/1965  Eidus
3,564,860 A   2/1971  Reich et al.
(Continued)

FOREIGN PATENT DOCUMENTS

CN  106885588 A  6/2017
EP   1669697 A1  6/2006
(Continued)

OTHER PUBLICATIONS

Japanese Office Action dated Apr. 24, 2023 in Japanese Application No. 2021-544747 (EN translation).
(Continued)

*Primary Examiner* — Tamir Ayad
(74) *Attorney, Agent, or Firm* — Snell & Wilmer, L.L.P.; Jaime D. Choi

(57) ABSTRACT

Provided herein is a thermoelectric element that includes a cold end, a hot end, and a p-type or n-type material having a length between the hot end and the cold end. The p-type or n-type material has an intrinsic Seebeck coefficient (S), an electrical resistivity (ρ), and a thermal conductivity (λ). Each of two or more of S, ρ, and λ generally increases along the length from the cold end to the hot end. The thermoelectric element may be provided in single-stage thermoelectric devices providing enhanced maximum temperature differences. The single-stage thermoelectric devices maybe combined with one another to provide multi-stage thermoelectric devices with even further enhanced maximum temperature differences.

24 Claims, 42 Drawing Sheets

Related U.S. Application Data continuation of application No. PCT/US2020/016247, filed on Jan. 31, 2020.

(60) Provisional application No. 62/800,346, filed on Feb. 1, 2019.

(56) References Cited

U.S. PATENT DOCUMENTS

| | | | |
|---|---|---|---|
| 5,361,587 | A | 11/1994 | Hoffman |
| 6,672,076 | B2 | 1/2004 | Bell |
| 7,752,852 | B2 | 7/2010 | Akei et al. |
| 8,307,663 | B2 | 11/2012 | Akei et al. |
| 9,178,128 | B2 | 11/2015 | Jovovic |
| 9,506,675 | B1 | 11/2016 | Campbell et al. |
| 9,865,788 | B2 | 1/2018 | Laemmle et al. |
| 11,421,919 | B2 | 8/2022 | Bell et al. |
| 11,581,467 | B2 | 2/2023 | Bell et al. |
| 2004/0042181 | A1 | 3/2004 | Nagasaki |
| 2007/0095382 | A1 | 5/2007 | Snyder et al. |
| 2007/0101750 | A1 | 5/2007 | Pham et al. |
| 2009/0007952 | A1 | 1/2009 | Kondoh et al. |
| 2011/0036384 | A1 | 2/2011 | Culp |
| 2011/0120517 | A1 | 5/2011 | Li |
| 2012/0139075 | A1 | 6/2012 | Shankar et al. |
| 2013/0000688 | A1 | 1/2013 | Cho et al. |
| 2013/0074898 | A1 | 3/2013 | Snyder |
| 2013/0255743 | A1 | 10/2013 | Ogimoto |
| 2013/0327063 | A1 | 12/2013 | Gawthrop |
| 2014/0366926 | A1 | 12/2014 | Ashkenazi |
| 2017/0284708 | A1 | 10/2017 | Wang et al. |
| 2019/0077225 | A1 | 3/2019 | Nakamura et al. |

FOREIGN PATENT DOCUMENTS

| | | |
|---|---|---|
| JP | 10510677 | 10/1998 |
| JP | 2013089719 A | 5/2013 |
| JP | 2014511031 | 5/2014 |
| JP | 2017204550 A | 11/2017 |
| JP | 2018192968 A2 | 12/2018 |
| KR | 100298724 B1 | 11/2001 |
| KR | 20160115430 A | 10/2016 |
| WO | 2006043514 A1 | 4/2006 |
| WO | 2007027171 A1 | 3/2007 |

OTHER PUBLICATIONS

Anatychuk, et al., "Functionally Graded Materials and New Prospects for Thermoelectricity Use," 16$^{th}$ International Conference on Thermoelectrics; pp. 588-591 (1997).
Angrist, "Direct Energy Conversion," Thermoelectric Generators Chapter 4; pp. 139-144 (1965).
Astrain, et al., "Improvements in the cooling capacity and the COP of a transcritical $CO_2$ refrigeration plant operating with a thermoelectric subcooling system," Applied Thermal Engineering; 155: pp. 110-122 (2019).
Bell, Lon E., "Optimally Distributed Transport Properties Can Produce Highest Performance Thermoelectric Systems," Phys. Status Solidi A; 1900562: pp. 1-7 (2019) https://doi.org/10.1002/pssa.201900562.
Bhattacharjee, et al., "A shield based thermoelectric converter system with a thermosyphonic heat sink for utilization in woodstoves." ICAER; pp. 1-13 (2015).
Bian, et al., "Beating the maximum cooling limit with graded thermoelectric materials." Appl. Phys. Lett. 89; 212101: pp. 1-3 (2006) https://doi.org/10.1063/1.2396895.
Buist, R.J. "The Extrinsic Thomson Effect." Proceedings of the 14th International Conference on Thermoelectrics, St. Petersburg; pp. 1-4 (1995).
Chung et al., "$CsBi_4Te_6$: A high-performance thermoelectric material for low-temperature applications," Science 287; pp. 1024-1027 (2000) DOI: 10.1126/science.287.5455.1024.
Cramer et al., "Performance of Functionally Graded Thermoelectric Materials and Devices: A Review," Journal of Electronic Materials, vol. 47, No. 9 (Year: 2018).
Crane, et al., "Maximum temperature difference in a single-stage thermoelectric device through distributed transport properties," International Journal of Thermal Sciences 154; pp. 1-9 (2020) https://doi.org/10.1016/j.ijthermalsci.2020.106404.
Goldsmid, "The physics of thermoelectric energy conversion," Morgan & Claypool; pp. 1-6 (2017) doi:10.1088/978-1-6817-4641-8.
International Search Report and Written Opinion of the International Searching Authority dated Apr. 29, 2020 in Int'l PCT Patent Appl. Serial No. PCT/US2020/016247 (9 pages).
International Search Report and Written Opinion of the International Searching Authority dated Sep. 17, 2021 in Int'l PCT Patent Appl. Serial No. PCT/US2021/037249 (13 pages).
International Search Report and Written Opinion of the International Searching Authority dated Oct. 7, 2021 in Int'l PCT Patent Appl. Serial No. PCT/US2021/037253 (8 pages).
Jamali, et al., "Performance improvement of a transcritical $CO^2$ refrigeration cycle using two-stage thermoelectric modules in sub-cooler and gas cooler," International Journal of Refrigeration; 74: pp. 105-115 (2017) http://dx.doi.org/10.1016/j.ijrefrig.2016.10.007.
Kaliazin et al., "Rigorous calculations related to functionally graded and segmented thermoelectrics," International Conference on Thermoelectrics; pp. 286-291 (2001).
Kishore, et al., "Ultra-high performance wearable thermoelectric coolers with less materials," Nature Communications; 10:1: pp. 1-13 (2019).
Korshuev, et al., "Efficiency of Low-Grade Heat Recovery Using Various Thermoelectric Converters." Journal of Thermoelectricity; ISSN 16070-8829, 1: pp. 63-70 (2011).
Kuznetsov, "Functionally graded materials for thermoelectric applications," Thermoelectrics Handbook—Macro to Nano (D.M. Rowe, editor, CRC Tatlor & Francis; pp. 1-12 (2006)).
Kwan, et al., "Application of the Peltier sub-cooled trans-critical carbon dioxide heat pump system for water heating—Modelling and performance analysis," Energy Conversion and Management; 185: pp. 574-585 (2019) https://doi.org/10.1016/j.enconman.2019.01.104.
Lee et al., "Nanoporous Si as an Efficient Thermoelectric Material," Nano Letters; 8(11): pp. 3750-3754 (2008).
Llopis, et al., "Subcooling methods for $CO_2$ refrigeration cycles: A review," International Journal of Refrigeration; 93: pp. 85-107 (2018) https://doi.org/10.1016/j.ijrefrig.2018.06.010.
Muller et al., "Separated effect of 1 D thermoelectric material gradients", International Conference on Thermoelectrics, pp. 1-6. (2006).
Müller, et al., "Optimization Strategies for Segmented Peltier Coolers," Physica Status Solidi (a) 203(8): pp. 2128-2141 (2006) DOI 10.1002/pssa.200521047.
Nakamura, "First-principles simulation on Seebeck coefficient in silicon and silicon carbide nanosheets," Japanese Journal of Applied Physics Part 1; 55: 06GJ07, pp. 1-9 (2016).
Nolas et al., "Thermoelectrics—Basic principles and new materials developments," Springer-Verlag, Berlin Heidelberg; pp. 1-5 (2001).
Ren, et al., "Thermal conductivity anisotropy in holey silicon nanostructures and its impact on thermoelectric cooling," Nanotechnology; 29: 045404, pp. 1-8 (2018) https://doi.org/10.1088/1361-6528/aa9f07.
Rull-Bravo, et al., "Skutterudites as Thermoelectric Materials: Revisted," RSC Advances; 5: pp. 41653-41667 (2015).
Sarkar, "Performance optimization of transcritical $CO_2$ refrigeration cycle with thermoelectric subcooler," Int. J. Energy Res; 37: pp. 121-128 (2013) https://onlinelibrary.wiley.com/doi/abs/10.1002/er.1879.
Schierning, "Silicon nanostructures for thermoelectric devices: A review of the current state of the art," Phys. Status Solidi A; 211(6): pp. 1235-1249 (2014) DOI:10.1002/pssa.201300408.
Schoenfeld, et al., "Experimental Results: Thermoelectric 'Subcooler' for $CO_2$ Transcritical Vapor Compression System," International Institute of Refrigeration; record ID: 2010-1890: pp. 1-26 (2009).

(56) References Cited

OTHER PUBLICATIONS

Schoenfield, et al., "$CO_2$ transcritical vapor compression cycle with thermoelectric subcooler," HVAC&R Research; 18(3): pp. 297-311 (2012) https://doi.org/10.1080/10789669.2012.625348.

Semeniouk et al., "Single stage thermoelectric coolers with temperature difference of 80K," International Conference on Thermoelectrics, St. Petersburg, Russia; pp. 485-489 (1995).

Shao, et al., "Thermodynamic transition from subcritical to transcritical $CO_2$ cycle," International Journal of Refrigeration; 64: pp. 123-129 (2016) http://dx.doi.org/10.1016/j.ijrefrig.2016.01.018.

Snyder et al. "Supercooling of Peltier cooler using a current pulse," Journal of Applied Physics; 92: pp. 1564-1569 (2002) http://dx.doi.org/10.1063/1.1489713.

Snyder, et al., "Improved thermoelectric cooling based on the Thomson effect." American Physical Society; Physical Review B 86, 045202: pp. 1-8 (2012) DOI: 10.1103/PhysRevB.86.045202.

Stranz et al., "Thermoelectric Properties of a High-Doped Silicon from Room Temperature to 900K," Journal of Electronic Materials; 42(7): pp. 2381-2387 (2013) DOI: 10.1007/s11664-013-2508-0.

Tang et al., "Holey silicon as an efficient thermoelectric material," Nanoletters; 10: pp. 4279-4283 (2010).

Tritt, et al., "Thermoelectric materials, phenomena, and applications: A bird's eye view" MRS Bulletin; 31: pp. 188-229 (2006).

Vikhor, et al., "Theoretical evaluation of maximum temperature difference in segmented thermoelectric coolers," Applied Thermal Engineering; 26: pp. 1692-1696 (2006) https://doi.org/10.1016/j.applthermaleng.2005.11.009.

Walczak, et al., "Modeling of Segmented Peltier Cooling with Discrete and Continuous Concentration Function." Trans Tech Publications, Switzerland Materials Science Forum; 492-493: pp. 507-516 (2005) doi:10.4028/www.scientific.net/MSF.

Wang, et al., "Exact Solution of a Constrained Optimization Problem in Thermoelectric Cooling." Applied Mathematical Sciences; 2(4): pp. 177-186 (2008).

Wang, et al., "Experimental and numerical investigation of a $CO_2$ heat pump system for electrical vehicle with series gas cooler configuration," International Journal of Refrigeration; 100: pp. 156-166 (2019) https://doi.org/10.1016/j.ijrefrig.2018.11.001.

Wantha, "Experimental investigation of the influence of thermoelectric subcooler on the performance of R134a refrigeration systems," Applied Thermal Engineering; 80: pp. 1-8 (2020) https://doi.org/10.1016/j.applthermaleng.2020.115829.

Winkler, et al., "Potential Benefits of Thermoelectric Element Used With Air-Cooled Heat Exchangers," Purdue University Purdue e-Pubs, International Refrigeration and Air Conditioning Conference; Paper 813: pp. 1-9 (2006) http://docs.lib.purdue.edu/iracc/813.

Yamashita, et al., "Dependence of Seebeck Coefficient on Carrier Concentration in Heavily B- and P-Doped $Si_{1-x}Ge_x$ ($x \leq 0.05$) System" Japanese Journal of Applied Physics; 38(11): pp. 6394-6400 (1999).

Yazawa, et al., "Cost Optimization of Thermoelectric Sub-Cooling in Air-cooled $CO_2$ Air Conditioners," International Refrigeration and Air Conditioning Conference; Paper 1626: pp. 1-10 (2016) http://docs.lib.purdue.edu/iracc/1626.

Zhou et al., "Pulsed cooling of inhomogeneous thermoelectric materials," Journal of Physics D: Applied Physics; 40: pp. 4376-4381 (2007).

Zhu, et al., "Theoretical study of a thermoelectric-assisted vapor compression cycle for air-source heat pump applications," International Journal of Refrigeration; 51: pp. 33-40 (2015) http://dx.doi.porg/10.1016/j.ijrefrig.2014.12.001.

Ziabari, "Nanoscale solid-state cooling: A review," Reports on Progress in Physics; 79(095901): pp. 1-35 (2016) doi:10.1088/0034-4885/79/9/095901.

Chinese Office Action dated Apr. 24, 2023 in Chinese Application No. 202080011948.0 (EN translation).

Korean Office Action dated Jun. 15, 2023 in Korean Application No. 10-2021-7024002 (EN translation).

THERMOELECTRIC ELEMENTS AND DEVICES WITH ENHANCED MAXIMUM TEMPERATURE DIFFERENCES BASED ON SPATIALLY VARYING DISTRIBUTED TRANSPORT PROPERTIES

CROSS-REFERENCE TO RELATED APPLICATIONS

This application is a continuation under 35 U.S.C. § 120 of U.S. patent application Ser. No. 17/385,241, filed Jul. 26, 2021 and entitled "Thermoelectric Elements and Devices with Enhanced Maximum Temperature Differences Based on Spatially Varying Distributed Transport Properties," which is a continuation of International Patent Application No. PCT/US2020/016247, filed Jan. 31, 2020 and entitled "Thermoelectric Elements and Devices with Enhanced Maximum Temperature Differences Based on Spatially Varying Distributed Transport Properties," which claims the benefit of U.S. Provisional Patent Application No. 62/800,346, filed on Feb. 1, 2019 and entitled "Optimally Distributed Transport Properties Combined with Variable Leg Area for Highest Performance Thermoelectric Device," the entire contents of each of which are incorporated by reference herein.

FIELD

This application relates to thermoelectric elements and devices with distributed transport properties.

BACKGROUND

A material with distributed transport properties (DTP) has varying properties (Seebeck coefficient, electrical resistivity, and thermal conductivity) at different spatial locations within the material at the same temperature. This concept has also been described as functionally graded material. First described as a material utilizing the distributed Peltier effect by Reich et al.'s patent application, filed in 1966 and issued as U.S. Pat. No. 3,564,860 in 1971, claimed a material "having differing thermoelectric properties along the spatial extent thereof between said hot junction and said cold junction" and further states that the absolute value of the Seebeck coefficient at the cold junction is "significantly less than the absolute value of the Seebeck coefficient of material at said hot junction."

Buist described an approach as the extrinsic Thomson effect in "The Extrinsic Thomson Effect (ETE)," International Conference on Thermoelectrics (Cardiff, Wales, 1991). In this paper, he describes test results for a three stage device with up to 20% gain in maximum temperature difference. The group of Walczak, Seifert, and Muller conducted modelling studies achieving a maximum temperature difference of 10-20% using what they called the functionally graded material (FGM) effect as described in "Modeling of segmented Peltier cooling with discrete and continuous concentration function," Materials Science Forum 492-493: 507-516 (2005) and "Optimization strategies for segmented Peltier coolers," Physica Status Solidi (a) 203(8): 2128-2141 (2006). They claimed that no substantial improvement can be achieved with greater than five stages. Korzhuev and Nikhesina also described the effect that creates improvement by " . . . 20% and more" in "Efficiency of low-grade heat recovery using various thermoelectric converters," Journal of Thermoelectricity No. 1, 4: 63-70 (2011). Kaliazin et al. studied FGM stating that "real coefficient of performance can indeed be significantly different from that given by Ioffe formula, particularly in the regime of maximum temperature" in "Rigorous calculations related to functionally graded and segmented thermoelectrics," International Conference on Thermoelectrics (2001). Semeniouk et al. described fabrication of a device with distributed properties in two segments by the Czochralski method, achieving a maximum temperature difference of 83K for a single stage device in "Single stage thermoelectric coolers with temperature difference of 80K," International Conference on Thermoelectrics (St. Petersburg, Russia, 1995). Bian and Shakouri described that "cooling enhancement is attributed to the redistribution of the Joule heating and Peltier cooling profiles" in "Beating the maximum cooling limit with graded thermoelectric materials," Applied Physics Letters 89: 212101-1 to -3 (2006). They concluded that "more than twice maximum cooling temperature of the uniform material with the same ZT can be achieved".

Anatychuk and Vikhor described different methods to produce functionally graded materials, including by pressing, extrusion, zone melting, and the Czochralski method in "Functionally graded materials and new prospects for thermoelectricity use," International Conference on Thermoelectrics (1997). Kuznetsov further described making functionally graded materials using the Bridgeman method, Czochralski technique, plasma spray method, diffusion of a dopant from a gaseous phase, zone leveling technique, and hot pressing of powder layers containing different amounts of a dopant in "Functionally graded materials for thermoelectric applications," Thermoelectrics Handbook—Macro to Nano (D. M. Rowe, editor, CRC Tatlor & Francis, 2006). He further concluded that the efficiency of a functionally graded material is insensitive to variations in the doping profile "which means that the carrier concentration along the length of the material does not have to match exactly the optimum profile to achieve thermoelectric efficiency very close to its maximum possible value".

SUMMARY

Provided herein are thermoelectric elements and devices with enhanced maximum temperature differences based on spatially varying distributed transport properties.

Under one aspect, provided herein is a thermoelectric element that includes a cold end, a hot end, and a p-type or n-type material having a length between the hot end and the cold end. The p-type or n-type material has an intrinsic Seebeck coefficient (S), an electrical resistivity ($\rho$), and a thermal conductivity ($\lambda$). Each of two or more of S, $\rho$, and $\lambda$ generally increases along the length from the cold end to the hot end.

The increases in each of two or more of S, $\rho$, and $\lambda$ optionally are selected such that at maximum coefficient of performance (COP), a curve describing the temperature increase between the cold end and the hot end is concave.

Additionally, or alternatively, in some configurations, each of all three of S, $\rho$, and $\lambda$ a generally increases along the length from the cold end to the hot end.

Additionally, or alternatively, S at a first location along the length optionally is at least 2.5 times S at a second location along the length.

Additionally, or alternatively, a cross-sectional area of the p-type or n-type material optionally varies along the length.

Additionally, or alternatively, a composition, doping, crystal structure, or porosity of the p-type or n-type material optionally varies along the length.

Additionally, or alternatively, the p-type or n-type material optionally is selected from the group consisting of bismuth telluride, cesium bismuth telluride, and bismuth antimony.

Additionally, or alternatively, the p-type or n-type material optionally includes a metallic thermoelectric material, an organic thermoelectric material, or porous silicon.

Under another aspect, a single-stage thermoelectric device is provided that includes the above-described thermoelectric element and any suitable options thereof, such as described above.

In such a thermoelectric device, the general increases in each of two or more of S, ρ, and λ optionally are selected such that $\Delta T_{max}/T_H$ is at least 0.2.

Additionally, or alternatively, the general increases in each of two or more of S, ρ, and λ optionally are selected such that $\Delta T_{max}/T_H$ is at least 0.25.

Additionally, or alternatively, variation in the cross-sectional area optionally is selected such $\Delta T_{max}/T_H$ is at least 0.3.

Additionally, or alternatively, a cross-sectional area of the p-type or n-type material optionally varies along the length.

Under another aspect, a multi-stage thermoelectric device is provided that includes a plurality of the above-described single-stage thermoelectric devices and any suitable options thereof, such as described above.

Under still another aspect, a thermoelectric device is provided that includes a first thermoelectric element including a p-type material, a hot end, a cold end, a length between the hot end and the cold end. The first thermoelectric element has an intrinsic Seebeck coefficient ($S_p$), an electrical resistivity ($\rho_p$), and a thermal conductivity ($\lambda_p$), wherein each of two or more of $S_p$, $\rho_p$, and $\lambda_p$ generally increases along the length from the cold end to the hot end. The thermoelectric device also includes a second thermoelectric element including an n-type material, a hot end, a cold end, a length between the hot end and the cold end. The second thermoelectric element has an intrinsic Seebeck coefficient ($S_n$), an electrical resistivity ($\rho_n$), and a thermal conductivity ($\lambda_n$), wherein each of two or more of $S_n$, $\rho_n$, and $\lambda_n$ generally increases along the length from the cold end to the hot end. The thermoelectric device also includes a first electrode electrically coupled to the hot end of the first thermoelectric element and to the hot end of the second thermoelectric element, a second electrode electrically coupled to the cold end of the first thermoelectric element, and a third electrode electrically coupled to the cold end of the second thermoelectric element.

Optionally, the general increases in each of two or more of $S_p$, $\rho_p$, and $\lambda_p$ and the general increases in each of two or more of $S_n$, $\rho_n$, and $\lambda_n$ are selected such that $\Delta T_{max}/T_H$ is at least 0.33.

Additionally, or alternatively, respective cross-sectional areas of the p-type material and the n-type material optionally vary along the length.

Additionally, or alternatively, optionally a composition, doping, crystal structure, or porosity of each of the p-type and n-type materials independently vary along the length.

Additionally, or alternatively, $S_p$ at a first location along the length is at least 2.5 times $S_p$ at a second location along the length, and $S_n$ at a first location along the length is at least 2.5 times $S_n$ at a second location along the length.

Additionally, or alternatively, the general increases in each of two or more of $S_p$, $\rho_p$, and $\lambda_p$ and the general increases in each of two or more of $S_n$, $\rho_n$, and $\lambda_n$ optionally are selected such that $\Delta T_{max}/T_H$ is at least 0.43.

Additionally, or alternatively, at least one respective interface between the first thermoelectric element and the first or second electrodes or between the second thermoelectric element and the first or third electrodes optionally is textured so as to reduce interfacial resistance.

Additionally, or alternatively, the thermoelectric device optionally further includes a control module electrically coupled to the second and third electrodes. Optionally, the control module is configured so as to pass current in series through the first thermoelectric element, the first electrode, and the second thermoelectric element via the second and third electrodes. As a further option, first and second thermoelectric elements respectively are optionally configured to pump heat from the second and third electrodes to the first electrode responsive to the current.

Additionally, or alternatively, the thermoelectric device optionally further includes a heat sink thermally coupled to the first electrode and a cold sink thermally coupled to the second and third electrodes, the heat sink and the cold sink generating a temperature gradient between the respective hot and cold ends of the first and second thermoelectric elements. Optionally, the first and second thermoelectric elements respectively are configured to generate a current and a voltage through the control module responsive to the temperature gradient.

DETAILED DISCLOSURE

Figure 1A:
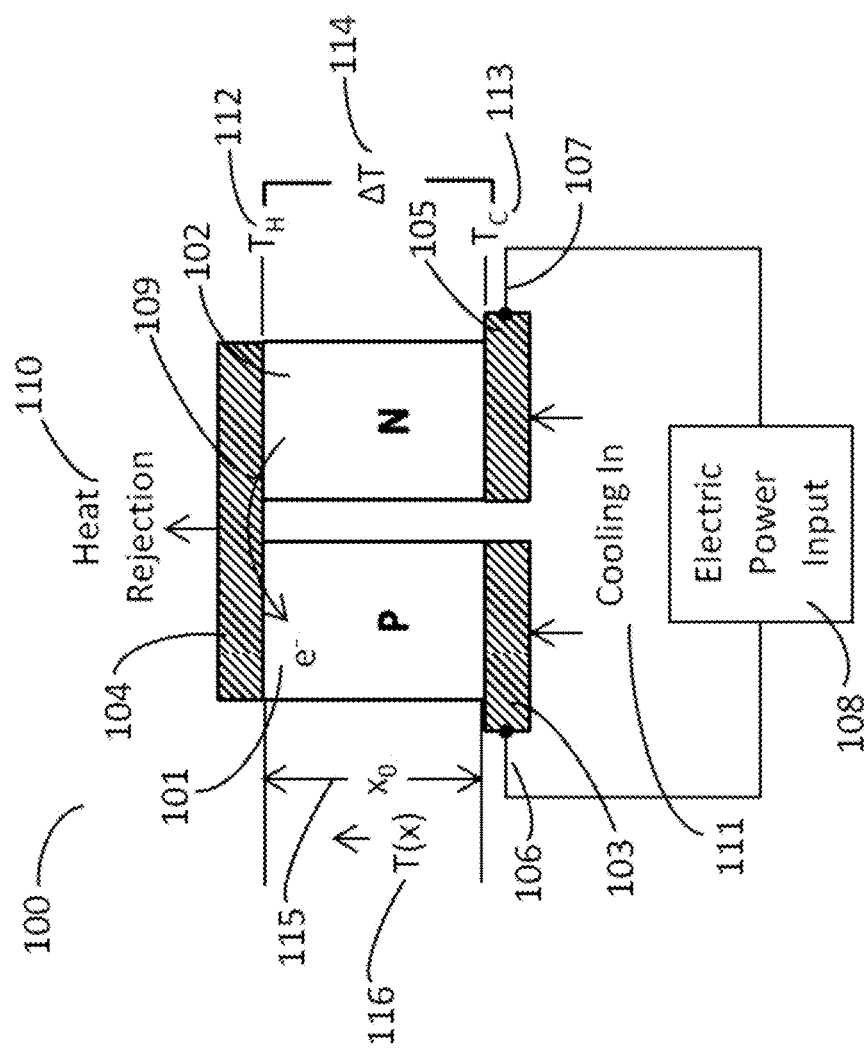
FIGS. 1A-1C schematically illustrate example thermoelectric (TE) devices with spatially varying distributed transport properties (DTP), such as provided herein.

Provided herein are thermoelectric elements and devices with enhanced maximum temperature differences based on spatially varying distributed transport properties.

For example, provided herein is a thermoelectric (TE) material through the use of distributed transport properties (DTP) along with optionally variable leg geometry and optional material combinations that provides a thermoelectric device to achieve a maximum temperature difference greater, for example, than 130 C in a single stage device and over 160 C with a two-stage cascaded device. Maximum coefficient of performance (COP) may be substantially higher for off-nominal conditions than standard devices. Maximum COP also may be considerably higher for high temperature difference in lower figure of merit (ZT) materials, enabling the potential use of lower cost base materials. In several examples, maximum heat pumping can be increased by over 100%.

The present disclosure provides for a thermoelectric element and device to be created that provides a maximum temperature difference in a single-stage device that was not believed to be possible before. A single stage device is simpler than a multi-stage device, thus enabling further applications where this type of steady-state cooling can be used. When the present thermoelectric element is used with multi-stage devices, maximum temperature differences can be achieved that were not believed to be possible before. The present disclosure also enables off-nominal operation with higher COPs than previously possible over a wider range of conditions.

For example, provided herein is a closed-form set of equations defining the improvements possible with DTP for thermoelectric cooling, heating, and power generation. The equations provide maximum temperature difference and optimum performance solutions with constant ZT and variable DTP as a function of position. In power generation, efficiency gains for DTP systems may be relatively large for $\Delta T/T_H > 0.6$, both for optimal and off-nominal conditions, where $T_H$ is the hot side temperature ($\Delta T/T_H$ equivalently may be expressed as DT/Th or the like herein). Maximum power gains for DTP may be significant for operation at large temperature differentials.

Also provided herein is a comprehensive model that breaks the TE leg into, for example, 100 steps (could be more) and includes contact resistances & operating environment. A DTP study using real, temperature dependent material properties, guided by Pisarenko relation, is described. The model can simulate standard devices as well as multi-stage cascaded devices both with and without DTP and with and without segmentation. Multi-variable optimization includes, for example, temperatures, current, Seebeck coefficients, and leg areas. The model enables studies to include packing fraction, leg area difference between p- and n-legs, number of DTP stages, size ratio change between adjacent stages in cascaded devices, and leg segmentation. The model enables the material study of different thermoelectric materials, including $Bi_2Te$, $CsBi_4Te_6$, and thermomagnetic $Bi_{0.88}Sb_{0.12}$. Also provided herein is the ability to simulate off-nominal conditions after an optimal solution has been determined by fixing transport properties (still preserving temperature dependence) and leg areas and solving for temperature profiles at different currents. The numerical results match results based on closed-form analytical equations and commercial modules characteristics.

Also provided herein are innovations that include an expanded range of Seebeck coefficient to provide further improvement to double maximum ΔT for fixed ZT For example, DTP may be combined with variable area to provide further improve maximum ΔT by 20% as compared to over a constant area. As another example, DTP with variable area may be combined with segmentation with alternative thermoelectric materials, including cesium bismuth telluride, $CsBi_4Te_6$ (p-type) combined with bismuth antimony, magnetically enhanced BiSb (n-type). As another example, provided herein is combining $CsBi_4Te_6$ (p-type) with BiSb (and thermo magnetic BiSb) (n-type) for improved low temperature performance. As another example, provided herein is segmenting $Bi_2Te_3$ with $CsBi_4Te_6$ & BiSb for improved low temperature performance. Also provided herein is use of a DTP/segmented leg in a cascaded device. Also provided herein is improved cascade performance by optimizing couple ratio between stages, including improved heat spreading at the interface between stages. Also provided herein is optionally roughening surface(s) to increase interface area to reduce contact resistance that can reduce or eliminate the need for an optimal hourglass-shaped leg.

Provided herein, among other things, is an approximately 30% improvement in maximum ΔT with DTP only, based on real, temperature dependent properties. Also provided herein is ΔTmax>130 C in a single-stage device, for example when a combination with segmentation, area change, magnetic enhancements are used, featuring DTP. A single stage device may be less complicated and less costly than a multi-stage device. Also provided herein is ΔTmax>160 C in a two-stage cascaded device, for example when a combination of enhancements are used, featuring DTP, which is a larger temperature difference than can be achieved with multi-stage device (up to 6 stages) today. Illustratively, the present disclosure provides to reduce number of cascade stages to either two or just one, depending on material combinations. Off-nominal performance may expand the range of use for the device by improving COP by as much as a factor of 6 over a wide range of temperature differences and expands the operating range for currents and voltages. Optimized temperature profiles for maximum COP and maximum DT, with and without contact resistances, are provided. DTP provides, for example, a 50% improvement in maximum cooling capacity (Qc) at ΔT=50 C at 20 DTP stages. An example primary improvement from DTP in maximum COP (up to 20%) at lower ZTs and higher ΔTs is provided. Illustratively, maximum COP can be doubled at a ΔT=50 C when using DTP with variable area. A significant improvement in thermoelectric cooling without higher ZT is provided by DTP which also enables the same TE cooling performance at lower ZTs, which enables the use of potentially lower cost materials; as an example, constant ZT=0.25 shows similar performance in max ΔT to a standard single stage device.

Accordingly, a variety of applications may be enabled. For example, simpler and less costly single stage devices for large temperature difference applications are provided, such as maximum temperature difference applications >160 C, or applications where optimal performance over a broader range of operating conditions (temperatures, currents, and voltages) is needed. Lower ZT & lower cost TE materials for similar performance to $Bi_2Te_3$ are provided The present thermoelectric elements and devices may be used, for example, in solid-state air conditioning (e.g., providing a wider range of operation with higher COPs than previously achieved), solid-state refrigeration (e.g., providing larger temperature differences than previously achieved), cryogenic cooling, combining with liquid nitrogen ($LN_2$) or other refrigerant on hot side), or other applications such as provided elsewhere herein.

Improvements and innovations in fabrication methods have made scaled production of materials with distributed transport properties more feasible, and, thus, more relevant and important today than when some of the earlier work was completed. For example, as provided herein, additional thermoelectric fabrication methods of epitaxial growth, spark plasma sintering (SPS), ion implantation, and additive manufacture, in addition to previously known methods such as described in the background, may be used to prepare the present thermoelectric elements. Improvements and innovations in these fabrication methods and others have made scaled production of materials with distributed properties possible, and, thus, more relevant and important today than when some of the earlier work was completed.

Also provided herein are closed-form analytical solutions for optimal temperature, Seebeck coefficient, electrical resistivity, thermal conductivity, and leg area profiles. These are applied to applications for cooling and heating as well as power generation. The focus for the present disclosure will be exemplified by thermoelectric cooling, but it should be appreciated that the present thermoelectric elements and devices may be used in any suitable application.

An example benefit of the present disclosure includes the ability to make a simpler, single stage device that can achieve the same solid-state temperature differences as a more complicated and costly, multi-stage device. The ability to achieve larger temperature differences may also enable other applications that require heat pumping that were previously not possible, including refrigeration and cryogenic applications. Additionally, the present disclosure shows the ability for a thermoelectric device to operate at a significantly higher COP over a range of temperature differences when operated in off-nominal conditions. This attribute allows for a much more flexible device that can be used over a wider range of conditions. Further uses for such technology may include, for example, the cooling of optoelectronic devices such as IR detectors and CCD cameras, photomultipliers in photoelectronic telescopes, laser diodes for fiber-optics communication, computer chips, and instruments for biological and medical applications in a manner similar to that described in Vikhor and Anattychuk, "Theoretical evaluation of maximum temperature difference in segmented thermoelectric coolers," Applied Thermal Engineering 26: 1692-1696 (2005).

Example Modeling and Analysis

Optimum cooling of conventional thermoelectric (TE) devices is limited to about 6 Carnot efficiency for TE materials with coefficient of performance, ZT≈1. This value is ¼ to ½ that of typical two phase refrigeration systems and limits the use of TE materials to specialized applications where a combination of small size, solid state operation and simplicity outweigh device performance limitations. Below it is shown that the performance of TE elements with a suitable combination of distributed transport properties (DTP) can have performance of optimum TE cascades. Further, DTP TE elements do not have the interfacial losses that greatly reduce efficiency and maximum cooling temperature differential that compromises cascade performance. Similar benefits with DTP TE systems are shown to exist for power generation systems operating at large temperature differentials.

TE material fabrication methods including epitaxial growth, spark sintering (SPS), ion implantation, additive manufacture, and yet other semiconductor material production processes are evolving so that TE materials with controlled spatially dependent properties become more practical to fabricate on a commercial scale. Therefore, it is important to determine what performance advantages are achievable by fabricating such TE elements. Below, example governing equations for the optimum performance of DTP TE systems are derived and solved in closed analytic form for spatially dependent Seebeck coefficient and thermal and electrical resistivities. The analyses assume TE material intrinsic properties are independent of temperature and are locally isotropic other than in the direction of intended change. A one-dimensional geometry is evaluated since, under these assumptions, added dimensions do not contribute to any further theoretical increase in performance. Other properties, (ZT, current density, shape and boundary conditions) are fixed, thereby expressing the effects of distributed intrinsic material properties in the absence of other confounding changes. Results are presented for the analytic solutions for optimum efficiency and properties. Examples are given for a large range of hot side/cold side temperature differentials.

Performance gains are shown to increase with temperature differential. Gains are larger for cooling and heating and smaller for power generation modes of operation. Substantial variations in the Seebeck coefficient and electrical and thermal resistivities are required to achieve large performance gains.

It has been reported that energy conversion efficiency of TE systems can be improved by incorporating TE elements with spatially varied Peltier coefficient, as noted elsewhere herein. Also, other studies discuss idealized cascaded TE modules in which the range of maximum cooling temperature is greater and, at large hot end/cold end temperature differences, the device thermodynamic efficiency is higher. TE material fabrications methods including epitaxial growth, spark sintering (SPS), ion implantation, additive manufacturing and others semiconductor material production processes have evolved to the extent that TE elements can be fabricated that incorporate spatially varying transport properties. It then becomes important to understand clearly the possible benefits to TE device performance that result by fabricating TE elements with optimally distributed intrinsic TE material properties. Specific questions that arise are: (1) What performance gains are made possible with distributed transport properties, (2) What variations and relationships between transport properties lead to optimal performance, (3) How should the intrinsic material properties vary over the length of a TE element to achieve optimal performance and (4) How does performance change when operating other than under optimal conditions.

To answer these questions, it is important to isolate thermodynamic efficiency and other performance changes attributable directly to varying intrinsic material properties. This may be achieved by fixing other conditions that can impact performance so as to not have the results under study influenced by extraneous factors. All other properties of both CTE systems and the DTP systems are fixed (e.g., current density, shape, temperature-independent transport properties and boundary conditions). Thus, the present analysis is structured so that the Distributed Transport Properties (DTP) are the essential, and effectively the only, study variables. DTP results are compared to analytic solutions found in texts for conventional TE systems (CTE) with constant transport properties. Since Z is constant in CTE systems, ZT is proportional to temperature. For comparison purposes, and as is customary in texts, the average temperature (and hence the average ZT) is used for CTE computations. These assumptions provide useful approximations to actual system properties for most power generation systems and for cooling/heating systems operating at small temperature differentials, but differ from actual device performance for large temperature differentials. Nevertheless, because of its analytic form and ease of computation, the CTE analytic form is broadly used for modeling TE performance under all conditions. Without wishing to be bound by any theory, it is believed that the following framework suitably may be used to design and characterize TE elements with enhanced thermal and electrical properties, including but not limited to enhanced maximum temperature differences, as compared to CTEs.

The fundamental steady state equation for isotropic thermoelectric materials may be expressed as:

$$\nabla(\lambda \nabla T) - Tj \nabla S = -j^2 \rho \tag{1}$$

An objective of the present analysis is to determine optimal thermodynamic energy conversion efficiency for TE material systems that obey Equation (1) and in which T(x), S(x), λ(x) and ρ(x) are spatially dependent variables. Without loss of generality, and for simplicity, Equation (1) can be reduced to the one dimension case which may be expressed as:

$$\frac{d}{dx}\left[\lambda(x)\frac{dT(x)}{dx}\right] - T(x)j(x)\frac{dS(x)}{dx} = -j(x)^2\rho(x) \tag{2}$$

Figure 1B:
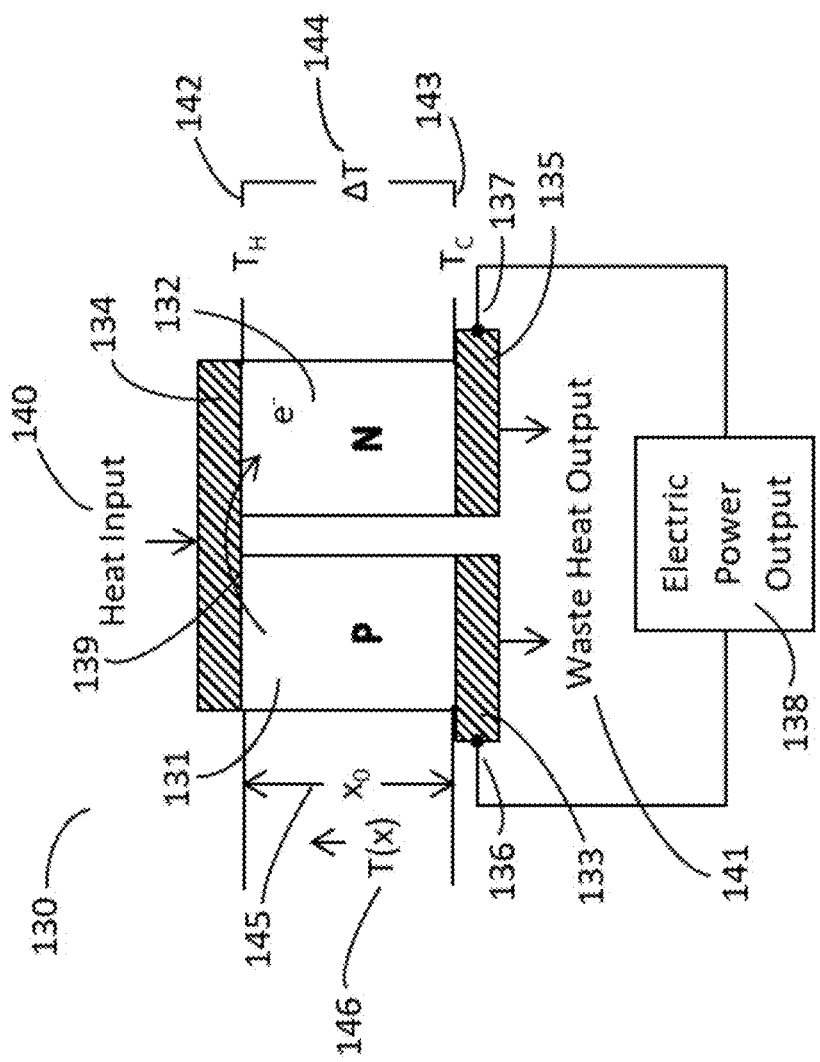
Figure 1C:
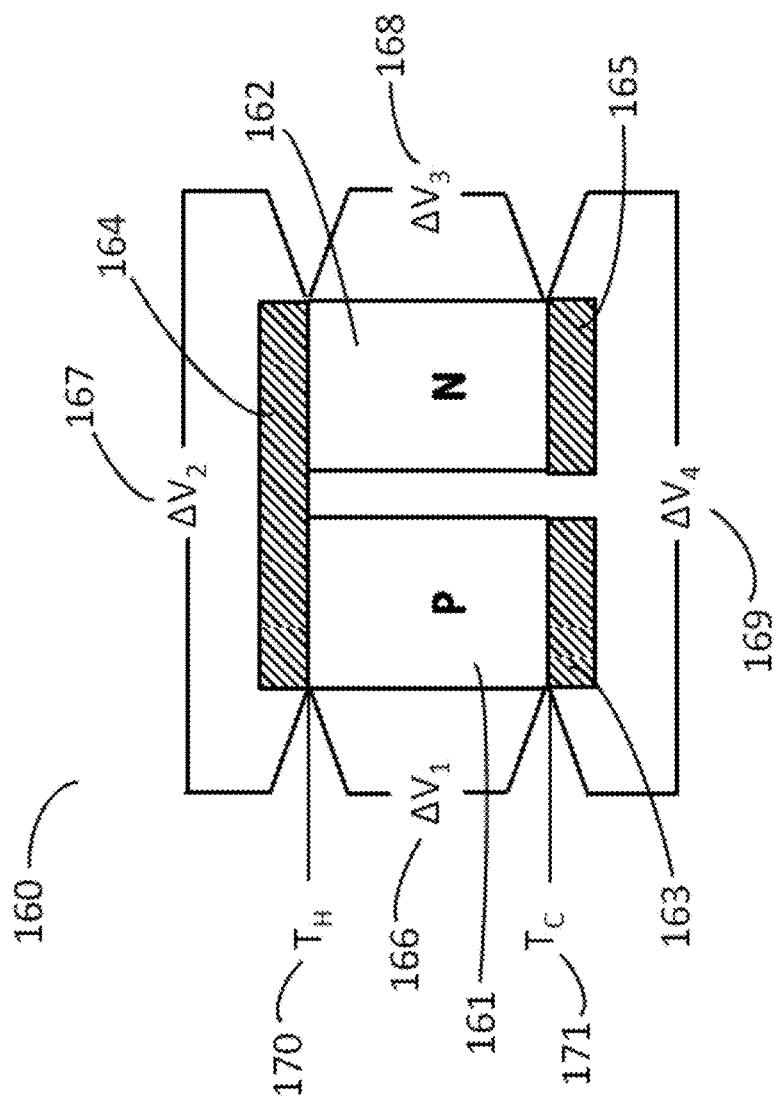

FIGS. 1A-1C, described in greater detail elsewhere herein, illustrate example geometries that may be considered to implement the one-dimensional case.

From previous work, for boundary conditions expressed as, $$T_C = T(x=0)$$

$$T_H = T(x=x_0) \tag{3}$$

the temperature profile for optimal performance of an ideal TE cascade may be expressed as, $$T(x) = T_C\left(\frac{T_H}{T_C}\right)^{\frac{x}{x_0}} = T_C e^{D\frac{x}{x_0}} \text{ where } D = \ln\left(\frac{T_H}{T_C}\right) \tag{4}$$

Continuity, the one dimensional configuration, and steady state operation require the current density, j(x), to be constant throughout the TE element, expressed as:

$$j(x) = j \tag{5}$$

As a realistic condition which is consistent with the requirement that computed gains are not associated with changes in the values of ZT, ZT should have the maximum allowable value throughout the DTP system. The condition that ZT is constant and maximum is imposed to fix variables other than those associated with DTP so that it is possible to determine the impact of DTP on the characteristics of a thermoelectric system, which may be expressed as:

$$Z(x)T(x) = \text{Constant} = \frac{S^2(x)T_C e^{Dx}}{\lambda(x)\rho(x)} \tag{6}$$

Let $$j = S_C T_C \varepsilon / \rho_C \tag{7}$$

Where ε is a dimensionless current and will take on different values for maximum efficiency, maximum cooling temperature differential, and other conditions of interest.

Without loss of generality, consider solutions for S(x), λ(x) and ρ(x) which satisfy the boundary conditions of Equation (3) and are analytic. Written in exponential form, the solutions may be expressed as, $$S(\varepsilon, x) = S_C e^{A(\varepsilon)\frac{x}{x_0}} \text{ where } A(\varepsilon) = \frac{ZT\varepsilon^2 + \ln\left(\frac{T_H}{T_C}\right)^2}{ZT\varepsilon - \ln\left(\frac{T_H}{T_C}\right)} \tag{8}$$

$$\lambda(\varepsilon, x) = \lambda_C e^{B(\varepsilon)\frac{x}{x_0}} \text{ where } B(E) = \frac{ZT\varepsilon^2 + \ln\left(\frac{T_H}{T_C}\right)^2}{ZT\varepsilon - \ln\left(\frac{T_H}{T_C}\right)} \quad (9)$$

$$\rho(\varepsilon, x) = \rho_C e^{C(\varepsilon)\frac{x}{x_0}} \text{ where } C(\varepsilon) = \frac{\varepsilon + \ln\left(\frac{T_H}{T_C}\right)}{1 - \frac{\ln\left(\frac{T_H}{T_C}\right)}{ZT\varepsilon}} \quad (10)$$

Thus, $$A(\varepsilon) = B(\varepsilon) \text{ and } A(\varepsilon) + D(\varepsilon) = C(\varepsilon) \quad (11)$$

With the boundary conditions imposed, this exponential solution may express the exact solution for $S(\varepsilon,x)$, $\lambda(\varepsilon,x)$, and $\rho(\varepsilon,x)$, for the optimum shape of $T(x)$.

The form for $T(x)$ in Equation (4) expresses the temperature profile for optimum energy conversion efficiency for a specific value of the dimensionless current, e. For the case of optimal cooling performance with $T(x)$ fixed at its optimal shape, the corresponding value of $\varepsilon$ can be determined for each set of $S_C$, $\lambda_C$, $\rho_C$ and $T_H/T_C$.

Cooling and Heating

The cooling capacity, $q_{CDTP}(\varepsilon)$, may be determined as, $$q_{CDTP}(\varepsilon) = jT_C S_C - \lambda(\varepsilon, x)\frac{dT(x)}{dx}\bigg|_{x=0} \quad (12)$$

Solving $$q_{CDTP}(\varepsilon) = \lambda_C\left[ZT\varepsilon - \ln\left(\frac{T_H}{T_C}\right)\right] \quad (13)$$

Thus $q_{CDTP}(\varepsilon)$ increase linearly with $\varepsilon$, and hence with j and ZT.

Most importantly, for DTP there is no maximum value for $\varepsilon$ imposed by Equation (13), there is no further constraint on $T_H/T_C$ and thus there is no maximum $\Delta T$ other than $T_H$. This unusual and favorable property for DTP systems results directly from the condition that the temperature profile is fixed in accordance with Equation (10), and that once fixed, the transport property variations take the form in Equations (8) to (10). Thus, $$\Delta T = T_H - T_C \quad 0 \leq \Delta T < T_H \quad (14)$$

In contrast, for CTE systems with position independent transport properties, $$\Delta T_{MAX} = \tfrac{1}{2} Z T_C^2 \quad \Delta T \leq \Delta T_{MAX} \quad (15)$$

For DTP, the hot side heat rejection $q_{HDTP}(\varepsilon)$ may be expressed as, $$q_{HDTP}(\varepsilon) = jT_H S(\varepsilon, x_0) - \lambda(\varepsilon, x)\frac{dT(x)}{dx}\bigg|_{x=x_0} \quad (16)$$

$$q_{HDTP}(\varepsilon) = T_H \lambda_C e^{A(\varepsilon)}\left(ZT\varepsilon - \ln\left(\frac{T_H}{T_C}\right)\right) \quad (17)$$

The coefficient of performance, $\beta_{CDTP}$ may be expressed as, $$\beta_{CDTP}(\varepsilon) = \frac{q_{CDTP}(\varepsilon)}{q_{HDTP}(\varepsilon) - q_{CDTP}(\varepsilon)} \quad (18)$$

So $$\beta_{CDTP}(\varepsilon) = \frac{1}{\left(\frac{T_H}{T_{cC}}\right) e^{A(\varepsilon)} - 1} \quad (19)$$

The value of $\varepsilon$ for maximum coefficient of performance, $\beta_{DTP}$ is found from maximizing $\beta_{CDTP}(\varepsilon)$ with respect to e. This yields for $\varepsilon$ an optimum value, $\vartheta_0$ $$\varepsilon_0 = \frac{\ln\left(\frac{T_H}{T_C}\right)}{M-1} \text{ where } M = (Z_C T_C + 1)^{\frac{1}{2}} \quad (20)$$

Solving Equation (16) for $\beta_{CDTP}(\varepsilon_0)$;

$$\beta_{CDTP}(\varepsilon_0) = \frac{1}{\left(\frac{T_H}{T_C}\right)^{\left(\frac{M+1}{M-1}\right)} - 1} \quad (21)$$

Note that as $Z_C T_C \to \infty$, $\beta_{CDTP}(\varepsilon_0)$ approaches Carnot efficiency as expected.

The optimum heating efficiency, $\beta_{HDTP}(\varepsilon_0)$, can be expressed in terms of the cooling performance, $$\beta_{HDTP}(\varepsilon) = 1 + \beta_{CDTP}(\varepsilon) \quad (22)$$

Since $\beta_{CDTP}(\varepsilon)$ and $\beta_{HDTP}(\varepsilon)$ differ by a constant, $\varepsilon_0$ is also the optimum efficiency for heating, and so;

$$\beta_{HDTP}(\varepsilon_0) = \frac{1}{1 - \left(\frac{T_C}{T_H}\right)^{\left[\frac{M+1}{M-1}\right]}} \quad (23)$$

Here, for comparison purposes and as is customary, the average of the hot and cold end, TA, is used for the CTE system. For CTE systems, the corresponding optimums are $$\beta_C(i_0) = \frac{T_C}{\Delta T}\left(\frac{M_A - \frac{T_H}{T_C}}{M_A + 1}\right) \quad (24)$$

$$\beta_{HCTE}(i_0) = \frac{T_H}{\Delta T}\left(\frac{M_A - \frac{T_H}{T_C}}{M_A + 1}\right) i_0 = \frac{S\Delta T}{\rho(M_A - 1)} \quad (25)$$

Here, for comparison purposes and as is customary, the average of the hot and cold end, TA, is used for the CTE system.

$$M_A = \sqrt{1 + ZT_A}$$

$$T_A = \frac{T_C + T_H}{2}$$

Generation

The optimum efficiency for a TE power generator is computed in a similar fashion. Since, current flow direction is the reverse of cooling, it is convenient to introduce a new dimensionless current $\delta$, which satisfies Equation (10) and is $\delta \leq 0$.

The heat in $q_{HDTP}(\delta, x_0)$ and waste heat exiting the cold side, $q_{CDTP}(\delta, 0)$ may be expressed as, $$q_{HDTP}(\delta, x_0) = jT_H S(x_0) + \lambda(x_0)\frac{dT(x)}{dx}\bigg|_{x=x_0} \quad (26)$$

$$q_{CDTP}(\delta, 0) = jT_C S(0) + \lambda(0)\frac{dT(x)}{dx}\bigg|_{x=0} \quad (27)$$

The net electrical power production, $P_{DTP}(\delta)$ may be expressed as, $$P_{DTP}(\delta) = q_{HDTP}(\delta, x_0) - q_{CDTP}(\delta, 0) \quad (28)$$

And the efficiency $\eta_{DTP}(\delta)$ may be expressed as, $$\eta_{DTP}(\delta) = \frac{P_{DTP}(\delta)}{q_{HDTP}(\delta, x_0)} = 1 - \frac{q_{CDTP}(\delta, 0)}{q_{HDTP}(\delta, x_0)} \quad (29)$$

$$\eta_{DTP}(\delta) = 1 - \frac{T_C}{T_H}e^{-A(\delta)} \quad (30)$$

Where $A(\delta)$ is given in Equation (8) with $\delta$ replacing $\varepsilon$. The optimum efficiency, $\eta_{DTP}(\delta_0)$ is the optimum value, $\delta_0$ in Equation (30).

$$\delta_0 = -\frac{\ln\left(\frac{T_H}{T_C}\right)}{M+1} \quad \delta \leq 0 \quad (31)$$

Using $\delta_0$ in Equation (30) yields $A(\delta_0) = 2\delta_0$
So $$\eta_{DTP}(\delta_0) = 1 - \left(\frac{T_C}{T_H}\right)^{\frac{M-1}{M+1}} \quad (32)$$

The corresponding maximum efficiency for CTE power generators is $$\eta_{CTE}(\gamma_0) = \frac{\Delta T}{T_H}\left(\frac{M_A - 1}{M_A + \frac{T_C}{T_H}}\right) \text{ where } \gamma_0 = \frac{S\Delta T}{\rho(M_A - 1)} \quad (33)$$

In which M is the same as in Equations (24) and (25).

Figure 11:
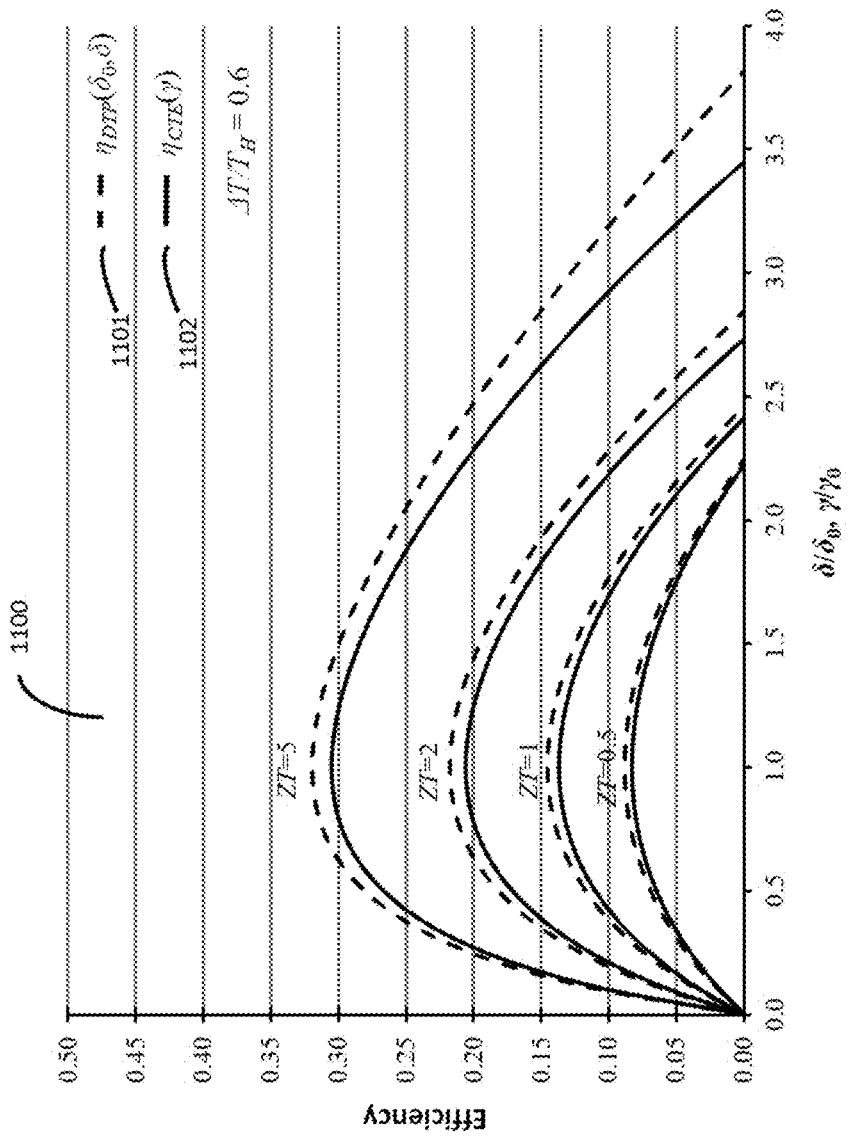
FIG. 11 is a plot illustrating efficiency as a function of current for example TE devices provided herein.

In FIG. 11, described in greater detail below, it is shown that in all cases, performance improves with DTP 1101, but, unless $\Delta T/T_H$ is 0.6 or larger, the gains may be smaller than those associated with cooling and heating. Without wishing to be bound by any theory, it is believed that the main cause of the small performance improvement is the direct result of the basic assumption that the average ZT in the CTE 1102 system is equal to the DTP 1101 value. Since in CTE systems Z is held constant and hence ZT is proportional to temperature, the large temperature changes associated with power generation can lead to a comparison of DTP 1101 systems with CTE 1102 systems that incorporate values for TE materials with unrealistically high ZT at the hot end. Because of the assumption used in CTE 1102 approximations, the performance of CTE systems may be likely to be overstated.

Off-Optimum Characteristics

TE devices often must operate over a range of temperatures and currents that are not the ideal design conditions. Once $S(x)$, $\lambda(x)$ and $\rho(x)$ are fixed for a set of conditions such that $T(x)$ is the optimal temperature profile for cooling efficiency when $\varepsilon = \varepsilon_0$, performance characteristics for $\varepsilon \neq \varepsilon_0$ are important to an understanding performance over the entire range of possible operating conditions. In this case, a particular design is specified so that $\varepsilon_0$ is established. Then, the terms for $S(x)$, $\lambda(x)$, and $\rho(x)$ in Equation (2) are replaced by fixed values which are a function of $\varepsilon_0$.

$$S(\varepsilon_0, x) = S_C e^{A(\varepsilon_0)\frac{x}{x_0}}\bigg|_{\varepsilon=\varepsilon_0} = S_C e^{2\varepsilon_0\frac{x}{x_0}} \quad (34)$$

$$\lambda(\varepsilon_0, x) = \lambda_C e^{B(\varepsilon_0)\frac{x}{x_0}}\bigg|_{\varepsilon=\varepsilon_0} = \lambda_C e^{2\varepsilon_0\frac{x}{x_0}} \quad (35)$$

$$\rho(\varepsilon_0, x) = \rho_C e^{C(\varepsilon_0)\frac{x}{x_0}}\bigg|_{\varepsilon=\varepsilon_0} = \rho_C e^{\varepsilon_0(M+1)} \quad (36)$$

Equation (2) becomes $$\frac{d^2T(\varepsilon, x)}{dx^2} + A\frac{dT(\varepsilon, x)}{dx} - j\frac{S_C AT}{\lambda_C} = -j^2\frac{\rho_C}{\lambda_C}e^{C(\varepsilon_0)\frac{x}{x_0}} \quad (37)$$

This is a second degree linear non homogeneous differential equation with the solution, $$T(\varepsilon_0, \varepsilon, x) = E_1(\varepsilon_0, \varepsilon) e^{R_1(\varepsilon_0,\varepsilon)\frac{x}{x_0}} + E_2(\varepsilon_0, \varepsilon) e^{R_2(\varepsilon_0,\varepsilon)\frac{x}{x_0}} + F(\varepsilon_0, \varepsilon)\left(\frac{T_H}{T_C}\right)^{\frac{x}{x_0}} \quad (38)$$

Where $E_1(\varepsilon_0,\varepsilon)$, $E_2(\varepsilon_0,\varepsilon)$, $R(\varepsilon_0,\varepsilon)$, $R_2(\varepsilon_0,\varepsilon)$, and $F(\varepsilon_0,\varepsilon)$ are $$E_1(\varepsilon_0, \varepsilon) = -\frac{(T_H - T_C e^{R_2(\varepsilon_0,\varepsilon)})(\varepsilon - \varepsilon_0)^2}{\left(e^{R_1(\varepsilon_0,\varepsilon)} - e^{R_2(\varepsilon_0,\varepsilon)}\right)\left(2\varepsilon\varepsilon_0 - \varepsilon_0^2\right)} \quad (39)$$

$$E_2(\varepsilon_0, \varepsilon) = \frac{(T_H - T_C e^{R_1(\varepsilon_0,\varepsilon)})(\varepsilon - \varepsilon_0)^2}{\left(e^{R_1(\varepsilon_0,\varepsilon)} - e^{R_2(\varepsilon_0,\varepsilon)}\right)\left(2\varepsilon\varepsilon_0 - \varepsilon_0^2\right)} \quad (40)$$

$$R_1(\varepsilon_0, \varepsilon) = -\varepsilon_0\left(1 + \left(1 + \frac{2(M^2-1)\varepsilon}{\varepsilon_0}\right)^{\frac{1}{2}}\right) \quad (41)$$

$$R_2(\varepsilon_0, \varepsilon) = -\varepsilon_0\left(1 - \left(1 + \frac{2(M^2-1)\varepsilon}{\varepsilon_0}\right)^{\frac{1}{2}}\right) \quad (42)$$

$$F(\varepsilon_0, \varepsilon) = \frac{T_C \varepsilon^2}{2\varepsilon\varepsilon_0 - \varepsilon_0^2} \quad (43)$$

The corresponding general values for $q_{HDTP}(\varepsilon_0,\varepsilon)$ and $q_{CDTP}(\varepsilon_0,\varepsilon)$ may be found from Equations (12), (16), and (38), where $E_1$, $E_2$, $R_1$, $R_2$ and F are functions of $\varepsilon_0$ and $\varepsilon$ and are given in equations (34)-(43).

$$\frac{q_{HDTP}(\varepsilon_0, \varepsilon)}{\lambda_C} = \quad (44)$$
$$e^{2\varepsilon_0}\left[(M^2-1)T_H\varepsilon - \left(R_1 E_1 e^{R_1} + R_2 E_2 e^{R_2} + F\frac{T_H}{T_C}\ln\left(\frac{T_H}{T_C}\right)\right)\right]$$

$$\frac{q_{CDTP}(\varepsilon_0, \varepsilon)}{\lambda_C} = \left[(M^2-1)T_C\varepsilon - \left(R_1 E_1 + R_2 E_2 + F\ln\frac{T_H}{T_C}\right)\right] \quad (45)$$

And $$\beta_{CDTP}(\varepsilon_0, \varepsilon) = \frac{1}{\frac{q_{HDTP}(\varepsilon_0,\varepsilon)}{q_{CDTP}(\varepsilon_0,\varepsilon)} - 1} \quad (46)$$

And $$\beta_{CTE}(i) = \frac{1}{\frac{q_{HCTE}(i_0, i)}{q_{CCTE}(i_0, i)} - 1} \quad (47)$$

Where $$\frac{q_{HCTE}(i)}{\lambda_O} = \left[\left(M_A^2 - 1\left(\frac{2T_C T_H i}{T_H + T_C}\right)\left(1 + \frac{T_C i}{2T_H}\right) - \Delta T\right] \quad (48)$$

$$\frac{q_{CCTE}(i)}{\lambda_O} = \left[\left(M_A^2 - 1\left(\frac{2T_C^2 i}{T_H + T_C}\right)\left(1 - \frac{i}{2}\right) - \Delta T\right] \quad (49)$$

Similarly $$\beta_{HCTE}(i) = \beta_{CCTE}(i) + 1 \quad (50)$$

Here the thermal conductivity, $\lambda_0$, is constant.

For power generation with $\delta \leq 0$, results are found by replacing $\varepsilon_0$ and $\varepsilon$ with $\delta_0$ and $\delta$, and change the sign of thermal power heat flows.

$$\frac{q_{HDTP}(\delta_0, \delta)}{\lambda_C} = \quad (51)$$
$$-e^{2\delta_0}\left[(M^2-1)T_H\delta + R_1 E_1 e^{R_1} + R_2 E_2 e^{R_2} + F\frac{T_H}{T_C}\ln\left(\frac{T_H}{T_C}\right)\right]$$

$$\frac{q_{CDTP}(\delta_0, \delta)}{\lambda_C} = -\left[(M^2-1)T_C\delta + R_1 E_1 + R_2 E_2 + F\ln\left(\frac{T_H}{T_C}\right)\right]\delta_0, \quad (52)$$
$$\delta \leq 0$$

The efficiency for off optimal operation, $\eta_{DTP}(\delta_0,\delta)$ is
$$\eta_{DTP}(\delta_0,\delta) = 1 - q_{CDTP}(\delta_0,\delta)/q_{HDTP}(\delta_0,\delta) \quad (53)$$

For the CTE systems, with current $\gamma$ $$\frac{q_{HCTE}(\gamma)}{\lambda_0} = \left(M_A^2 - 1\left(\frac{2T_C\gamma}{T_H + T_C}\right)\left(T_H - \frac{T_C\gamma}{2}\right) + \Delta T \quad (54)$$

$$\frac{q_{CCTE}(\gamma)}{\lambda_0} = \left(M_A^2 - 1\left(\frac{2T_C^2\gamma}{T_H + T_C}\right)\left(1 + \frac{\gamma}{2}\right) + \Delta T \quad (55)$$

And again, $$\eta_{CTE}(\gamma) = 1 - q_{CCTE}(\gamma)/q_{HCTE}(\gamma) \quad (56)$$

The corresponding electric power outputs, $P_{DTP}(\delta_0,\delta)$ and $P_{CTE}(\gamma_0,\gamma)$, are $$\frac{P_{DTP}(\delta_0, \delta)}{\lambda_C} = \frac{q_{HDTP}(\delta_0, \delta)}{\lambda_C} - \frac{q_{CDTP}(\delta_0, \delta)}{\lambda_C} \quad (57)$$

$$\frac{P_{CTE}(\gamma_0, \gamma)}{\lambda_0} = \frac{q_{HCTE}(\gamma)}{\lambda_0} - \frac{q_{CCTE}(\gamma)}{\lambda_0} \qquad (58)$$

Figure 9:
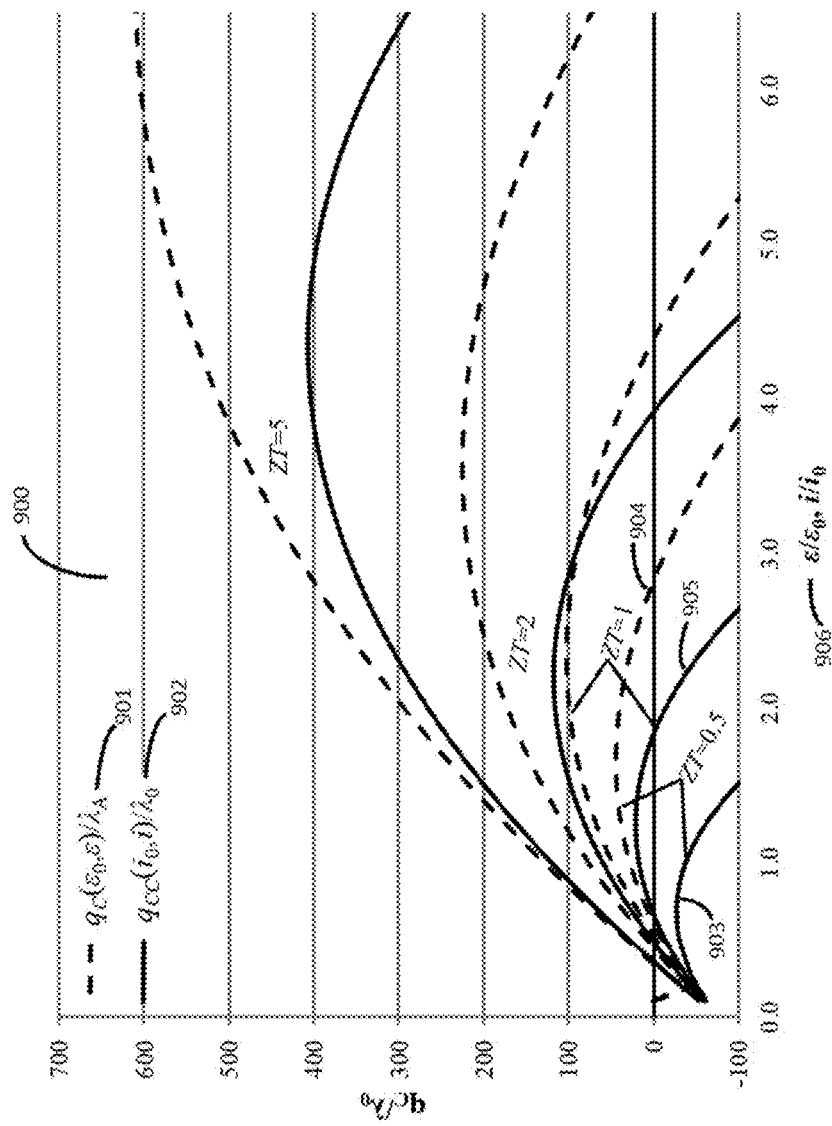
FIG. 9 is a plot illustrating cooling capacities as a function of current for example TE devices provided herein.

In FIG. 9, it can be seen that for ZT=1, peak cooling capacity is 4× as large for DTP than it is for CTE, with an expanded current range.

Voltages

Applied voltage in refrigeration and output voltages of power generation systems have a contribution from the T(x)jdS(x)/dx and Joule heating terms in Equation (2). In both cases, the space dependency of the Seebeck Coefficient S(x) introduces a voltage source and the space dependent resistivity, ρ(x), produces a current dependent change in voltage. Referring to FIG. 1C, the voltages $\Delta V_1$ and $\Delta V_3$ are these contributions, while $\Delta V_2$ and $\Delta V_4$ are the Peltier voltages common with traditional CTE systems.

The voltages for DTP refrigeration systems may be expressed as:

$$\Delta V_{DTP} = \Delta V_1 + \Delta V_2 + \Delta V_3 + \Delta V_4 \qquad (59)$$

Where $$\Delta V_1 + \Delta V_3 = -\int_0^{x_0} T(x)\frac{dS(x)}{dx}(x)dx + \int_0^{x_0} j\rho(x)dx \qquad (60)$$

And $$\Delta V_2 + \Delta V_4 = S_H T_H - S_C T_C \qquad (61)$$

So $$\Delta V_{DTP}(\varepsilon) = S_C T_C \left( e^{A(\varepsilon)+D} - 1 - \int_0^{x_0} \left(T(x)e^{A(\varepsilon)x} - e^{C(\varepsilon)x}dx\right) \right) \qquad (62)$$

Where T(x) is given in Equation (38).
In the case with $\varepsilon = \varepsilon_0$, $T(x) = T_c e^{Dx}$ $$\Delta V_{DTP}(\varepsilon_0) = S_C T_C \left(\frac{M}{M+1}\right)\left(\left(\frac{T_H}{T_c}\right)^{\frac{M+1}{M-1}} - 1\right) \qquad (63)$$

The corresponding voltage output of a power generator operating at maximum efficiency, in accordance with the diagram in FIG. 1B, described elsewhere herein, is $$\Delta V_{DTP}(\delta_0) = S_C T_C \left(\frac{M}{M-1}\right)\left(1 - \left(\frac{T_C}{T_H}\right)^{\frac{M-1}{M+1}}\right) \qquad (64)$$

The voltages for CTE systems at maximum efficiency are $$V_{CTE}(i_0) = S\Delta T\left(\frac{M_A}{M_A - 1}\right) \qquad (65)$$

$$V_{CTE}(\gamma_0) = S\Delta T\left(\frac{M_A}{M_A + 1}\right) \qquad (66)$$

Discussion of Results

The characteristics for TE systems with DTP and CTE properties can be compared using the equations derived above. New in this study are analytic expressions for S(x), λ(x) and ρ(x) and the resulting performance characteristics for optimal cooling, heating and power generation.

As described elsewhere herein, the present TE elements may be implemented in any suitable application. For example, FIGS. 1A-1C schematically illustrate example thermoelectric (TE) devices with spatially varying distributed transport properties (DTP), such as provided herein. FIG. 1A depicts a TE couple 100 operating in a cooling mode. The TE couple 100 includes P type element 101, N type element 102, cold side electrode 103, hot side shunt electrode 104, cold side electrode 105, electrical connections 106 and 107 and electric power supply 108. When electrons 109 from electric power supply 108 flow from N type material 102 to P type material 101 as depicted, the shunt hot side electrode 104 is heated, and the cold end 111 including cold side electrodes 103 and 105 is cooled. The temperature T(x) 116 spatially varies as a function of position over the length $x_0$ 115 along the length of each of the thermoelectric elements 101, 102, such that the hot side is at temperature $T_H$ 112 and cold side is at temperature $T_C$ 113, and the maximum temperature difference between the hot side and the cold side may be expressed as $\Delta Tmax = T_H - T_C$ 114, or as $\Delta Tmax/T_H$.

FIG. 1B depicts a TE couple 130, operating in a power generation mode. The TE couple 130 includes P type element 131, N type element 132, cold side electrode 133, hot side shunt electrode 134, cold side electrode 135, electrical connections 136 and 137 and electric power output 138. Thermal power is supplied by an external source (not shown) to hot side electrode 134, and waste heat is removed by a colder external heat sink (not shown) from cold end 141 which includes, or is comprised of, cold side electrodes 133 and 135. Electric power produced by assembly 130 is extracted at electric power output 138. The temperature T(x) 146 spatially varies as a function of position over the length $x_0$ 145 along the length of each of the thermoelectric elements 131, 132, such that the hot side is at temperature $T_H$ 142 and cold side is at temperature $T_C$ 143, and the maximum temperature difference between the hot side and the cold side may be expressed as $\Delta Tmax = T_H - T_C$ 144, or as $\Delta Tmax/T_H$.

FIG. 1C depicts a portion of a thermoelectric module 160, including P type element 161, and N type element 162, cold side electrode 163, hot side electrode 164, and cold side electrode 165. Hot side is at temperature $T_H$ 170 and cold side is at temperature $T_C$ 171. Voltage $\Delta V_1$ 166 is between cold side electrode 163 and hot side electrode 164. Voltage $\Delta V_2$ 167 is across electrode 164. Voltage $\Delta V_3$ 168 is between electrode 164 and electrode 165. Voltage $\Delta V_4$ 169 is between electrode 165 and electrode 163. The maximum temperature difference between the hot side and the cold side may be expressed as $\Delta Tmax = T_H - T_C$, or as $\Delta Tmax/T_H$.

In examples such as illustrated in FIGS. 1A-1C, which may have any suitable combination of options such as described herein, the hot side electrode optionally may be placed in thermal contact with a heat sink, for example a heat exchanger. A nonlimiting example of a heat exchanger is a fin heat radiator which may be in good thermal contact with the hot side electrode operating at a hot side temperature $T_H$. The hot side electrode(s) may be connected with good thermal and electrical contact to the hot end of the TE element. The cold side electrode(s) may be in good thermal and electrical contact with the cold end of the TE element.

Figure 2A:
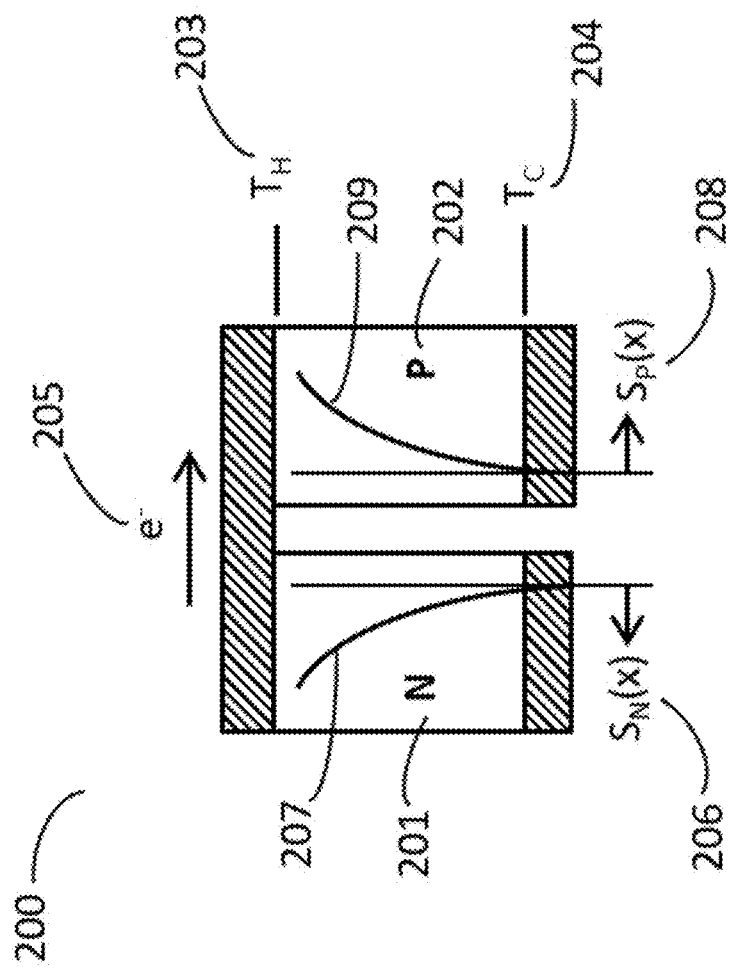
FIGS. 2A-2B schematically illustrate example TE devices with spatially varying Seebeck coefficients, such as provided herein.
Figure 2B:
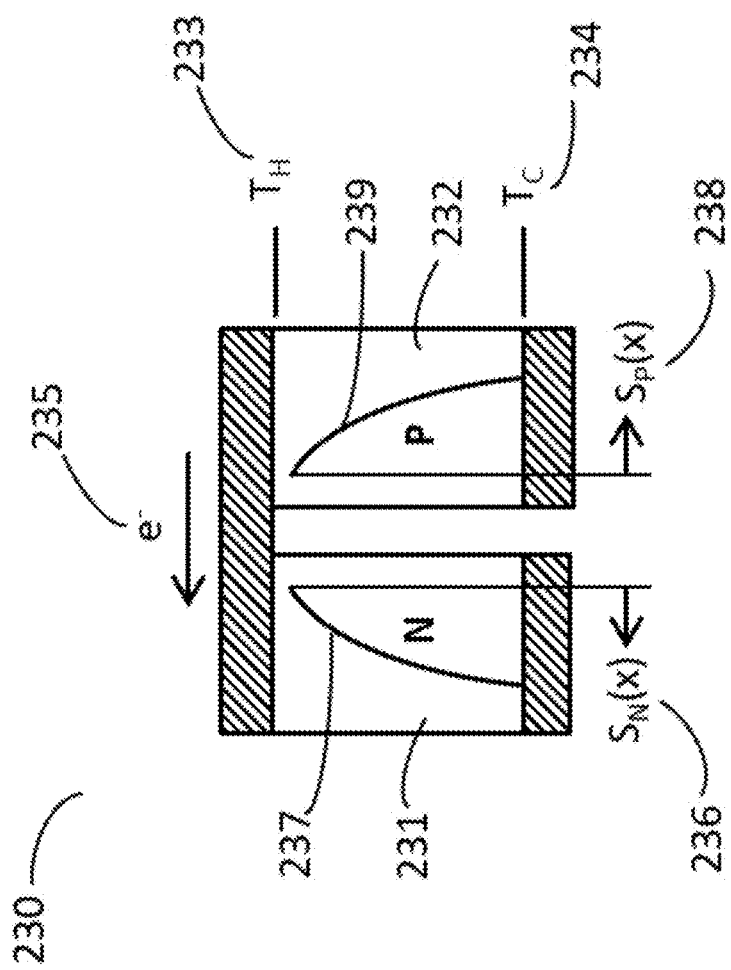

FIGS. 2A-2B schematically illustrate example TE devices with spatially varying Seebeck and the corresponding λ and ρ coefficients, such as provided herein. FIG. 2A schematically illustrates an example variation of Seebeck coefficient with position in a thermoelectric cooling couple 200 including an N type element 201, a P type element 202, a hot side at temperature $T_H$ 203, a cold side at temperature $T_C$ 204, electrons 205 flow from the hot side of the N type TE material 201 to the hot side of the P type TE material 202. The spatially varying Seebeck coefficient $S_N(x)$ 206 in the N type TE material 201 is depicted as getting progressively more negative in the x direction as shown by curve 207 and the Seebeck coefficient $S_P(x)$ 208 in the P type TE material 202 is depicted as getting progressively more positive in the x direction as shown by curve 209. For clarity, S(x) 206 and $S_P(x)$ 208 are shown, but it must be understood that thermal conductivities $\lambda_N(x)$ and $\lambda_P(x)$ and electrical resistivities $\rho_P(x)$ and $\rho_N(x)$ also can vary in a similar fashion and control of their variation is part of this invention.

FIG. 2B schematically illustrates another example variation of the Seebeck coefficient with position in a thermoelectric power generator couple 230 including an N type element 231, a P type element 232, a hot side at temperature $T_H$ 233, a cold side at temperature $T_C$ 234, electron flow 235 from the hot side of the P type TE material 232 to the hot side of the N type TE material 231. Seebeck coefficient in the N type TE material $S_N(x)$ 236 is depicted as getting progressively less negative in the x direction 237 and the Seebeck coefficient $S_P(x)$ 238 in the P type TE material 232 is depicted as getting progressively less positive in the x direction 239. For clarity, S(x) 206 and $S_P(x)$ 208 are shown, but it must be understood that thermal conductivities $\lambda_N(x)$ and $\lambda_P(x)$ and electrical resistivities $\rho_P(x)$ and $\rho_N(x)$ also can vary in a similar fashion and control of their variation is part of this invention.

Figure 3A:
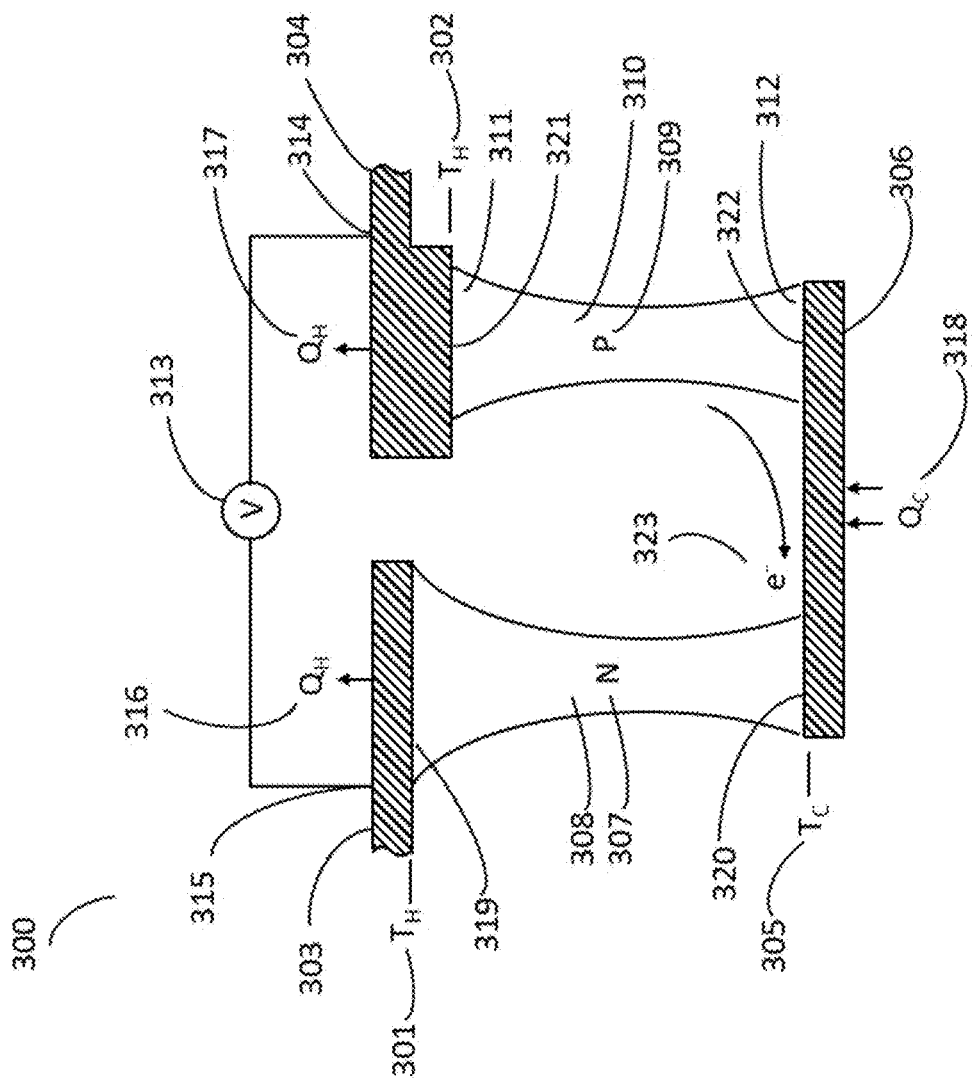
FIGS. 3A-3B schematically illustrate example TE devices with spatially varying cross-sectional areas, such as provided herein.
Figure 3B:
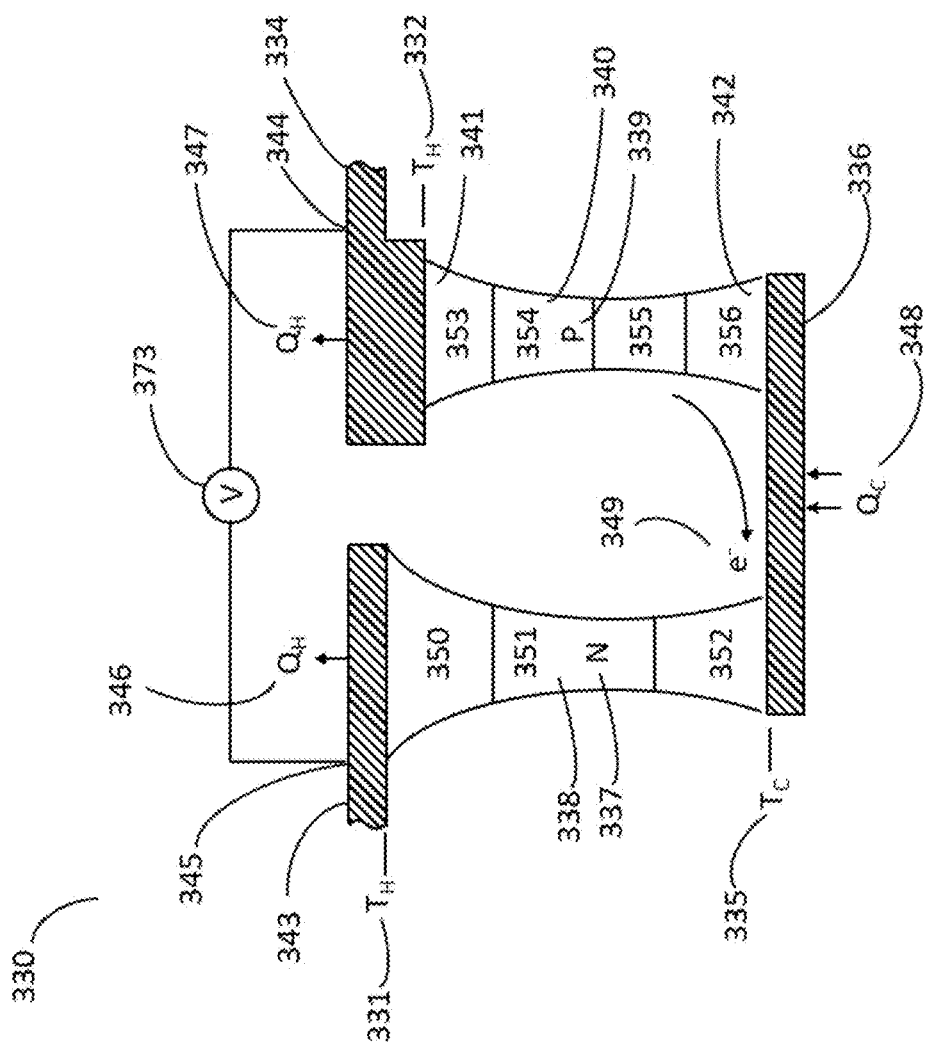

FIGS. 3A-3B schematically illustrate example TE devices with spatially varying cross-sectional areas, such as provided herein. More specifically, FIG. 3A depicts a TE couple 300 including an N type element 307, P type element 309, hot side electrode 303 (at $T_H$ 301), hot side electrode 304 (at $T_H$ 302), cold side electrode 306 (at $T_C$ 305), and electric power source 313 connected to hot side electrode 303 at hot side connection 315 and at hot side connection 314. In operation, electrons 323 pass from hot side electrode 304, through P type element 309, cold side electrode 306, N type element 307, and hot side element 303.

In this example, N type element 307 has a cross sectional area 319 at its attachment surface to hot side electrode 303 that is larger than its cross sectional area 320 where it is attached to cold side electrode 306. Between its ends, N type element 307 is narrower at central region 308 than at either end, giving it a generally hour-glass shape. P type element 339 has a cold end connected to cold side electrode 336, and hot end 311 connected to hot side electrode 304 at interface 321. In this nonlimiting example, P type element 309 is shorter than N type element 307, is of a different shape from one end to the other, and is of different average cross sectional area than the N type element, although P type element 309 optionally may have a central region 310 that is narrower than either end. Thus, it should be appreciated that the shape, length, and cross-sectional areas (e.g., diameters) of P and N type TE elements can differ. Advantageously, and dependent on the material systems that are used to construct the elements, the P and/or N type TE element may have a cross sectional area at 310 and the corresponding distance from ends 321 and 322 of P type element 309 that is larger than either or both ends. Also, not depicted, is that the P and N type TE elements 307 and 309 can have cross sectional shape that is square, rectangular, oval, tubular (hollow) or any other advantageous shape.

In operation, electron flow 323 (i.e. current flow in the opposite direction) produced by power source 313, heats hot electrodes 303 and 304 producing heat flows $Q_H$ 316 and 317 out the upper, hot end and temperatures $T_H$ 301 and 302, and cools cold electrode 306 producing cooling $Q_C$ 318 and temperature $T_C$ 305.

FIG. 3B shows an alternative TE couple 330 which is modified relative to TE couple 300 illustrated in FIG. 3A. TE couple 330 includes an N type element 337, P type element 339, hot side electrode 343 (at $T_H$ 331), hot side electrode 334 (at $T_H$ 332), cold side electrode 336 (at $T_C$ 335), and electric power source 373 connected to hot side electrode 343 at hot side connection 345 and at hot side connection 344. In operation, electrons 349 pass from hot side electrode 334 via interface 341, through P type element 339, cold side electrode 336, N type element 337, and hot side electrode 343. Similarly as the example shown in FIG. 3A, N type element 337 optionally is narrower at central region 338 than at either end, giving it a generally hour-glass shape, and P type element 339 optionally has a central region 340 that is narrower than either end. Thus, it should be appreciated that the shape, length, and cross-sectional areas (e.g., diameters) of P and N type TE elements can differ. Note that power sources described herein may be considered to be control modules.

TE couple 330 illustrated in FIG. 3B also includes examples of different number of DTP stages in each of the TE elements. In this example, N type TE element 337 includes three DTP stages, 350, 351, and 352. In example P type TE element 339, there are four DTP stages, 353, 354, 355, 356. These are just examples as there can be any number of stages of DTP, e.g., from two to over one hundred, or portions of the TE elements can have all or portions thereof have continuously variable DTP properties. Each DTP stage or continuously variable portion has different transport properties, Seebeck coefficient, electrical resistivity, and thermal conductivity based on doping and other material properties differences in the TE material.

In operation, electron flow 349 (i.e. current flow in the opposite direction) produced by power source 373, heats hot electrodes 343 and 344 producing heat flows $Q_H$ 346 and 347 out the upper, hot end and temperatures $T_H$ 331 and 332, and cools cold electrode 336 producing cooling $Q_C$ 348 and temperature $T_C$ 335.

Figure 4A:
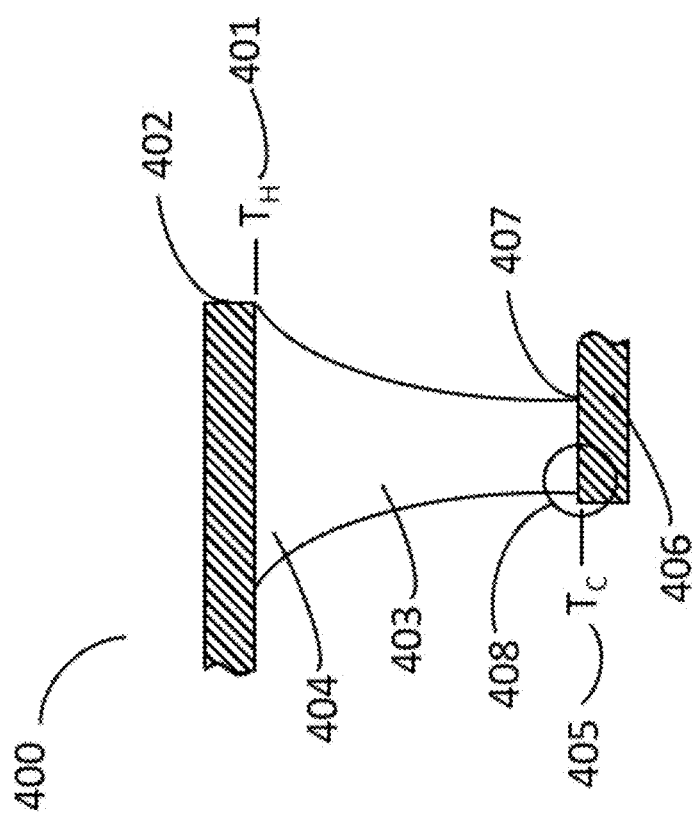
FIGS. 4A-4B schematically illustrate example interfaces between TE elements and electrodes, such as provided herein.
Figure 4B:
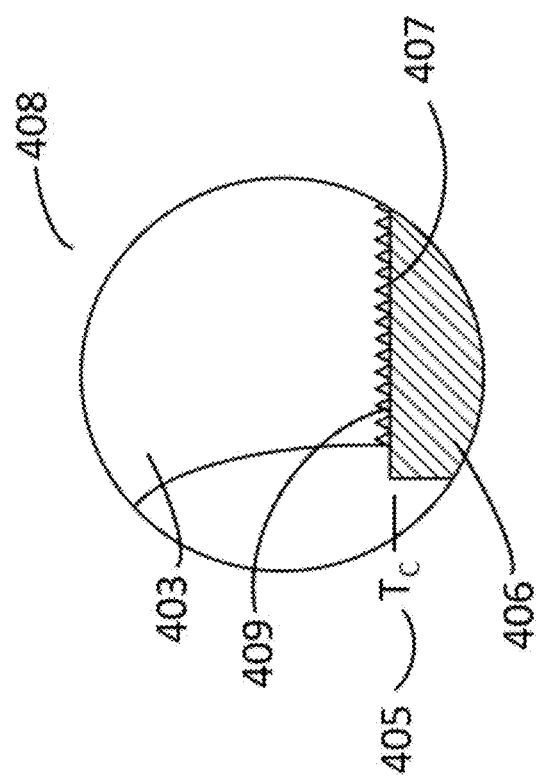

FIGS. 4A-4B schematically illustrate example interfaces between TE elements and electrodes, such as provided herein. FIG. 4A generally depicts a TE element 400 including hot side electrodes 402 operating at hot side temperature $T_H$ 401, TE element 403 and cold side electrode 406 operating at cold side temperature $T_C$ 405. Hot end 404 is attached to hot end electrode 402 and cold end 408 is attached to cold end electrode 406 at interface 407. The zone 408 depicted in FIG. 4A is shown enlarged and in more detail in FIG. 4B. Especially at the cold end, segmentation and or DTP can be used to increase carrier near the ends of TE elements concentration and thereby reduce interfacial resistance.

FIG. 4B depicts an enlarged view portion 408 of the lower electrode 406, a portion of the TE element 403, and details of the construction of the interface 407 between the two parts. TE element 403 has surface detail 409 that decreases the interfacial resistance at the interface 407. Depicted in the FIG. 4B, the increase in surface area in surface detail 409 is at least in part achieved by roughening the surface, adding trenches, changing the chemical composition, or in any other way treating the cold end of TE element 403 so as provide texture and thus reduce its interfacial electrical and/or thermal resistance. In another embodiment not specifically shown in FIG. 4B, surface detail 409 can be applied to electrode 406 in addition to and/or instead of TE element 403 to decrease the interfacial resistance at the interface 407.

Accordingly, it may be understood that FIGS. 1A-1C, 2A-2B, and 3A-3B provide thermoelectric elements having a cold end, a hot end, and a p-type or n-type material having a length between the hot end and the cold end. The p-type or n-type material has an intrinsic Seebeck coefficient (S), an electrical resistivity ($\rho$), and a thermal conductivity ($\lambda$). The spatially varying DTP properties and construction of the p-type or n-type material suitably may be selected so as to provide desired performance characteristics such as described herein with reference to FIGS. 5-30. For example, each of two or more of S, $\rho$, and $\lambda$ may generally increase along the length from the cold end to the hot end. In some configurations, each of all three of S, $\rho$, and $\lambda$ optionally generally increases along the length from the cold end to the hot end. By "generally increase" it is meant that the value of the parameter is larger at the hot end than it is at the cold end. In some examples, the parameter may increase monotonically along the length from the cold end to the hot end. In some examples, the parameter may be discontinuous at at least one point along the length. For example, the thermoelectric element may be segmented, and thus may include different materials that are joined together along the length. Each such material in the thermoelectric element may differ from other material(s) in the thermoelectric element in regards to any suitable combination of one or more of S, $\lambda$, or $\rho$, and at the point where those differing materials contact one another the S, $\lambda$, or $\rho$ may be discontinuous. The p-type or n-type material may include any suitable number of such segments, e.g., two or more, four or more, ten or more, twenty or more, fifty or more segments, or 100 or more segments, e.g., 2-100 segments, or 4-50 segments, or 4-20 segments. In some examples, each of two or more of S, $\lambda$, and $\rho$ vary monotonically within each given segment. Non-limiting examples of performance effects of the number and types of segments on thermoelectric performance are described with reference to FIGS. 22-26 and 29-30.

The S, $\lambda$, and $\rho$ of material(s) in the p-type or n-type material suitably may be selected based on the composition, doping, crystal structure, or porosity of the p-type or n-type material along the length. For example, in a manner such as described with reference to FIGS. 17-30, the composition(s), segmentation, and cross-sectional areas of thermoelectric elements may be selected so as to provide desired performance characteristics. In some nonlimiting examples described in greater detail below, the p-type or n-type material optionally is selected from the group consisting of bismuth telluride, cesium bismuth telluride, and bismuth antimony, or optionally includes a metallic thermoelectric material, an organic thermoelectric material, or porous silicon. Any suitable combination of one or more of such materials, or any other suitable materials, may be used so as to provide enhanced performance characteristics, such as enhanced maximum temperature differences $\Delta T/T_H$.

For example, in a manner such as described below with reference to FIGS. 7 and 24, the increases in each of two or more of S, $\rho$, and $\lambda$ optionally are selected such that at maximum coefficient of performance (COP), a curve describing the temperature increase between the cold end and the hot end is concave.

Additionally, or alternatively, in a manner such as described in greater detail below with reference to FIGS. 14A-16, the value of S at a first location along the length optionally is at least 2.5 times S at a second location along the length. The first location may be closer to the cold end than is the second location. Such differences between the values of S at different locations within the p-type or n-type material may be referred to herein as "ranges" of S. For example, FIG. 14A describes an example "range" of S of 100-250, meaning that the value of S at the cold end is 100 and the value of S at the hot end is 250 (which is 2.5 times S at the cold end). Another example range of S in FIG. 14A is 50-1000, meaning that the value of S at the cold end is 50 and the value of S at the hot end is 1000 (which is 20 times S at the cold end). Another example range of S is provided in FIG. 14B of 50-500 meaning that S at the hot end is 10 times S at the cold end. Accordingly, it should be appreciated that the value of S at a second location in the present p-type or n-type material (e.g., at the hot end) may have any suitable value relative to the value of S at a first location in that material (e.g., at the cold end), e.g., may be 2.5-20 times greater, may be 2.5-10 times greater, or may be 10-20 times greater, or even may be more than 20 times greater, e.g., may be more than 50 times greater. Non-limiting examples of performance effects of different ratios of S at the hot end (Sh) and at the cold end (Sc) on the maximum temperature difference $\Delta T max/T_H$ are described with reference to FIG. 13B.

Additionally, or alternatively, a cross-sectional area of the p-type or n-type material optionally varies along the length. Non-limiting examples of performance effects of different thermoelectric element shapes and cross-sectional areas are described with reference to FIGS. 14A-16, 18, and 19A-19C.

It further may be understood that FIGS. 1A-1C, 2A-2B, and 3A-3B provide a single-stage thermoelectric device that includes the present thermoelectric elements and any suitable options thereof, such as described elsewhere herein. In such a thermoelectric device, the general increases in each of two or more of S, $\rho$, and $\lambda$ optionally may be selected such that $\Delta T max/T_H$ is at least 0.2. Selection of parameters to achieve desired values of $\Delta T max/T_H$ are described throughout the present disclosure. It will be appreciated that each of two or more of S, $\rho$, and $\lambda$ optionally may be selected such that $\Delta T max/T_H$ may have any suitable value, e.g., may be at least 0.2, at least 0.24, at least 0.3, at least 0.33, at least 0.4, or at least 0.43. A value of $\Delta T max/T_H$ of at least 0.2 may be provided, for example, by a maximum temperature difference $\Delta T max$ of at least 60K (equivalently 60 C) at a hot end temperature $T_H$ of 300K, although the particular temperature of the hot end may vary based on the application and the operating environment. Similarly, a value of $\Delta T max/T_H$ of at least 0.24 may be provided, for example, by a maximum temperature difference $\Delta T max$ of at least 73K at a hot end temperature $T_H$ of 300K; a value of $\Delta T max/T_H$ of at least 0.3 may be provided, for example, by a maximum temperature difference $\Delta T$ of at least 90K at a hot end temperature $T_H$ of 300K; a value of $\Delta T max/T_H$ of at least 0.33 may be provided, for example, by a maximum temperature difference $\Delta T$ of at least 100K at a hot end temperature $T_H$ of 300K; a value of $\Delta T max/T_H$ of at least 0.4 may be provided, for example, by a maximum temperature difference $\Delta T$ of at least 120K at a hot end temperature $T_H$ of 300K; and a value of $\Delta maxT/T_H$ of at least 0.43 may be provided, for example, by a maximum temperature difference $\Delta T$ of at least 130K at a hot end temperature $T_H$ of 300K. As described in greater detail below, e.g., with reference to FIGS. 14A-14B-18, example maximum temperature differences $\Delta T$ of 75K-114K may be achieved in a single-stage device; and as described in greater detail below, e.g., with reference to FIGS. 20A-20B, example maximum temperature differences $\Delta T$ of about 70K or greater may be achieved in a single-stage device including a suitable number of stages, e.g., 1, 2, 5, 10, 20, 50 or 100 stages and a Seebeck constant range of 50-1000 μV/K.

Figure 19A:
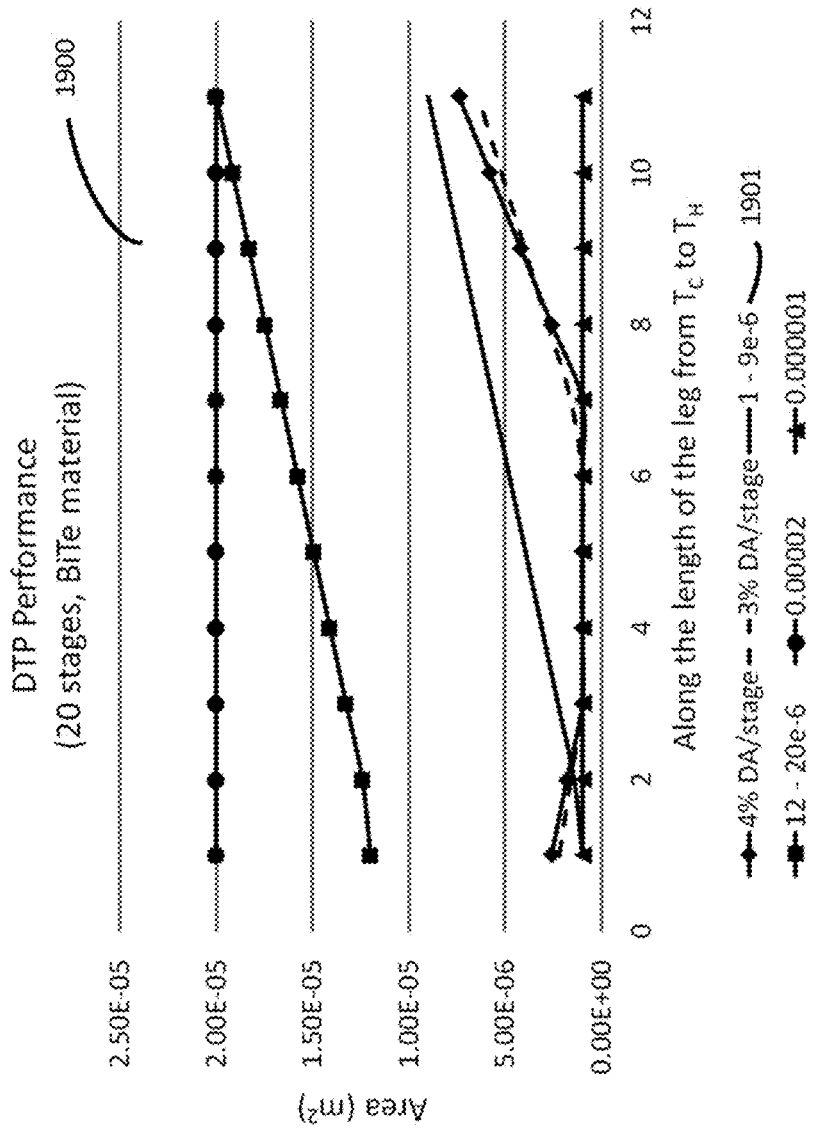
FIGS. 19A-19C are plots respectively illustrating cross-sectional areas, Seebeck coefficients, and figures of merit (ZT) as a function of position along the TE leg length from $T_C$ to $T_H$ for example TE devices provided herein.
Figure 19B:
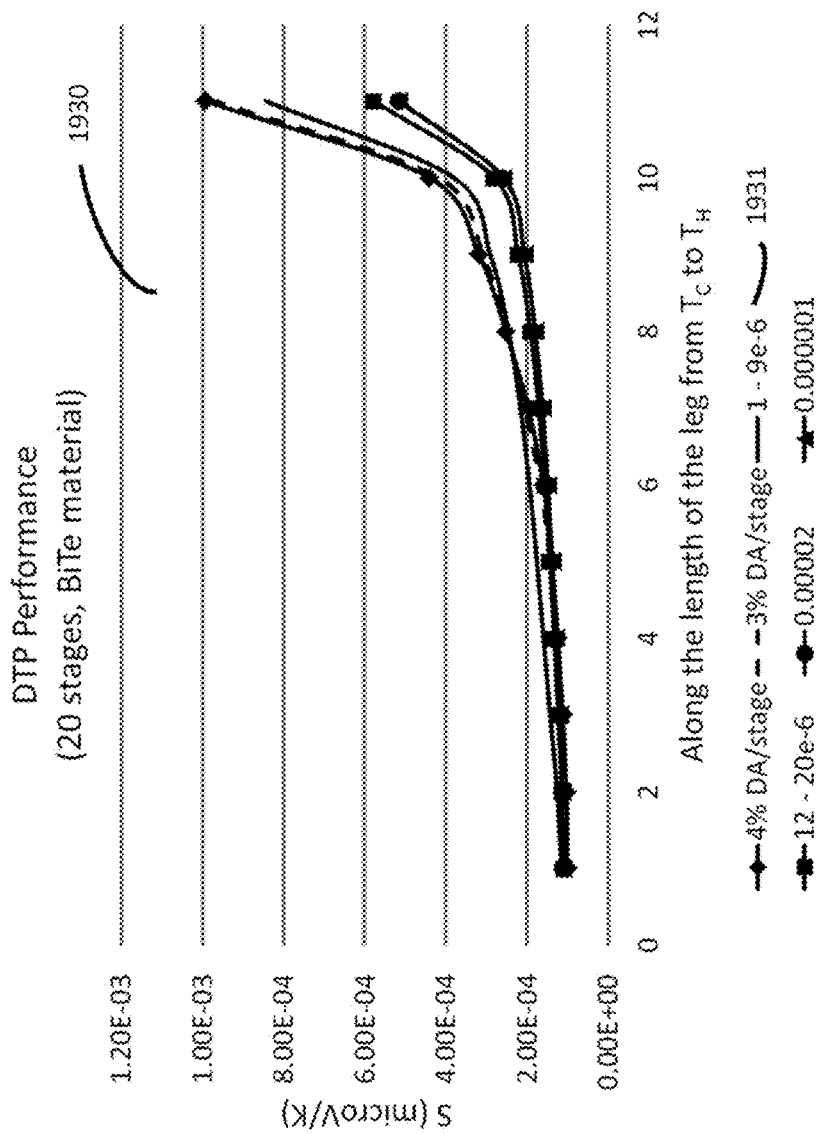
Figure 19C:
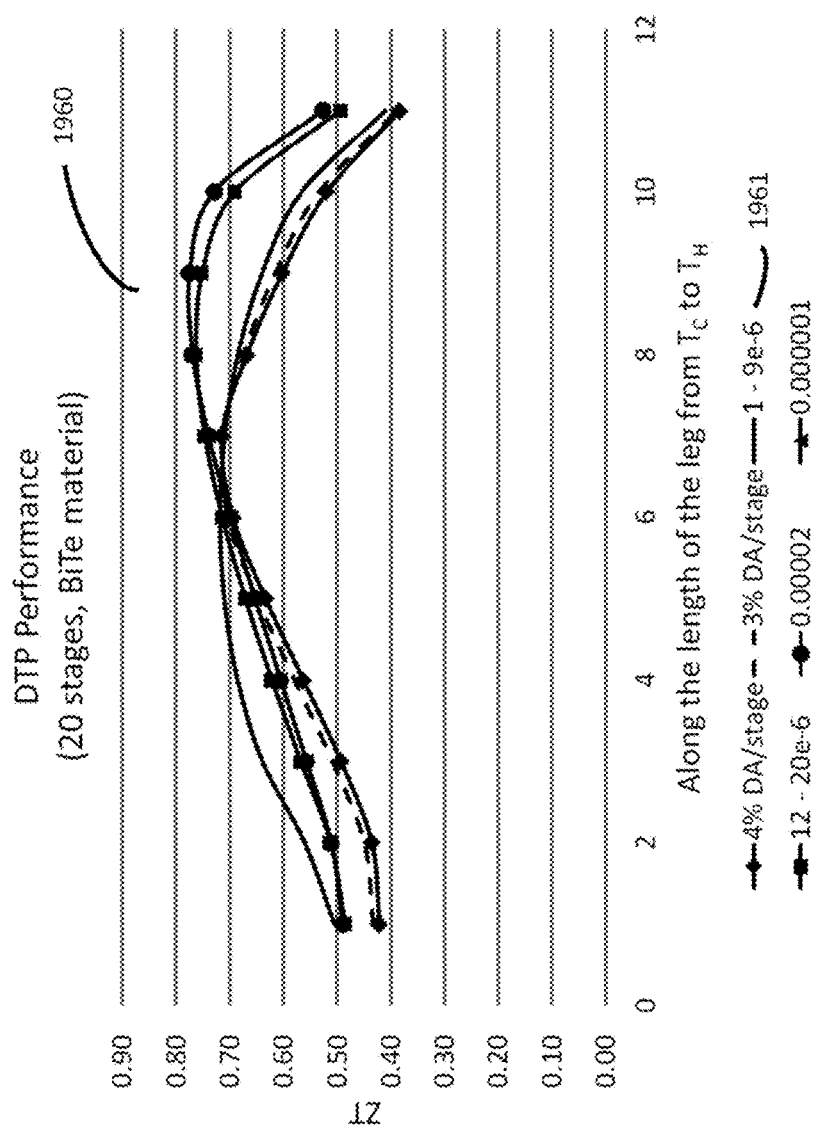

Example values of ZT may be achieved through suitable selection of spatially varying properties and geometries, for example as described with reference to FIGS. 19C, 21A, and 21B. In various examples provided herein, general increases in each of two or more of S, ρ, and λ may be selected such that ZT is at least 0.05, at least 0.5, or at least 0.75, or at least 0.9. For example, ZT may be in the range of 0.25 to 0.9, or in the range of 0.5 to 0.9, or in the range of 0.5 to 0.75.

It will be appreciated that multi-stage thermoelectric devices also are provided that includes a plurality of the present single-stage thermoelectric devices and any suitable options thereof, such as described elsewhere herein.

Also provided herein is a thermoelectric device that includes a first thermoelectric element including a p-type material, a hot end, a cold end, a length between the hot end and the cold end. The first thermoelectric element has an intrinsic Seebeck coefficient ($S_p$), an electrical resistivity ($\rho_p$), and a thermal conductivity ($\lambda_p$), wherein each of two or more of $S_p$, $\rho_p$, and $\lambda_p$ generally increases along the length from the cold end to the hot end. The thermoelectric device also includes a second thermoelectric element including an n-type material, a hot end, a cold end, a length between the hot end and the cold end. The second thermoelectric element has an intrinsic Seebeck coefficient ($S_n$), an electrical resistivity ($\rho_n$), and a thermal conductivity ($\lambda_n$), wherein each of two or more of $S_n$, $\rho_n$, and $\lambda_n$ generally increases along the length from the cold end to the hot end. The thermoelectric device also includes a first electrode electrically coupled to the hot end of the first thermoelectric element and to the hot end of the second thermoelectric element, a second electrode electrically coupled to the cold end of the first thermoelectric element, and a third electrode electrically coupled to the cold end of the second thermoelectric element.

In thermoelectric devices in which both the p-type and the n-type materials have such spatially varying DTP, it will be appreciated that even greater enhancements in performance are possible. For example, the general increases in each of two or more of $S_p$, $\rho_p$, and $\lambda_p$ and the general increases in each of two or more of $S_n$, $\rho_n$, and $\lambda_n$ may be selected in a manner such as described elsewhere herein, such that $\Delta Tmax/T_H$ is at least 0.33, or at least 0.4, or at least 0.43, or even greater. Additionally, or alternatively, respective cross-sectional areas of the p-type material and the n-type material optionally may vary along their respective lengths. Additionally, or alternatively, optionally a composition, doping, crystal structure, or porosity of each of the P type and n-type materials independently vary along the length. Similarly, in a manner such as described with reference to the present thermoelectric elements, $S_p$ at a first location along the length is at least 2.5 times $S_p$ at a second location along the length, and $S_n$ at a first location along the length is at least 2.5 times $S_n$ at a second location along the length, although it will be appreciated that such ratios may be significantly higher, e.g., may be 2.5-20 times greater, may be 2.5-10 times greater, or may be 10-20 times greater, or even may be more than 20 times greater, e.g., may be more than 50 times greater.

Additionally, or alternatively, at least one respective interface between the first thermoelectric element and the first or second electrodes or between the second thermoelectric element and the first or third electrodes optionally is textured so as to reduce interfacial resistance, e.g., in a manner such as described below with reference to FIGS. 4A-4B.

Additionally, or alternatively, the thermoelectric device optionally further includes a control module electrically coupled to the second and third electrodes. Nonlimiting examples of control modules include element 108 described with reference to FIG. 1A, element 138 described with reference to FIG. 1B, element 313 described with reference to FIG. 3A, and element 373 described with reference to FIG. 3B. Optionally, the control module is configured so as to pass current in series through the first thermoelectric element, the first electrode, and the second thermoelectric element via the second and third electrodes, e.g., in a manner such as described with reference to FIGS. 1A, 3A, and 3B. As a further option, first and second thermoelectric elements respectively are optionally configured to pump heat from the second and third electrodes to the first electrode responsive to the current, e.g., in a manner such as described with reference to FIGS. 1A, 3A, and 3B.

Additionally, or alternatively, the thermoelectric device optionally further includes a heat sink thermally coupled to the first electrode and a cold sink thermally coupled to the second and third electrodes, the heat sink and the cold sink generating a temperature gradient between the respective hot and cold ends of the first and second thermoelectric elements, e.g., in a manner such as described with reference to FIG. 1B. Optionally, the first and second thermoelectric elements respectively are configured to generate a current through the control module responsive to the temperature gradient e.g., in a manner such as described with reference to FIG. 1B.

Figure 5:
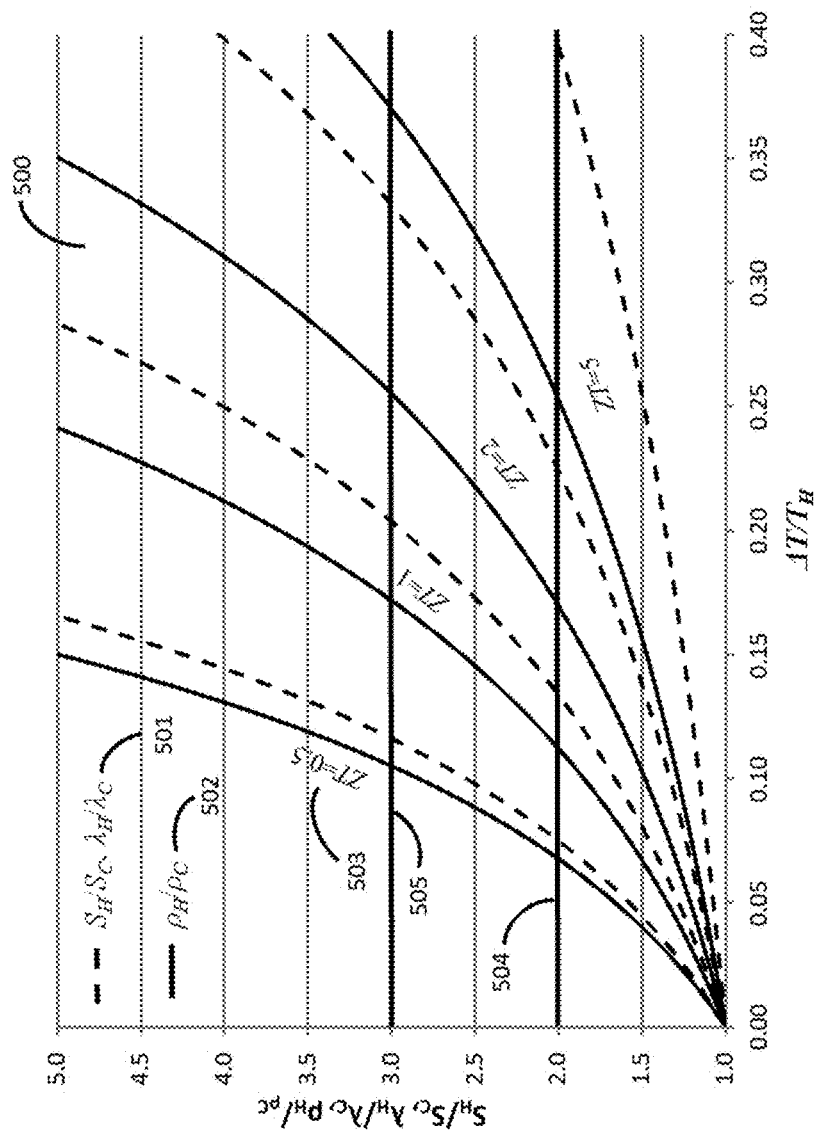
FIG. 5 is a plot illustrating electrical and thermal properties as a function of $\Delta T/T_H$ for example TE devices provided herein.

FIG. 5 is a plot illustrating electrical and thermal properties as a function of $\Delta T/T_H$ for example TE devices provided herein. More specifically, FIG. 5 presents the ratio of hot to cold side transport properties as a function of $\Delta T/T_H$. These ratios increase with either small ZT or large $\Delta T/T_H$. For example, plot 500 presents the ratio of the hot and cold sides of DTP TE couples for optimal Seebeck coefficient, thermal conductivity and electrical resistivity. Dashed curves 501 depict the ratios for both Seebeck coefficient and thermal conductivity and solid curves 502 depict the corresponding electrical resistivities. Results are presented for several dimensionless figures of merit, ZT 503, equal to 0.5, 1, 2, or 5. Horizontal line 504 depicts a ratio of 2 between the hot and cold side DTP TE parameters and horizontal line 505 depicts a ratio of 3 for the hot and cold side DTP parameters.

Figure 6:
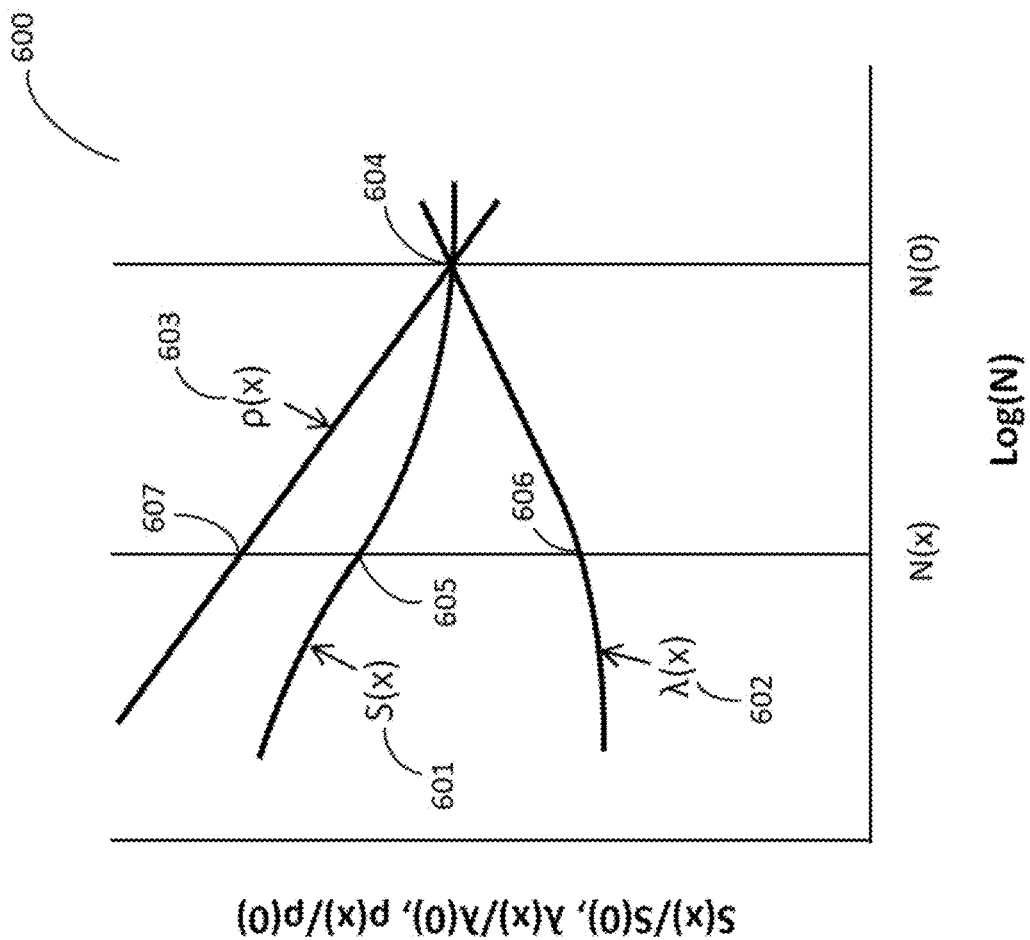
FIG. 6 is a plot illustrating electrical and thermal properties as a function of dopant concentration for example TE devices provided herein.

FIG. 6 is a plot illustrating electrical and thermal properties as a function of dopant concentration for example TE devices provided herein. For example, plot 600 depicts the ratio of the spatially varying Seebeck coefficient S(x) 601, thermal conductivity (x) 602, and electrical resistivity ρ(x) 603 of DTP TE couples at a location x measured from the cold side as a function of the spatially varying dopant concentration N(x) in TE elements. Point 604 is located at x=0. Point 605 is the value of the Seebeck coefficient curve S(x) 601 at a point x corresponding to a dopant concentration N(x). Similarly, point 606 is the value of the thermal conductivity curve (x) 602 at a point x corresponding to a dopant concentration N(x) and point 607 is the value of the electrical resistance 603 at a point x corresponding to a dopant concentration N(x).

Plot 600 illustrates that the normal tendency for a doped TE material is for the resistivity p to decrease as dopant concentration increases. This is due to the increase in electron or hole density with increased carrier concentration, N and hence decreasing resistivity ρ. Thus, ρ tends to be decreased by changes that tend to increase S and λ, and vice versa, dopant changes that tend to decrease S and λ increase ρ. For DTP operation, all three S, λ and ρ should change in the same direction as taught by Equations (8) to (11) herein and in FIGS. 2A, 2B and 5, among many parts of this patent. Thus, it is not obvious now to construct DTP material systems by the traditional primary method of optimizing ZT by adjusting dopant levels, N. For optimizing COP, ΔTmax and other performance metrics in DTP systems other design variables are adjusted advantageously, even if ZT decreases at positions along a P type and/or N type TE element. Other adjustments include area ratio variations to make more favorable the relationship between the thermal resistance K(x) at a location x and electrical resistance R(x) at location x as a consequence of the relationship to TE element area between p and λ:

$$R(x) = \rho(x)/A(x) \quad (100)$$

$$K(x) = \lambda(x) A(x) \quad (101)$$

So that $$\rho(x)/\lambda(x) = R(x) A^2(x)/K(x) \quad (102)$$

Equation (102) demonstrates a factor area A(x), if variable, can effectively modify the relationship between the effect on performance of ρ(x) and λ(x) with position x, for example, FIGS. 3A, 3B, 3C, 14A, 14B, 15, 16, 18, 19A, 19B, 19C, 20B, 22, 23, 24, 26, 27 and 29, demonstrate variable area TE elements and its impact on device performance. Also, adjustment of TE material alloy composition and combining different TE materials in different portions of TE elements ad depicted in FIGS. 3B, 20A, 20B and 29 along with portions of the text in this description.

Figure 7:
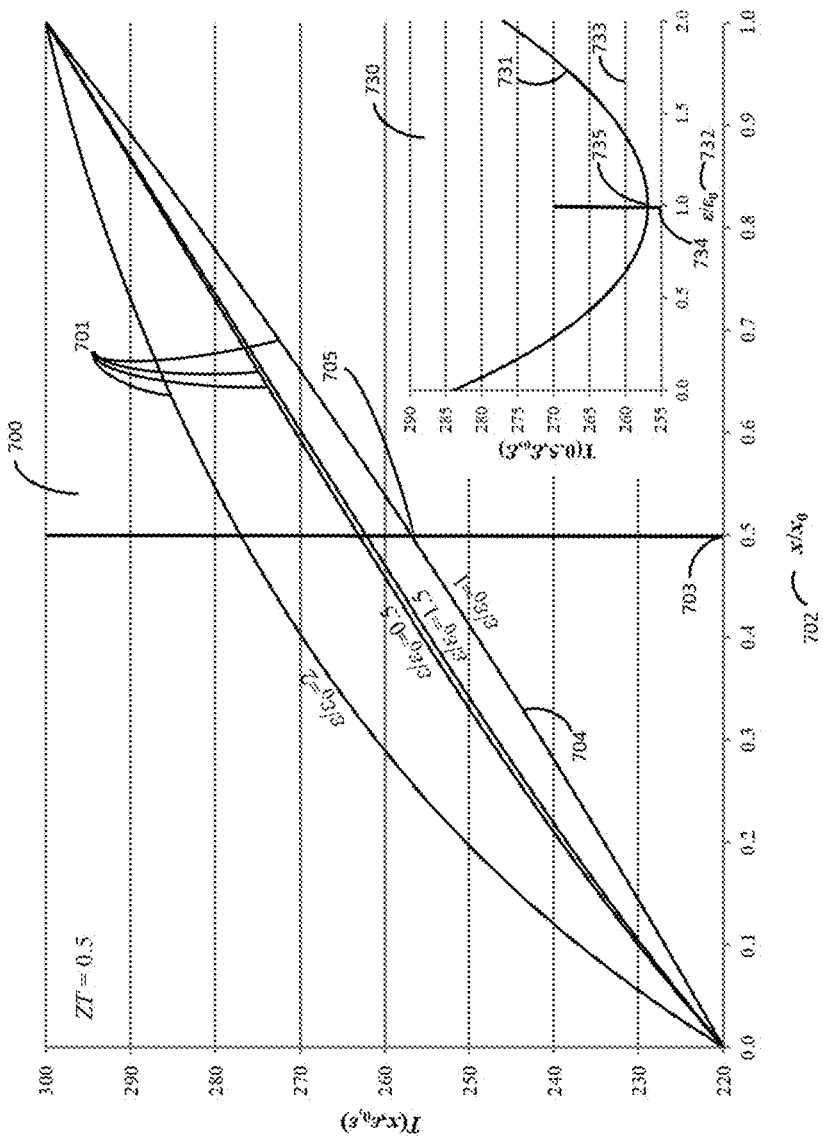
FIG. 7 is a plot illustrating temperature profiles as a function of position between the hot and cold ends for example TE devices provided herein.

FIG. 7 is a plot illustrating temperature profiles as a function of position between the hot and cold ends for example TE devices provided herein. Temperature profiles for cooling operating over a range of currents are shown in FIG. 7. Under off-nominal conditions, TE elements internal temperatures are greater than that of the optimum profile. More specifically, plot 700 depicts the calculated temperature profiles 701 of a TE couple as a function of position from the cold and to the hot end for various ratios of currents to the current that maximizes COP in a DTP system. The midpoint 703 along the length $x/x_o$ 702 of a TE element of DTP design intersects curve 704 at point 705. Inset 730 depicts the temperature profile 731 at location 703 for $\varepsilon/\varepsilon_o$ 732. Point 735 is the intersection of curve 731 and point 734 where $\varepsilon/\varepsilon_o = 1$. Horizontal line 733 depicts the temperature of the midpoint of the TE element when no current is flowing through the TE element.

Figure 8:
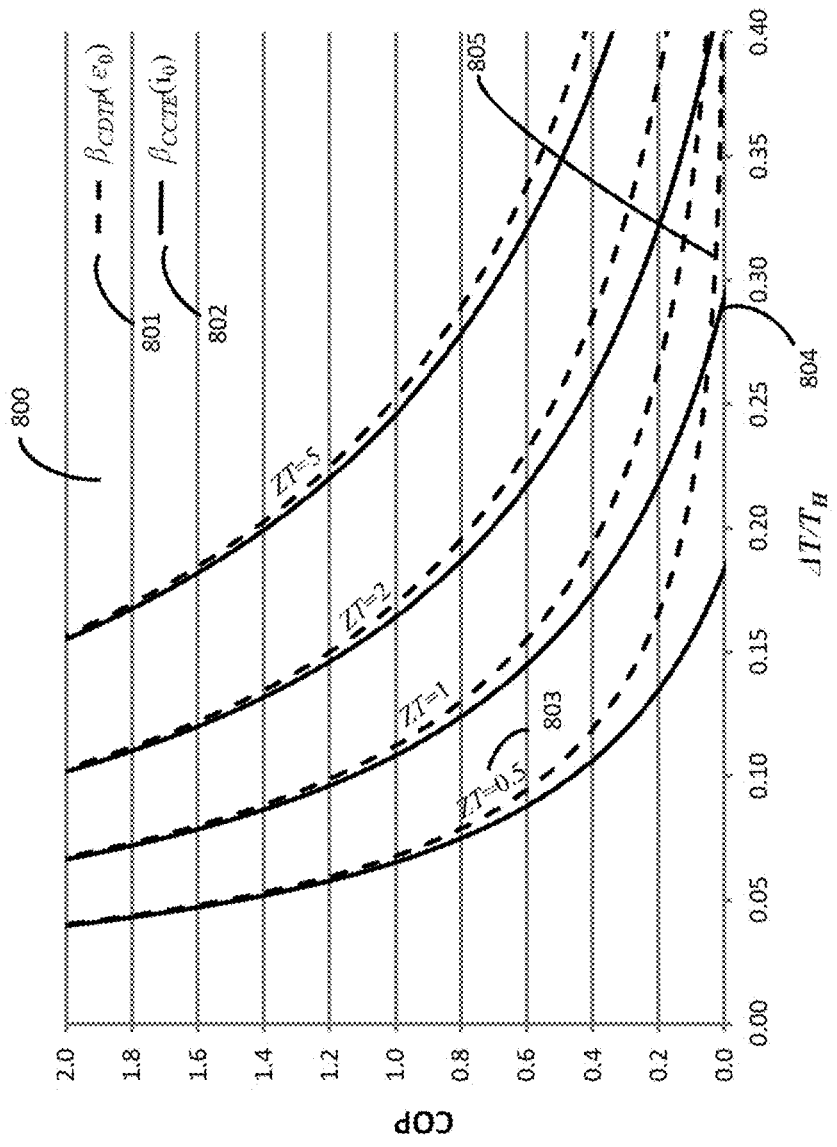
FIG. 8 is a plot illustrating coefficient of performance (COP) as a function of $\Delta T/T_H$ for example TE devices provided herein.

FIG. 8 is a plot illustrating coefficient of performance (COP) as a function of $\Delta T/T_H$ for example TE devices provided herein. Plot 800 depicts the efficiency of TE generators using DTP design 801 and conventional design 802 for different values of ZT 803 of 0.5, 1, 2, and 5. For example, FIG. 8 shows maximum COP for cooling in DTP and CTE systems as a function of $\Delta T/T_H$. For large $\Delta T/T_H$ the difference in optimal performance of the two systems becomes large. The range of effective DTP cooling extends beyond the maximum cooling $\Delta T_{MAX}$ for CTE systems, as may be seen by comparing the COP at maximum $\Delta T/T_H$ for CTE curve 804 to the COP at maximum $\Delta T/T_H$ for DTP curve 805. For COPs >1, performance of the two systems is nearly identical.

FIG. 9 is a plot illustrating cooling capacities as a function of current for example TE devices provided herein. Cooling capacities for DTP and CTE systems for a particular $\Delta T/T_H$ are shown in FIG. 9. DTP systems have larger cooling capacity and a larger current range for which cooling occurs. For example, plot 900 depicts cooling capacities for DTP (dashed lines) and CTE (solid lines) systems. Curves are shown for materials with constant ZT of 0.5, 1, 2, and 5. At each ZT, DTP systems 901 have larger cooling capacity $Q_C/\lambda$ and a larger current range $\varepsilon/\varepsilon_0$ for which cooling occurs than do CTE systems $i/i_0$ than do CTE systems 902 for which cooling occurs. Both current range and cooling capacity are significantly greater for DTP systems. For ZT=0.5, there is no positive cooling for a CTE system 903 while DTP system 904 provides cooling. The cooling of DTP with ZT=0.5 904 is nearly twice that of CTE 905 ZT=1 and with up to about 50% higher maximum current 906.

Figure 10:
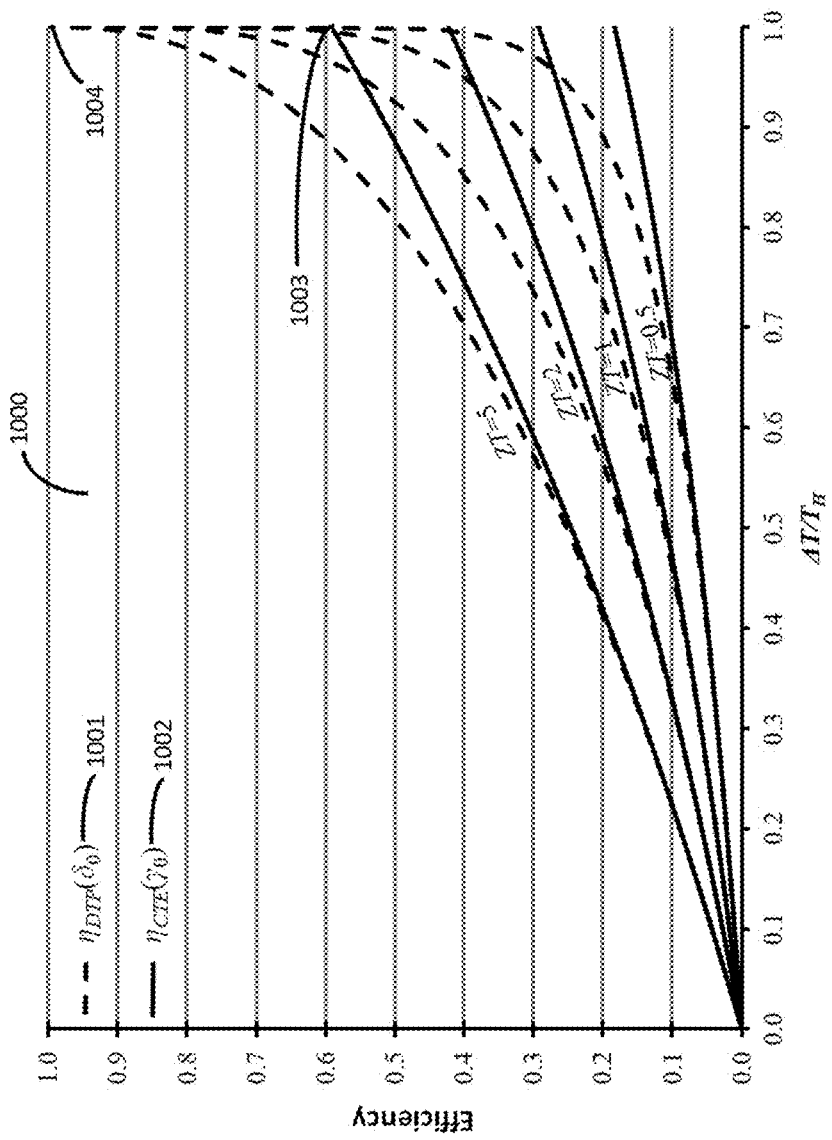
FIG. 10 is a plot illustrating efficiency as a function of $\Delta T/T_H$ for example TE devices provided herein.

FIGS. 10-11 show the characteristics for DTP and CTE systems for power generation operation. For example, FIG. 10 is a plot illustrating efficiency as a function of $\Delta T/T_H$ for example TE devices provided herein. Plot 1000 depicts power generation efficiency for DTP 1001 and CTE 1002 systems for ZT of 0.5, 1, 2, and 5. Point 1003 is the intersection of the CTE 1002 for ZT=5 with $\Delta T/T_H=1.0$ and point 1004 is the intersection of DTP 1001 under the same conditions. FIG. 11 is a plot illustrating efficiency as a function of current for example TE devices provided herein. More specifically, FIG. 11 is a graph depicting power generation efficiency for off-nominal operating currents for DTP 1101 and CTE 1102 systems. In all cases performance improves with DTP, but, unless $\Delta T/T_H$ is 0.6 or larger, the gains are generally smaller than those associated with cooling and heating. Without wishing to be bound by any theory, it is believed that the main cause of the small performance improvement may be the direct result of the basic assumption that the average ZT in the CTE system is equal to the DTP value. Since in CTE systems Z is held constant and hence ZT is proportional to temperature, the large temperature changes associated with power generation can lead for comparison with CTE TE materials with unrealistically high ZT at the hot end. Because of these circumstances, the performance of CTE systems is likely to be overstated here.

Figure 12:
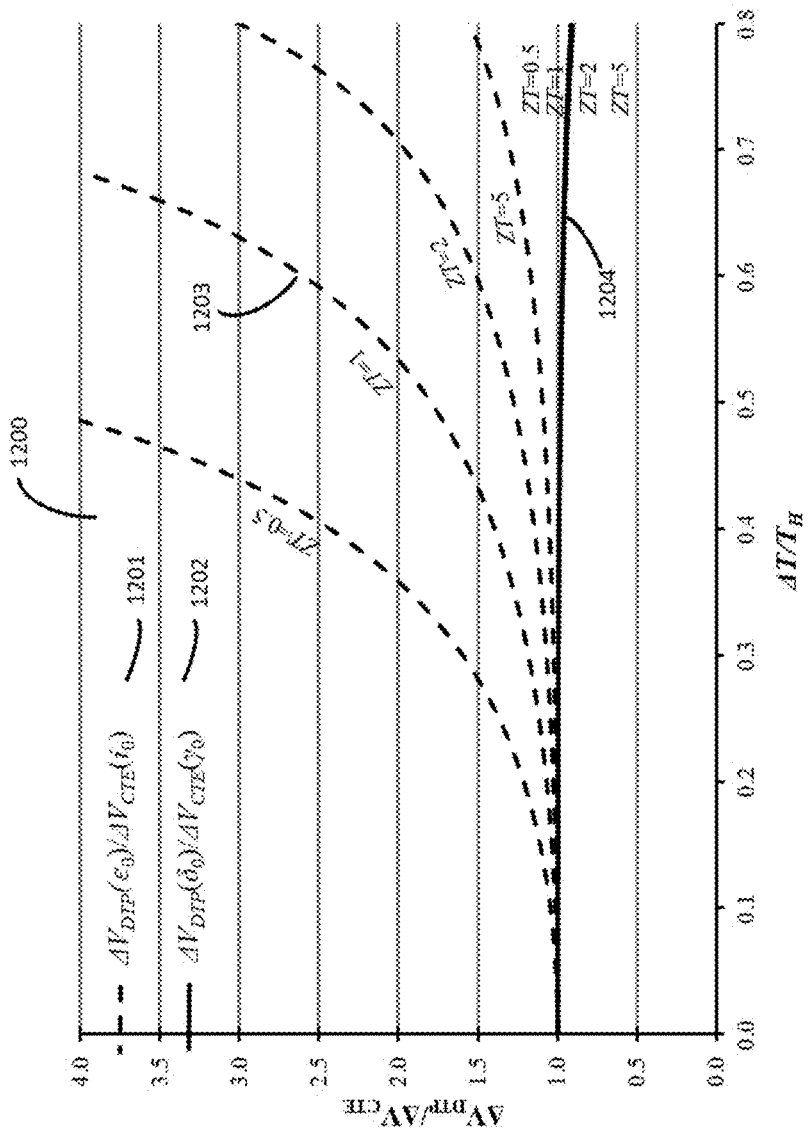
FIG. 12 is a plot illustrating voltage ratios as a function of $\Delta T/T_H$ for example TE devices provided herein.

The voltages for DTP to CTE systems determine the number of TE elements needed for a specified input (or output) voltage. Since DTP voltages are a function of the Seebeck coefficients which range from $S_C$ to $S_H$, a comparison with CTE systems should use for DTP systems the Equations (59) to (63) herein. FIG. 12 is a plot illustrating voltage ratios as a function of $\Delta T/T_H$ for example TE devices provided herein. For example, FIG. 12 presents the voltage ratios of DTP/CTE for cooling and power generation. Plot 1200 depicts the ratios of DTP system voltages 1201 to those for conventional TE designs 1202. Voltage ratio curves 1201 present values for cooling curves 1203 and solid curves 1202 present values for power generation curves 1204.

The set of equations which characterize optimum performance of TE systems with DTP is presented for cooling, heating and power generation modes of operation. Solutions are given in closed form for both optimum performance and for performance under a broader set of operating conditions. The solutions are compared to CTE, the traditional analytic characterization of TE systems. The CTE model assumes constant transport properties, which leads to a linear increase in ZT with temperature from the cold to the hot side of a TE element. The effects of DTP are shown to provide several beneficial characteristics compared to CTE systems across broad operating conditions.

For typical TE systems, performance is less than that of DTP systems since in CTE systems transport properties cannot be specified and changed to have the variation with position that leads to enhanced, or optimum, performance. Since actual TE designs perform less well than the CTE model predicts, it is likely that, in cooling, heating and power generation applications, DTP designs (when feasible to fabricate) will have greater performance gains than those computed here.

Some example performance differences between the DTP and CTE models are summarized below. Operating conditions for which the temperature differentials are small, both systems give nearly the identical results. At large temperature differentials DTP systems do demonstrate efficiency gains, and operation over broader range of conditions. The gains can be of practical significance for DTP systems. A further opportunity for gains comes from the benefits DTP can provide to improving the performance of lower ZT, low cost TE materials for cooling, heating and power generation applications.

Example Cooling and Heating Characteristics

DTP systems can produce larger maximum temperature differentials than is possible with single stage CTE systems. The ability to fabricate single TE elements with the necessary range of transport properties between hot and cold ends may limit performance gains.

DTP systems have higher COP under all cooling conditions. At high temperature differentials, the efficiency gains are large. For the same (large) temperature differential, DTP systems can provide much higher COP compared to that of CTE systems.

Heating is more efficient for operation in which heat is extracted from the normally hotter end of DPT TE elements. However, heating by reversing current (i.e. heat extracted from the nominally cold side of the TE element) may have lower efficiency for DTP systems than for CTE systems.

The ability to construct DTP single elements with larger temperature differentials simplifies construction and reduces the generally large parasitic thermal and electrical interfacial losses associated with cascade CTE systems, and so increases COP and can increase maximum temperature differentials.

Single stage DTP systems can have properties selected to operate more efficiently over a broader temperature range than is possible with single stage CTE systems.

At large temperature differentials, DTP operate near peak efficiency over a broader range of currents and operating voltages than those for CTE systems.

DTP can enhance performance of low ZT materials at large temperature differentials if transport properties can vary over a broad range within the TE element.

Performance gains for DTP systems decrease (and can become negligible) for small $\Delta T/T_H$.

Example Power Generation Characteristics

Efficiency gains of DTP systems over CTE systems are large for $\Delta T/T_H > 0.6$, both for optimal and other operating conditions. DTP performance gains are small (and can become negligible) at low temperature differentials.

Maximum power gains for DTP are significant for operation at large temperature differentials and $\delta > \delta_0$.

DTP property variation for power generation over TE element length is smaller than for cooling for the same $\Delta T/T_H$.

Optimal property changes in DTP systems are smaller for power generation than for cooling and heating.

Output voltages are lower and currents are higher for DTP systems.

It is important to note it is not necessary to fully express optimal transport properties in actual systems. In some circumstances, readily achievable property variations, other than the optimum ones calculated, may give useful benefits.

DTP can be used for other important TE system improvements. For example, DTP can be employed to reduce performance losses in material systems with properties that vary with temperature by modifying the other transport properties to partially compensate. In circumstances where large variations in material transport properties are required for optimal performance, the requirement that the geometry is invariant along the element length can be relaxed. Some benefit can be achieved, for example, by shaping elements into conical sections or other advantageous shapes to reduce the magnitude of property changes needed to improve performance. These improvements and others are the subject of ongoing research as part of an exploration of the attributes of DTP thermoelectric systems.

Example Numerical Analysis

Maximum temperature difference ΔTmax for a standard thermoelectric module operating in cooling mode is 73K (based on a hot-side temperature of 300K), as described in Nolas et al., "Thermoelectrics—Basic principles and new materials developments" (Springer-Verlag, Berlin Heidelberg, 2001). That value can be increased to 107K for a two-stage cascaded device and up to 130K for a four stage cascaded device. The following discussion presents concepts demonstrated through numerical analysis that achieve a maximum temperature difference exceeding 130 C (or equivalently, 130K) with a single-stage device. This is accomplished principally by using distributed transport properties (DTP) with variable area, but also combines segmentation with alternative thermoelectric materials, including $CsBi_4Te_6$ (p-type) combined with magnetically enhanced BiSb (n-type).

This numerical analyses builds off of the above-described theory and analytical disclosure. Analyses include the study of devices operating in maximum Coefficient of Performance (COP) and maximum heat pumping ($Q_C$) modes in addition to maximum temperature difference (DT) mode. Studies also show how devices made with DTP excel over standard devices when operated in off-nominal conditions. Validation studies confirmed performance against analytical results using ideal material properties where ZT is kept constant and independent of temperature. Performance was then determined using real, temperature dependent thermoelectric transport properties. The above-described analyses are expanded to confirm the expectations and to determine performance improvements based on real, temperature dependent material properties with further optimal design of the geometry and material. A numerical model was used to study the effects of non-ideal conditions, such as contact resistances and operating environment more readily than in analytical solutions. It allows us to compare results to real data and determine performance for non-ideal cases.

The focus of the below disclosure will be on the numerical analyses of enhanced or optimal distributed transport properties combined with other geometry and material enhancement techniques. Numerical analysis is a suitable tool to confirm the analytical/theoretical analyses with temperature independent, constant ZT properties. The developed model will then be used to extend the analyses to real, temperature dependent properties with ability to segment materials and have unconstrained and constrained variable area. A numerical model will also allow the study of other aspects of the thermoelectric device including packing fraction, contact resistances, device environment, leg area profiles, leg area ratios (p- vs. n-), number of DTP stages, couple ratios in cascaded devices, and leg segmentation.

The model is setup using traditional thermoelectric equations for cold-side and hot-side heat flow and power input in a manner such as described in Angrist, "Direct energy conversion, 4$^{th}$ Ed." (Allyn and Bacon, Boston, 1982):

$$Q_{c,i} = \alpha_i I T_i - K_i(T_{i+1} - T_i) - 0.5 I^2 R_i \quad [200]$$

$$Q_{h,i} = \alpha_i I T_{i+1} - K_i(T_{i+1} - T_i) + 0.5 I^2 R_i \quad [201]$$

$$P_i = Q_{h,i} - Q_{c,i} \quad [202]$$

Coefficient of performance (COP) was defined as $$COP = Q_{c,1} / \Sigma P \quad [203]$$

The model is setup as a 1D model where the thermoelectric leg was broken up into 100 equal length control volumes or steps. The number of steps could have been more or less, but 100 steps was thought to be a sufficient number to accurately capture the phenomena being modeled. The number of steps does not change based on the number of DTP stages. For each step, a set of equations was defined based on equations [200] and [201]. Temperatures were solved for at each step, allowing for any non-linearities to be captured. To ensure continuity along the TE leg, the following constraint was used from one step to another.

$$Q_{c,i+1} = Q_{h,i} \quad [204]$$

A stage is differentiated from steps in that a stage can have variable transport properties and/or variable area and can be made up of a varying number of steps. The total number of steps is always 100 for these studies while this study looked at legs that had between 1 and 100 stages. Initial studies started with a variable number of stages in a leg where each stage has modified transport properties. ZT was held constant along the length of the leg with properties scaled accordingly. There were no additional constraints between S, electrical resistivity rho ($\rho$), and thermal conductivity lambda ($\lambda$).

Further studies used temperature dependent properties based on published information for $Bi_2Te_3$, from Nolas et al., "Thermoelectrics—Basic principles and new materials developments," (Springer-Verlag, Berlin Heidelberg, 2001). Beyond temperature dependence, Seebeck coefficient, electrical resistivity, and thermal conductivity were related based on the Pisarenko relation, which relates Seebeck coefficient to Hall carrier density or carrier concentration as described in Nolas et al. Trends for material properties were extrapolated from published values. Additional material properties for $CsBi_4Te_6$ were obtained from Chung et al., "$CsBi_4Te_6$: A high-performance thermoelectric material for low-temperature applications," Science 287: 1024-1027 (2000). Transport properties for thermo-magnetic $Bi_{0.88}Sb_{0.12}$ were derived from Angrist, Angrist, "Direct energy conversion, 4$^{th}$ Ed." (Allyn and Bacon, Boston, 1982); Ziabari, "Nanoscale solid-state cooling: A review," Reports on Progress in Physics 79(095901):34 (2016); and Goldsmid, "The physics of thermoelectric energy conversion" (Morgan & Claypool, 2017).

Other materials have potential as good materials for DTP. Silicon looks like it has a good range for Seebeck coefficient for DTP. Transport properties can be taken from the literature, e.g., from the following references:

Scierning, "Silicon nanostructures for thermoelectric devices: A review of the current state of the art," Phys. Status Solidi A 211(8): 1235-1249 (2014).

Stranz et al., "Thermoelectric Properties of a High-Doped Silicon from Room Temperature to 900K," Journal of Electronic Materials 42(7): 2381-2387 (2013).

Nakamura, "First-principles simulation on Seebeck coefficient in silicon and silicon carbide nanosheets," Japanese Journal of Applied Physics Part 1 55: 06GJ07 (2016).

Yamashita, "Dependence of Seebeck Coefficient on Carrier Concentration in Heavily B- and P-Doped $Si_{1-x}Ge_x$ (x≤0.05) System," Japanese Journal of Applied Physics Part 1 38(11): 6394-6400 (1999).

Lee et al., "Nanoporous Si as an Efficient Thermoelectric Material," Nano Letters 8(11): 3750-3754 (2008).

Ren and Lee, "Thermal conductivity anisotropy in holey silicon nanostructures and its impact on thermoelectric cooling," Nanotechnology 29: 045404 (8pp) (2017).

Tang et al., Holey silicon as an efficient thermoelectric material," Nanoletters 10: 4279-4283 (2010).

Porosity can be used to help reduce thermal conductivity of silicon. ZT~0.4 has been achieved with silicon at room temperature, as described in Tang et al. At this level, with DTP, this material could potentially compete with today's $Bi_2Te_3$. Lee et al. achieved ZT~0.4 at room temperature with Seebeck ranging from <50 μV/K to >700 μV/K. Ren and Lee conducted a numerical study that uses anisotropy of holey silicon to provide 30% better "thermoelectric cooling effectiveness" over bulk silicon and 400% better than chalcogenides with low in-plane and high cross-plane thermal conductivity. Tang et al. achieved a ZT of ~0.4 at room temperature by creating nanoscopic holes at 35% porosity of bulk that reduced thermal conductivity. Organic thermoelectric materials have also been shown to have large Seebeck coefficients and could also be good materials for DTP. Metallic elements also have potential to be good materials for DTP.

The model also includes electrical and thermal contact resistances, which are related to each other by the Wiedemann-Franz law. The Wiedemann-Franz law states that the electronic contribution of the thermal conductivity is proportional to the electrical conductivity based on the temperature. The limitation of using this relationship is that it does not necessarily relate to contact resistances and does not take into account the lattice component of the thermal conductivity. The thermal resistance of the ceramic baseplate is also accounted for. Electrical current is another variable in the model. In FIGS. 4A-4B described above, the construction of the surface detail (texture) 409 at interface 407 can, for example, be produced by pressing a saw tooth shape or any other advantageous shape into the end of interface 407. Alternately, the surface detail 409 can be constructed of, or include, a roughened electrically conductive material (such as metalized interfacial material) that reduces interfacial resistance. One of the purposes of greatly reducing the interface resistance at interface 409 is that, for practical purposes, the need for a flared end on cold interface 407 can be reduced or eliminated.

The model allows for the optimization of either maximum COP, maximum $Q_C$, or maximum DT (equivalently expressed herein as ΔTmax). In addition, the cross-sectional area of the leg can be varied per stage. This can be done with or without distributed transport properties in the leg. The variable area (expressed as DA or AA) can be unconstrained or the change in area can be constrained to be a particular percentage (e.g., 3%) change from one stage to another. The varying area per stage can also be simulated with a constant slope. The model also provides the ability to simulate off-nominal conditions after an optimal solution has been determined by fixing transport properties (preserving temperature dependence) and leg area and solving for temperature profiles at different currents. In addition to modeling thermoelectric configurations with distributed transport properties, the model is also able to model standard device performance in one, two, three, and four stage cascaded devices. The optimal couple ratio from one stage to another can be optimized within the model. The model is also able to optimize for an optimal area ratio between p- and n-type materials as a part of DTP and segmented legs.

Example Results

Figure 13A:
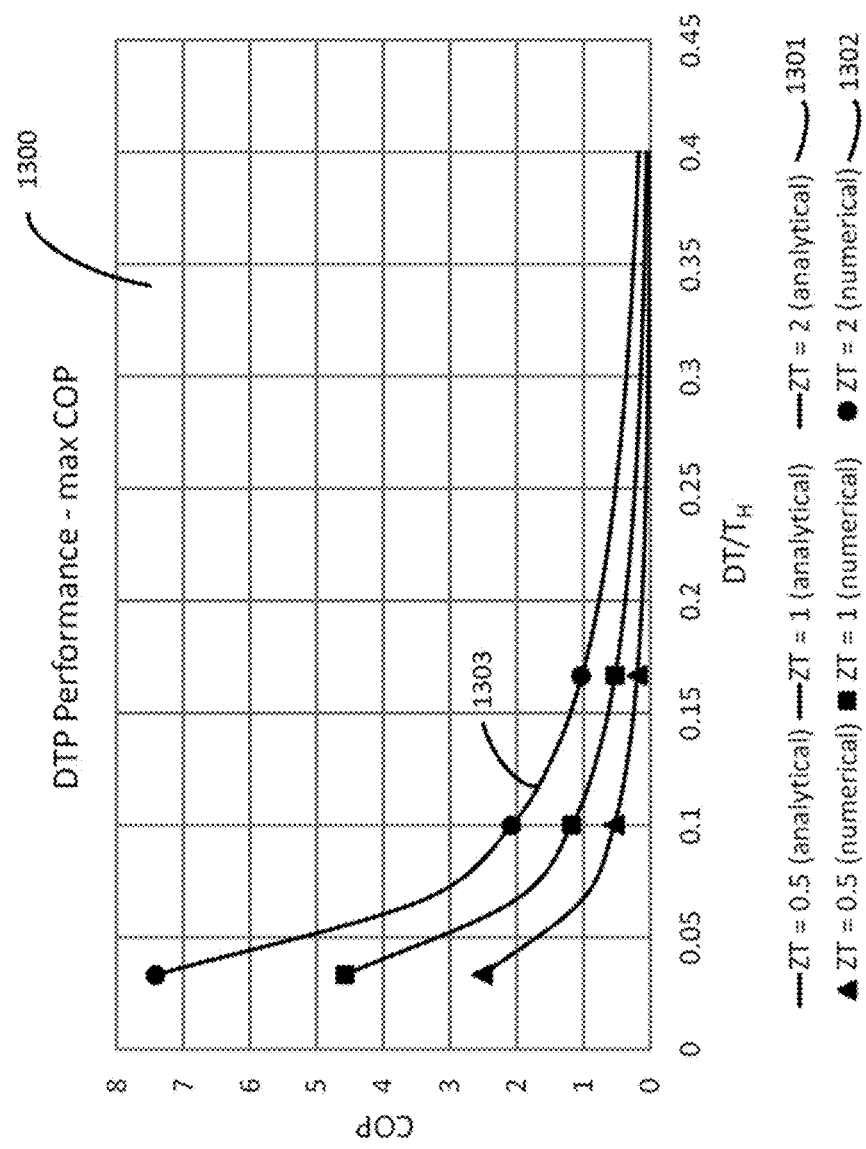
FIG. 13A is a plot illustrating COP as a function of $\Delta T/T_H$ for example TE devices provided herein.
Figure 13B:
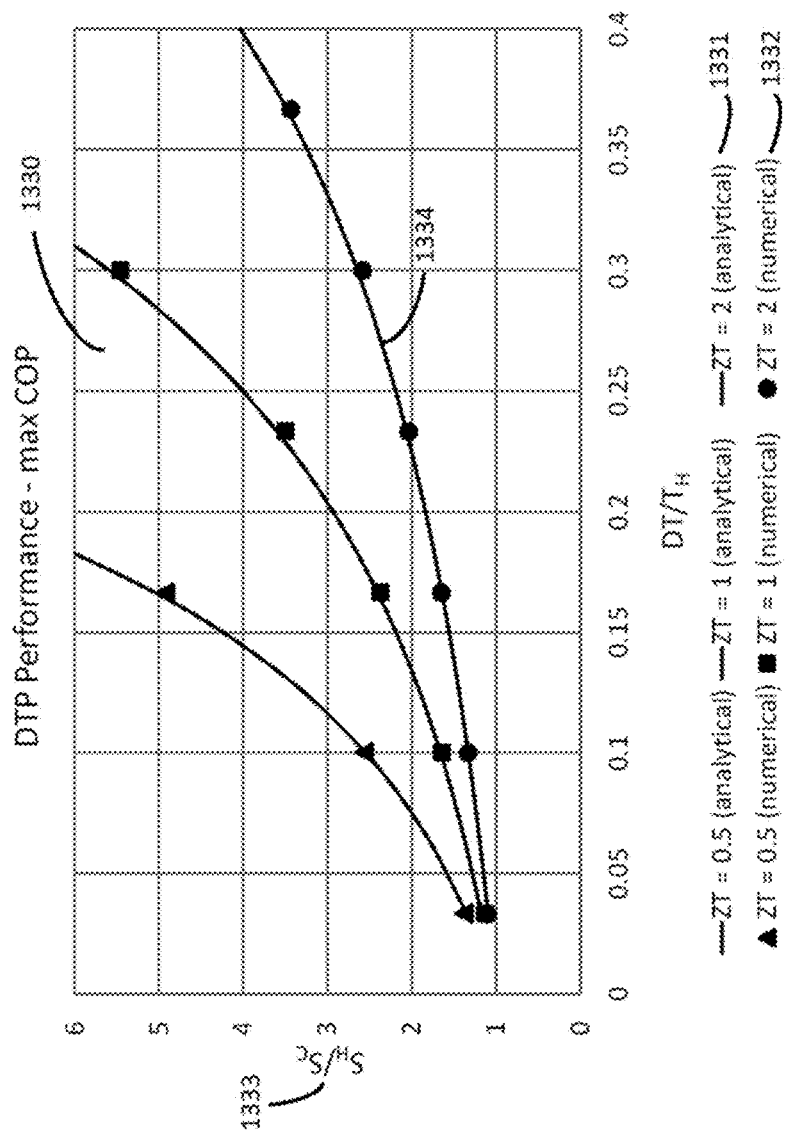
FIG. 13B is a plot illustrating Seebeck coefficient ratios as a function of $\Delta T/T_H$ for example TE devices provided herein.
Figure 14A:
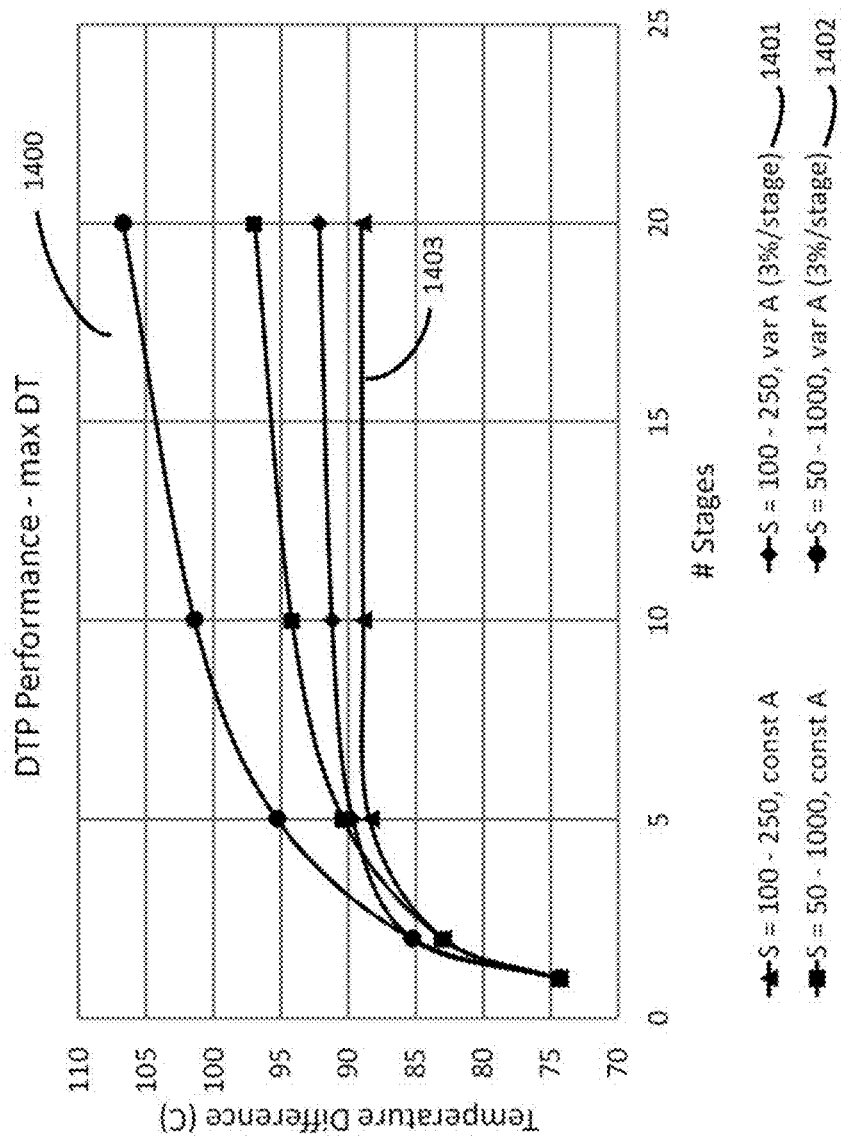
FIG. 14A is a plot illustrating maximum temperature difference as a function of the number of stages for example TE devices provided herein.

FIGS. 13A-13B compare previously described analytical results to those of the numerical study. FIG. 13A is a plot 1300 illustrating COP as a function of DT/Th (equivalently expressed as $\Delta T/T_H$) for example TE devices provided herein. FIG. 13A shows maximum COP 1303 possible at different ZT and different DT/Th ratios. More specifically, FIG. 13A compares analytical results to numerical results for maximum COP at different ZT and different $DT/T_H$ ratios. Curves and data points 1303 are shown for various ZT for analytic 1301 and numerical 1302. The numerical results 1302 line up well with the predicted analytical results 1301. More specifically, FIG. 13A shows how the numerical results line up well with the predicted analytical results for all ZT analyzed and over a wide range of DT/Th.

FIG. 13B is a plot 1330 illustrating Seebeck coefficient ratios as a function of DT/Th for example TE devices provided herein. FIG. 13B plots the ratio of hot-side Seebeck coefficient to cold-side Seebeck coefficient at different ZT and different DT/Th ratios. More specifically, FIG. 13B compares analytical results 1331 to numerical results 1332 for hot to cold side Seebeck coefficient ratio at maximum COP at different ZT and different $DT/T_H$ ratios. Curves and data points 1334 are shown for ZT=0.5, ZT=1, and ZT=2. FIG. 13B shows how the numerical results 1332 match those predicted analytically 1331 overall all ZT analyzed and over a wide range of DT/Th. This shows that the numerical model predicts the same Seebeck coefficient distribution in the TE leg that the analytical model predicts. These results provide confidence between the analytical and numerical model.

Figure 14B:
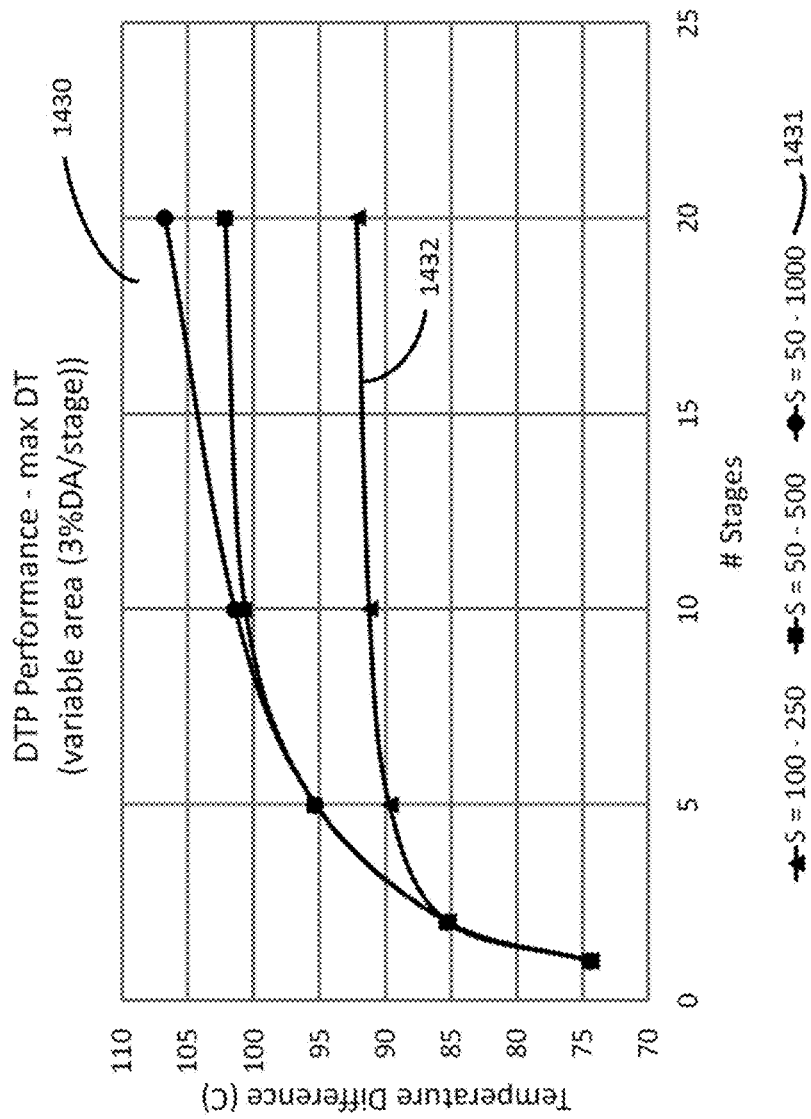
FIG. 14B is a plot illustrating maximum temperature difference as a function of the number of stages for example TE devices provided herein.

To study the complete impact of distributed transport properties, it is important to study the effect of the range of Seebeck and the corresponding λ and ρ coefficient. FIG. 14A is a plot 1400 illustrating maximum temperature difference 1403 as a function of the number of stages for example TE devices provided herein. FIG. 14B is a plot 1430 illustrating maximum temperature difference 1432 as a function of the number of stages for example TE devices provided herein. More specifically, FIG. 14A compares the temperature difference achievable 1403 with the Seebeck coefficient varying over a narrower range 1401 and broader range 1402 and with and without variable area. FIG. 14A highlights how expanding the Seebeck coefficient range and allowing for variable leg area and then combining the two effects may improve maximum temperature difference. At two DTP stages, having variable area has a stronger affect than increasing the Seebeck range. However, at five DTP stages and beyond, the increase in Seebeck coefficient range provides more improvement than the variable area alone. It can also be seen from FIG. 14A that at 20 DTP stages one can increase maximum temperature from 89 C to 107 C by both increasing the Seebeck range and allowing variable leg area, e.g., by comparing trace 1401 to trace 1402.

FIG. 14B, graph 1430, shows the performance of DTP systems 1432 as a function of ranges of Seebeck coefficient 1431. More specifically, FIG. 14B, Graphs at 1430 shows maximum temperature difference for a leg with variable area (3% DA/stage) and a Seebeck coefficient range 1431 from S=50-500 microV/K compared to that with a range from S=100-250 microV/K and a range from 50-1000 microV/K, all based on the number of DTP stages. As used herein, 3% DA per stage means the maximum allowable change in area per stage, or change in area. The wider range for Seebeck coefficient allows the maximum temperature difference to continue to increase beyond ten stages. Most of the increase for S=100-250 μV/K occurs in the first two DTP stages. For S=50-500 μV/K, maximum temperature difference increase slows after 10 DTP stages. For S=100-250 μV/K, maximum DT>90 C is achieved with #stages >5. For S=50-500 μV/K, maximum DT>100 C is achieved with number of stages >10. For S=50-1000 μV/K, maximum DT>105 C is achieved with number of stages >20.

Figure 15:
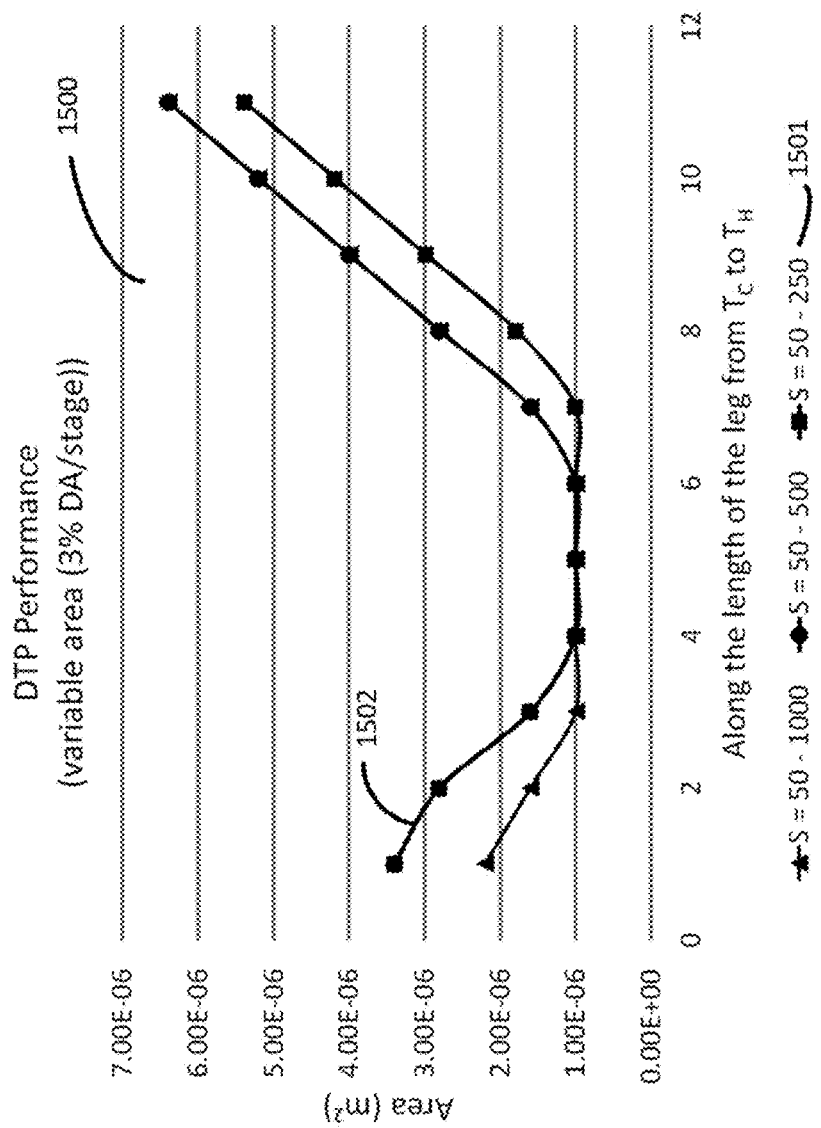
FIG. 15 is a plot illustrating cross-sectional area as a function of position along the TE leg length from $T_C$ to $T_H$ for example TE devices provided herein.
Figure 16:
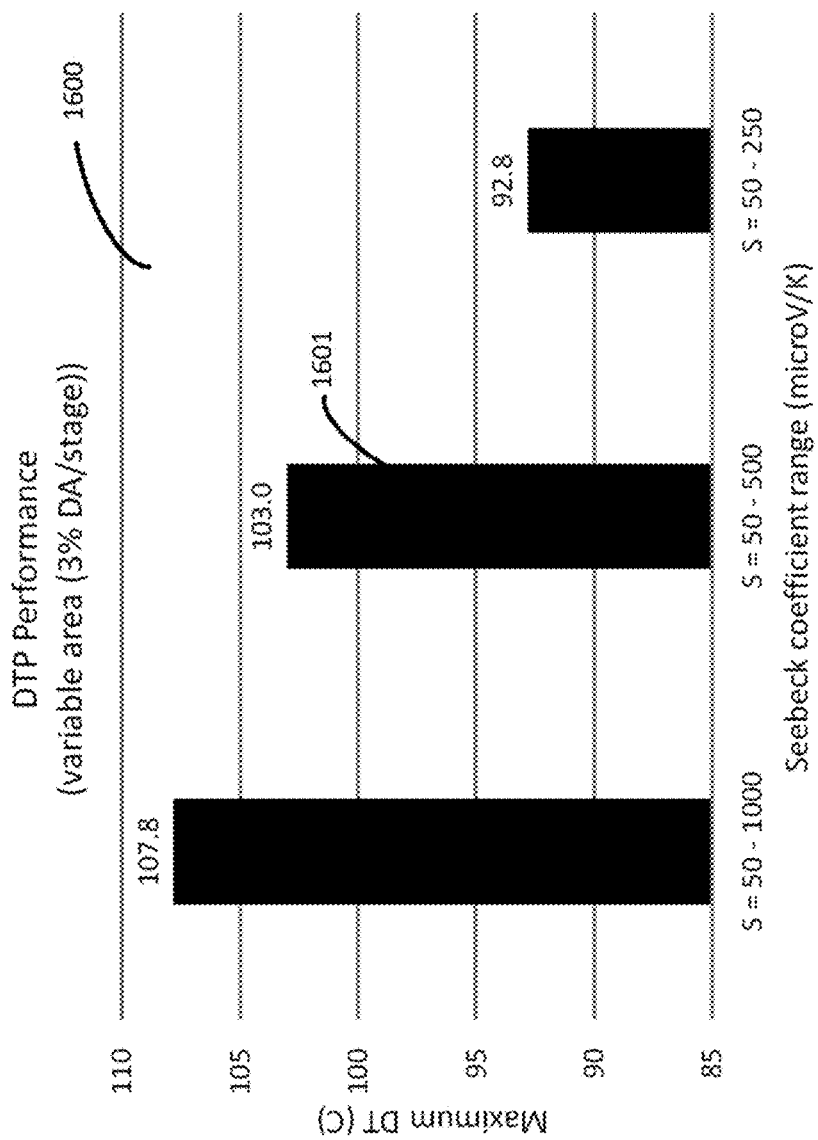
FIG. 16 is a plot illustrating maximum ΔT for different ranges of Seebeck coefficients of example TE devices provided herein.

FIG. 15 is a plot 1500 illustrating an example of cross-sectional area 1502 as a function of position for TE devices provided herein. FIG. 16 is a plot 1600 illustrating, for example, maximum DT 1601 for different ranges of Seebeck coefficients of TE devices provided herein. For example, FIG. 16 shows further evidence of the effect of expanded Seebeck coefficient range when combined with variable area. FIG. 15 shows the associated leg area profiles for these legs 1501. In this example, all of them have approximately hourglass shapes similar to those shown in FIGS. 3A-3B.

More specifically, FIG. 15 depicts Graph 1500 which shows the optimum area profiles for ranges of S 1501 (and the corresponding λ and ρ) and variable area. FIG. 16, Graph 1600, depicts the achievable DTP temperature differential (DT) for the designs depicted in FIG. 15. FIG. 16 shows how the range of Seebeck coefficient affects the maximum temperature difference that can be achieved with variable area (3% DA/stage) with Seebeck coefficient ranges (S=50-250 μV/K, S=50-500 μV/K, and S=50-1000 μV/K). It shows further evidence of the effect of expanded Seebeck coefficient range when combined with variable area and the corresponding λ and ρ. It is showing similar results to those from FIG. 14B at 20 DTP stages. Results are shown for configurations where leg cross-sectional area is allowed to vary by 3%/stage.

With the performance comparison complete between the analytical and numerical solutions using temperature independent material properties with constant ZT, the analyses continue using real, temperature dependent material properties for $Bi_2Te_3$, which equivalently may be referred to herein as BiTe or as bismuth telluride.

Figure 17:
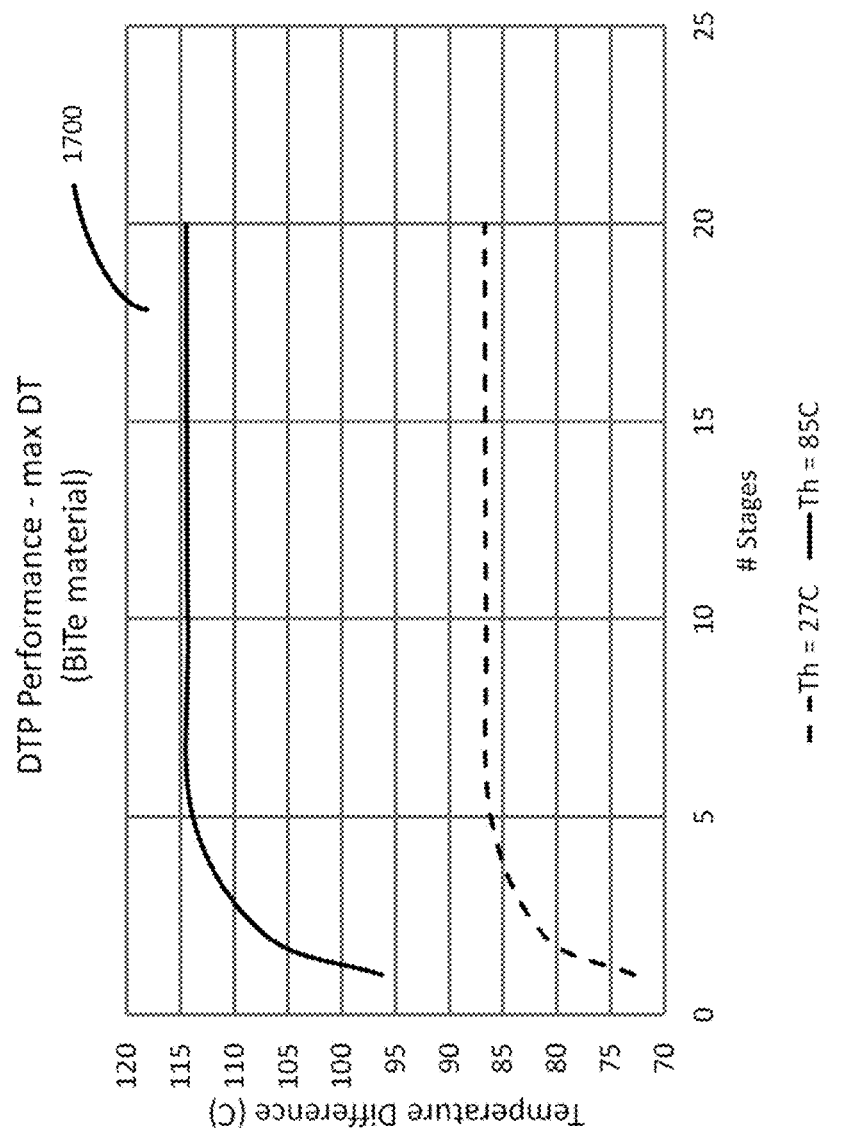
FIG. 17 is a plot illustrating maximum ΔT for different numbers of stages of example TE devices provided herein.

FIG. 17 is a plot 1700 illustrating maximum DT for different numbers of stages of example TE devices provided herein. More specifically, FIG. 17 shows the maximum temperature differences achieved at different hot-side temperatures Th=27 C and Th=85 C. The single stage maximum temperature differences of 73 C and 96 C respectively are within 5% of those previously reported for standard, commercially available thermoelectric cooling modules at URL www.marlow.com/products/thermoelectric-coolers/multi-stage. This result helps to validate the model against real performance data. FIG. 17 shows ~30% improvement in maximum temperature difference achieved for both hot-side temperatures at 20 DTP stages. The most significant improvement occurs within the first five stages, but improvement does continue beyond that point. DT>85 C is achieved at greater than 5 DTP stages at Th=27 C. DT>110 C is achieved at greater than 3 DTP stages at Th=85 C.

The present study looks beyond using distributed transport properties in a thermoelectric material of constant cross-sectional area. The analyses continues by looking at the effect of having a variable area along the length of the thermoelectric leg combined with distributed transport properties and what the optimal shape of the TE leg would be.

Figure 18:
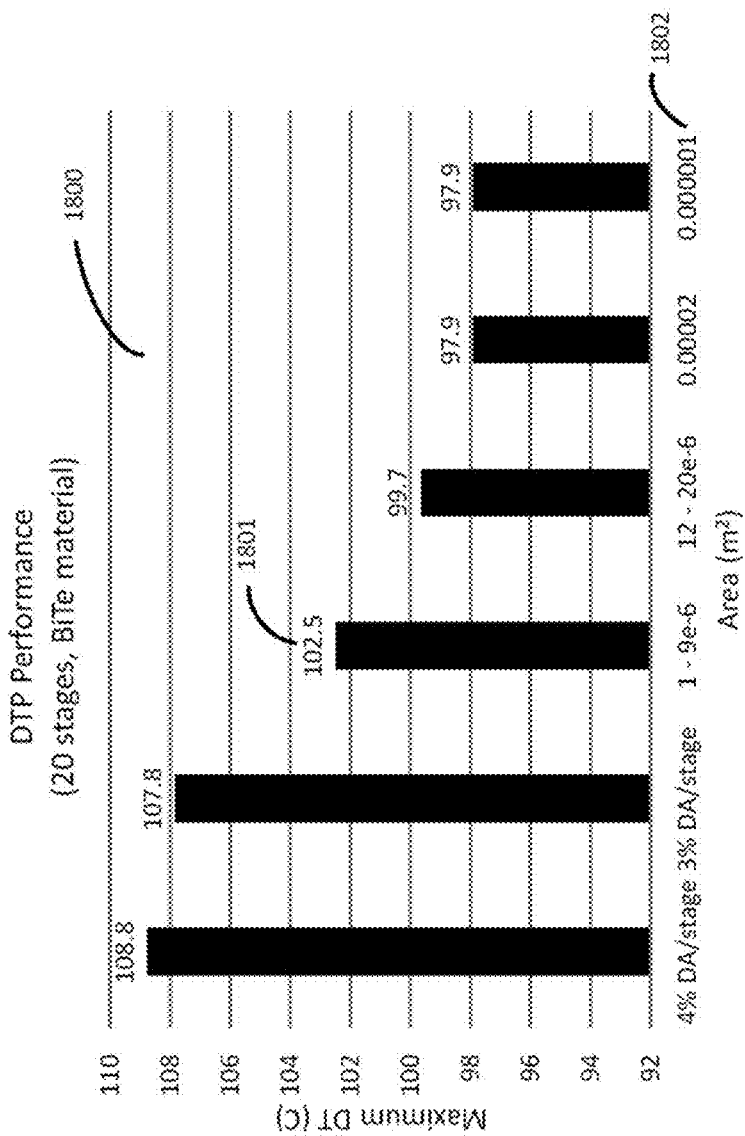
FIG. 18 is a plot illustrating maximum ΔT for different area profiles of example TE devices provided herein.

FIG. 18 is a plot 1800 illustrating maximum DT for different area profiles of example TE devices provided herein. FIGS. 19A-19C are plots respectively illustrating cross-sectional areas, Seebeck coefficients, and figures of merit (ZT) as a function of position along the TE leg length for example TE devices provided herein. FIGS. 18 and 19A show how leg cross-sectional area variation can affect the maximum temperature difference. For example, FIG. 18, Graph 1800, shows the maximum DT 1801 for configurations 1802 of variable area profile along the TE element length and various interfacial properties. FIG. 18 shows differences in maximum temperature difference DT 1801 by changing the TE leg area profile 1802 along its length. Simulations were conducted for devices with small (1e-6 m$^2$) and large (2e-5 m$^2$) constant cross-sectional area as well as for areas that vary along the length of the leg with a constant slope and variable area that was allowed to change at a rate of 3% and 4% per stage. The results show that the best performance occurs when the area is allowed to vary the most (4%/stage) without further constraint. The shape of the area profile, which is depicted in the graph shown in FIG. 19A, in this instance is hourglass shaped with a larger area at both the hot and cold ends and a smaller area in the middle of the leg. When the area profile is more conical with the largest area at the hot end and the smallest area at the cold end, maximum temperature difference drops by 5-9 C. Temperature drops another 2-5 C when the area is held constant. Maximum temperature difference is equivalent for the small and large area legs.

Plot 1900 of FIG. 19A shows the associated optimal leg area profiles 1901 along the length of the TE leg for FIG. 18. Constant area legs are depicted as flat lines along the length of the leg from $T_C$ to $T_H$. Conical area legs have increasing area and a positive slope along the length of the leg from $T_C$ to $T_H$. Variable area legs have a decreasing slope near $T_C$ and an increasing slope near $T_H$, thus causing an hourglass shape to the leg along its length.

FIG. 19B, graph 1930, shows associated optimal Seebeck coefficient profiles along the length of the TE leg for the configurations from FIG. 19A. FIG. 19C, Graph 1960, shows associated optimal ZT profiles along the length of the TE leg for the configurations from FIG. 19A. Respective plots 1930 and 1960 of FIGS. 19B and 19C show the associated curves for Seebeck and the corresponding λ and ρ coefficient 1931 and ZTavg 1961 along the length of the leg for the cases shown in FIGS. 18 and 19A. FIG. 19B shows the Seebeck coefficient profiles for the configurations shown in FIG. 18. The curves are similar for each case, showing a sharp increase in value close to the hot end. FIG. 19C shows the ZT profiles for the configurations shown in FIG. 18. It is interesting to note that the legs with the highest average ZT do not necessarily have the highest maximum temperature difference as can also be seen in FIG. 19C. The two variable area legs (4% DA/stage and 3% DA/stage) despite achieving the highest maximum DT as shown in FIG. 18 have the lowest average ZT.

Figure 20A:
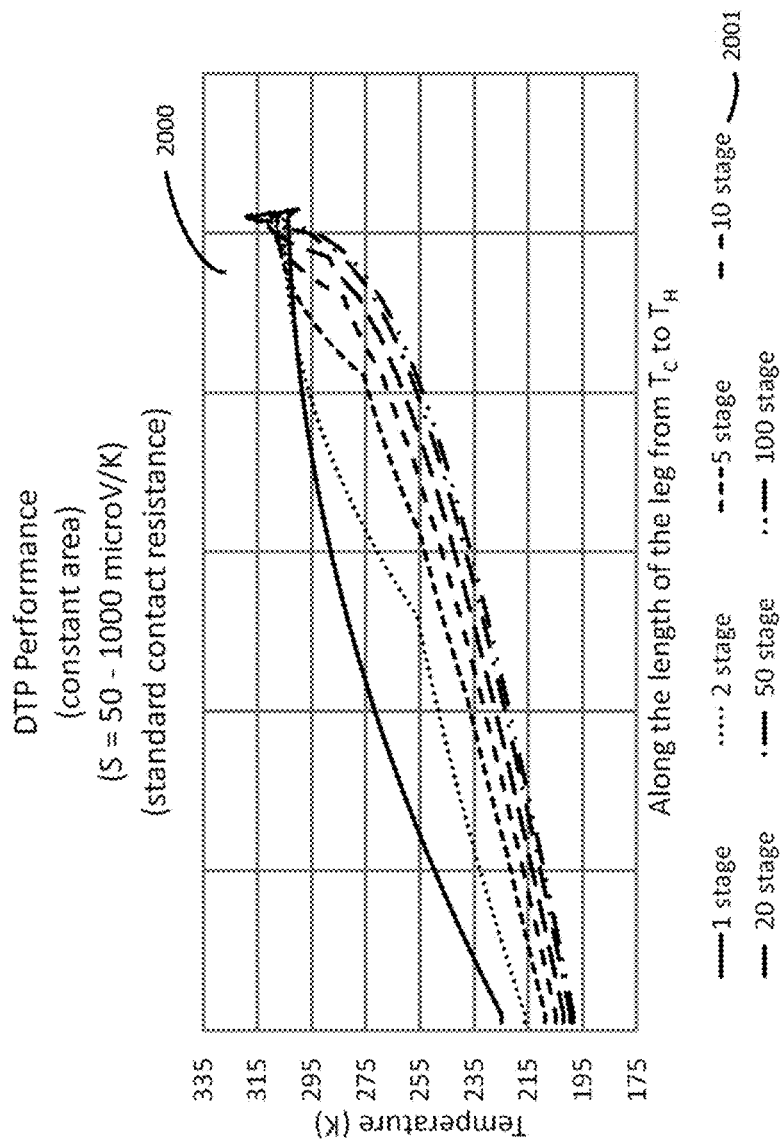
FIGS. 20A-20B are plots respectively illustrating temperature profiles as a function of position along the TE leg length from $T_C$ to $T_H$ for example TE devices provided herein.
Figure 20B:
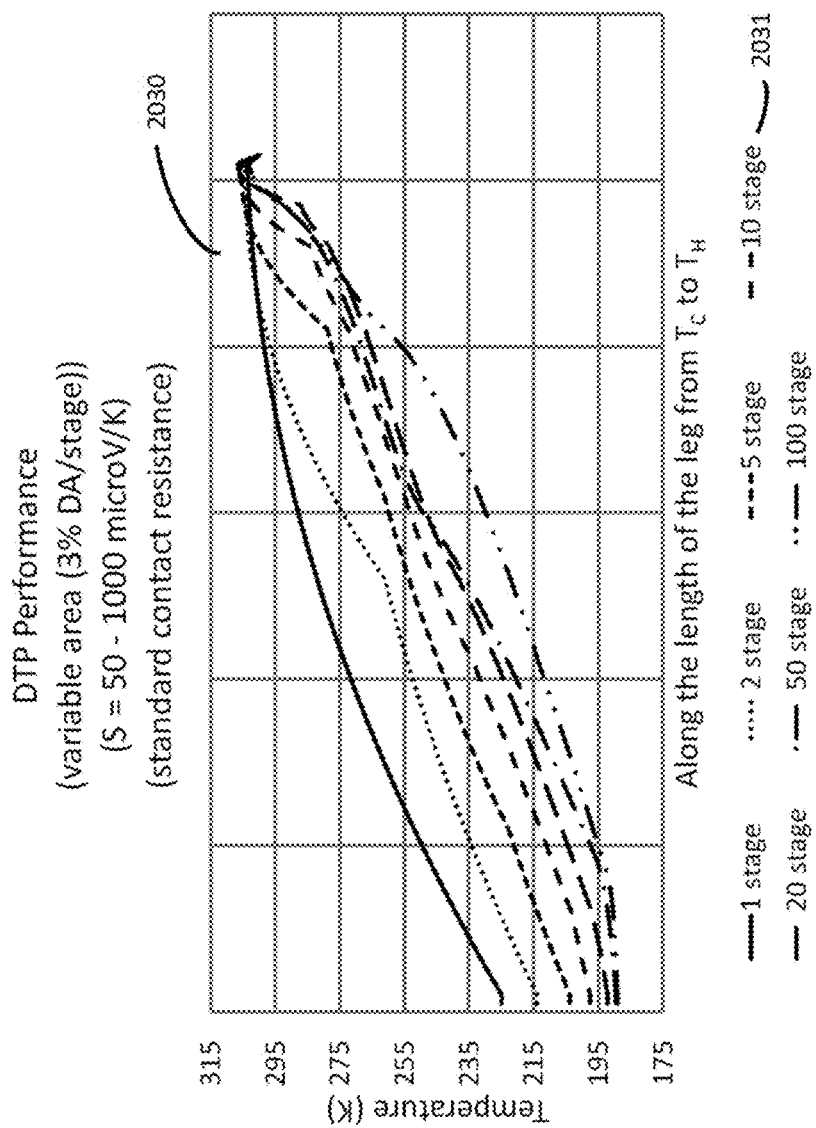

FIGS. 20A-20B are plots 2000, 2030 respectively illustrating temperature profiles as a function of position along the TE leg length from $T_C$ to Th for example TE devices provided herein. FIG. 20A, graph 2000, shows temperature profiles along the length of the leg from $T_C$ to $T_H$ for DTP stage devices 2001 and 2031 with standard contact resistance. FIG. 20A shows the profiles with standard contact resistances with constant area. FIG. 20B shows the profiles with standard contact resistance with variable area at 3% DA/stage. More specifically, the temperature profiles 2001, 2031 for 1, 2, 5, 10, 20, 50, and 100 DTP stage devices are shown in FIGS. 20A-20B, with standard contact resistances. In FIG. 20A and FIG. 20B, contact resistance causes a spike in temperature at the hot end interface. There is little evidence of the contact resistance at the cold end because heat flow is at or near zero at this end while it is at its maximum at the hot end. It is interesting to note how the number of DTP stages and the variable area changes the shape of the temperature profiles. The curves become increasingly concave as the number of DTP stages increases. This is the case for both constant and variable area. The curves are convex when no DTP stages are present.

Figure 21A:
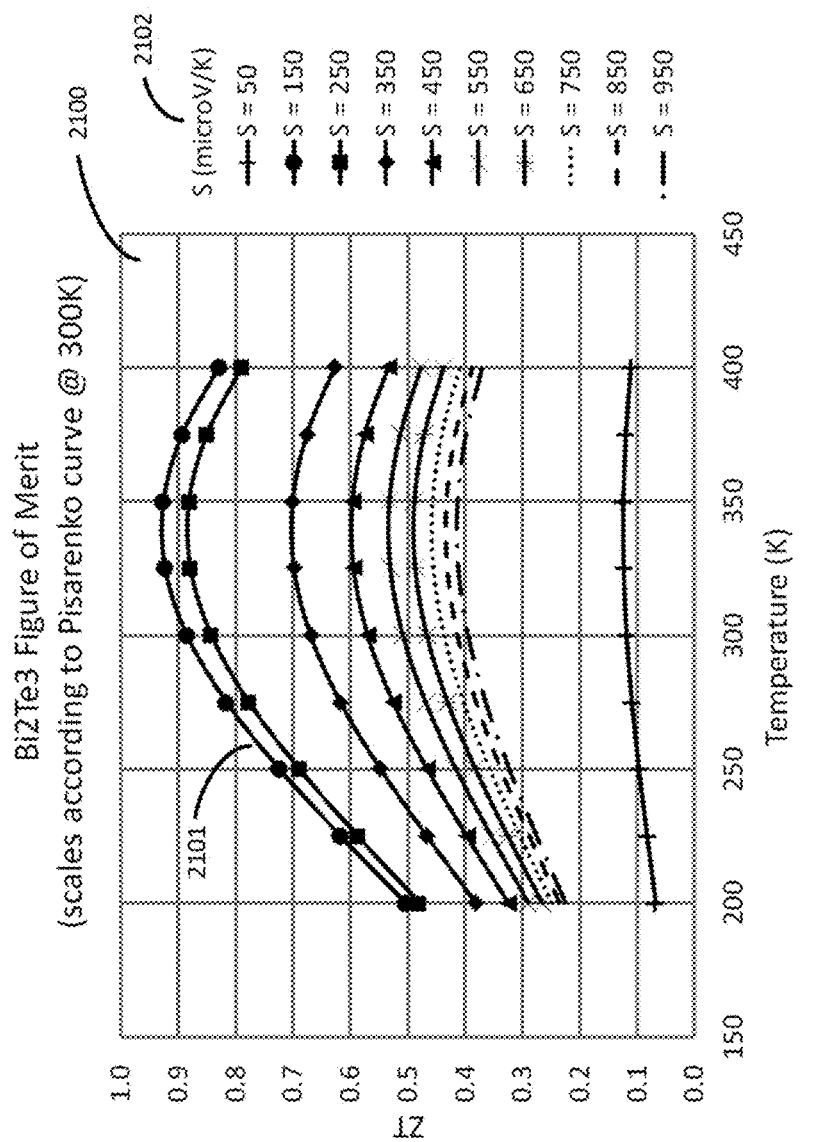
FIGS. 21A-21B are plots illustrating ZT as a function of temperature at different Seebeck coefficient values for example TE devices provided herein.
Figure 21B:
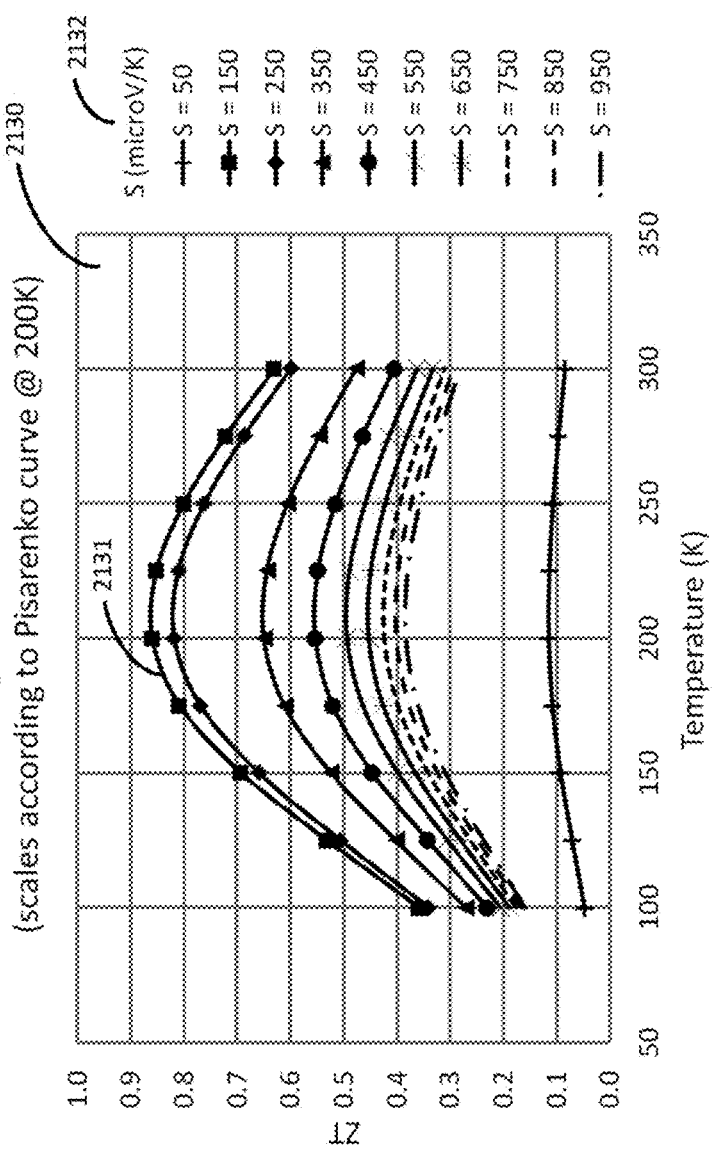

FIGS. 21A-21B are plots 2100, 2130 illustrating ZT as a function of temperature for example TE devices provided herein. More specifically, FIG. 21A, graph 2100, shows figure of merit (ZT) as a function of temperature and Seebeck and the corresponding λ and ρ coefficient at 300K for $Bi_2Te_3$. The individual curves 2101 are based on the Pisarenko relation at 300K for $Bi_2Te_3$ at various Seebeck and the corresponding λ and ρ coefficients 2102. FIG. 21B, graph 2130, shows figure of merit (ZT) as a function of temperature and Seebeck and the corresponding λ and ρ coefficient at 200K for $CsBi_4Te_6$. FIGS. 21A-21B respectively show graphs for ZT as a function of temperature for both $Bi_2Te_3$ and the combination of $CsBi_4Te_6$ and thermomagnetic $Bi_{0.88}Sb_{0.12}$. The individual curves on each of the graphs in FIGS. 21A-21B respectively are based on how the transport properties change along the Pisarenko relation at 300K for $Bi_2Te_3$ and 200K for $CsBi_4Te_6/Bi_{0.88}Sb_{0.12}$ based on Seebeck and the corresponding λ and ρ coefficient. In FIG. 21A, the graph shows how the Pisarenko relation constrains the relationship between S 2102, rho, and lambda. The Pisarenko relationship for $Bi_2Te_3$ was extrapolated to both $CsBi_4Te_6$ and thermo-magnetic $Bi_{0.88}Sb_{0.12}$ for S 2132 in FIG. 21B. FIGS. 21A-21B assume an equivalent average between p- and n-type materials. In FIG. 21A, lowest ZT occurs when S=50 µV/K while highest ZT, with a peak ZT >0.9, occurs when S=150 µV/K. With S >150 µV/K, ZT decreases with increasing S. Peak ZT for all S occurs between 300K and 350K.

Figure 22:
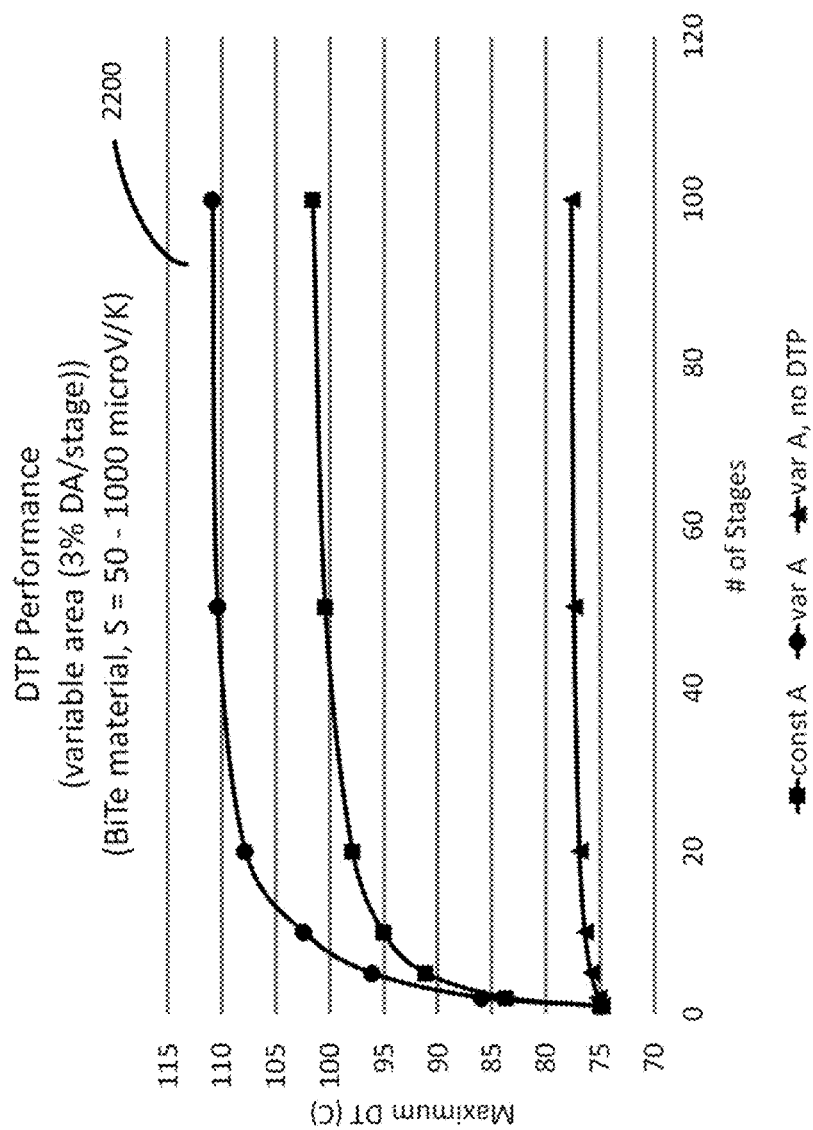
FIG. 22 is a plot illustrating maximum ΔT for various example TE devices provided herein.

FIG. 22 is a plot 2200 illustrating maximum DT for various example TE devices provided herein. FIG. 22, graph 2200, shows maximum temperature difference for constant area, variable area, and variable area with no DTP as a function of the number of DTP stages. For example, FIG. 22 compares the maximum temperature difference that can be achieved with up to 100 DTP stages. FIG. 22 shows that an additional 10% or 10 C improvement can be achieved by using variable area legs over constant area legs. It also can be seen that small improvement in performance (~5 C) is still achieved past twenty DTP stages. When variable area is used without DTP, maximum temperature difference can be improved by only a few degrees.

Figure 23:
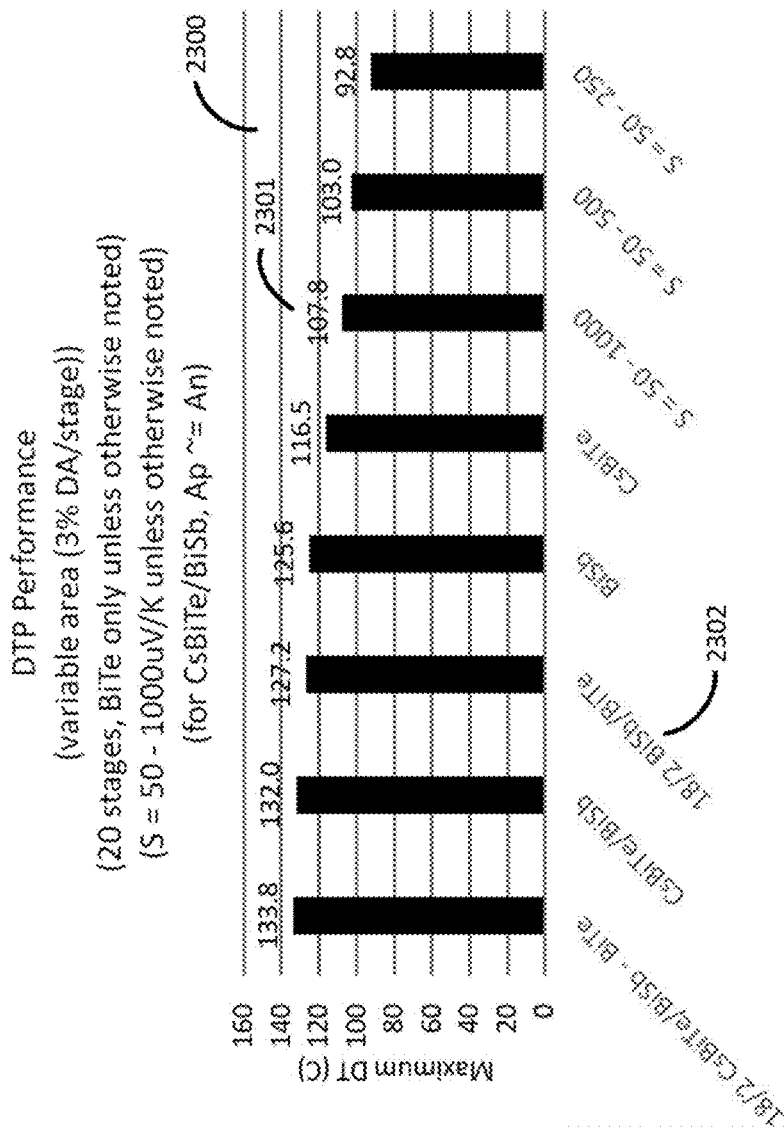
FIG. 23 is a plot illustrating maximum ΔT for various example TE devices provided herein.

FIG. 23 is a plot 2300 illustrating maximum DT for various example TE devices provided herein. FIG. 23, Graph 2300, depicts the maximum DT 2301 for various TE material and Seebeck combinations 2302. More specifically, FIG. 23 shows maximum temperature difference 2301 achieved for single-stage devices with different thermoelectric materials 2302, including segmented legs, and different Seebeck and corresponding $\lambda$ and $\rho$ coefficient ranges. To maximize the temperature difference achievable in a single-stage thermoelectric device, the effects of segmentation with alternative low-temperature materials, including $CsBi_4Te_6$ (P type) and magnetically enhanced BiSb (also referred to herein as Bi0.88Sb0.12, thermomagnetic Bi0.88Sb0.12, or the like) (N type) were also studied. FIG. 23 adds additional configurations to those shown in FIGS. 15-16, including configurations with materials that have higher ZT at low temperatures (including those that are magnetically enhanced) as well as segmented leg devices. FIG. 23 shows that using these alternative low temperature materials in combination with each other and using DTP with variable area in a single-stage device allows for a maximum temperature difference greater than 130 C. This now competes with the maximum temperature difference for standard four-stage cascaded devices. The waterfall chart shown demonstrates how different configurations affect maximum temperature difference, starting with increased Seebeck and the corresponding $\lambda$ and $\rho$ range, which can add up to 15 C. Using $CsBi_4Te_6$ and then magnetically enhanced BiSb, which have excellent low-temperature (<<20 C) performance, further increases max DT. Optimally segmenting these low temperature materials with $Bi_2Te_3$ then enables the max DT>130 C.

Figure 24:
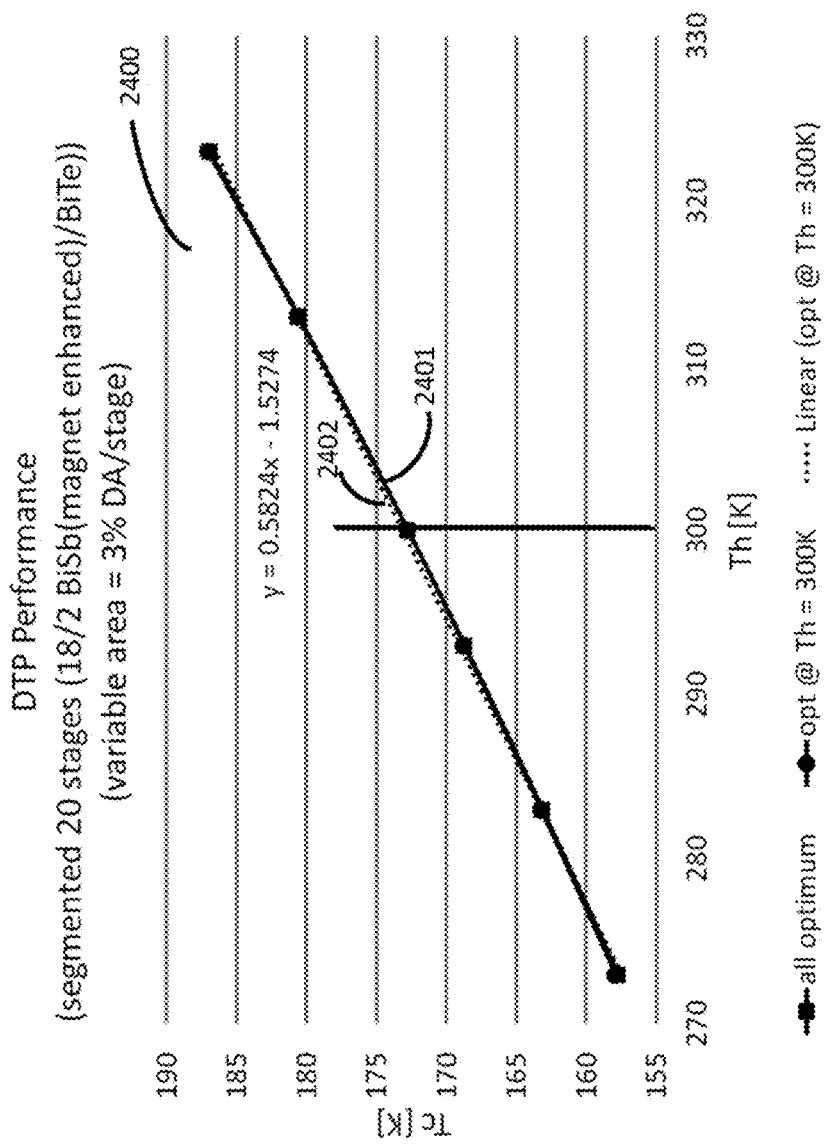
FIG. 24 is a plot illustrating hot side temperature for minimum cold side temperature for DTP TE devices provided herein.

FIG. 24 is a plot 2400 illustrating the hot side temperature for minimum cold side temperature for a segmented device with 20 DTP stages. FIG. 24 shows the curve of $T_H$ vs. To for a particular TE leg configuration assuming each condition is optimized independently 2401 as well as the case when the configuration is optimized for one condition and then run at additional off-nominal conditions 2402. Performance is identical for both situations.

Figure 25A:
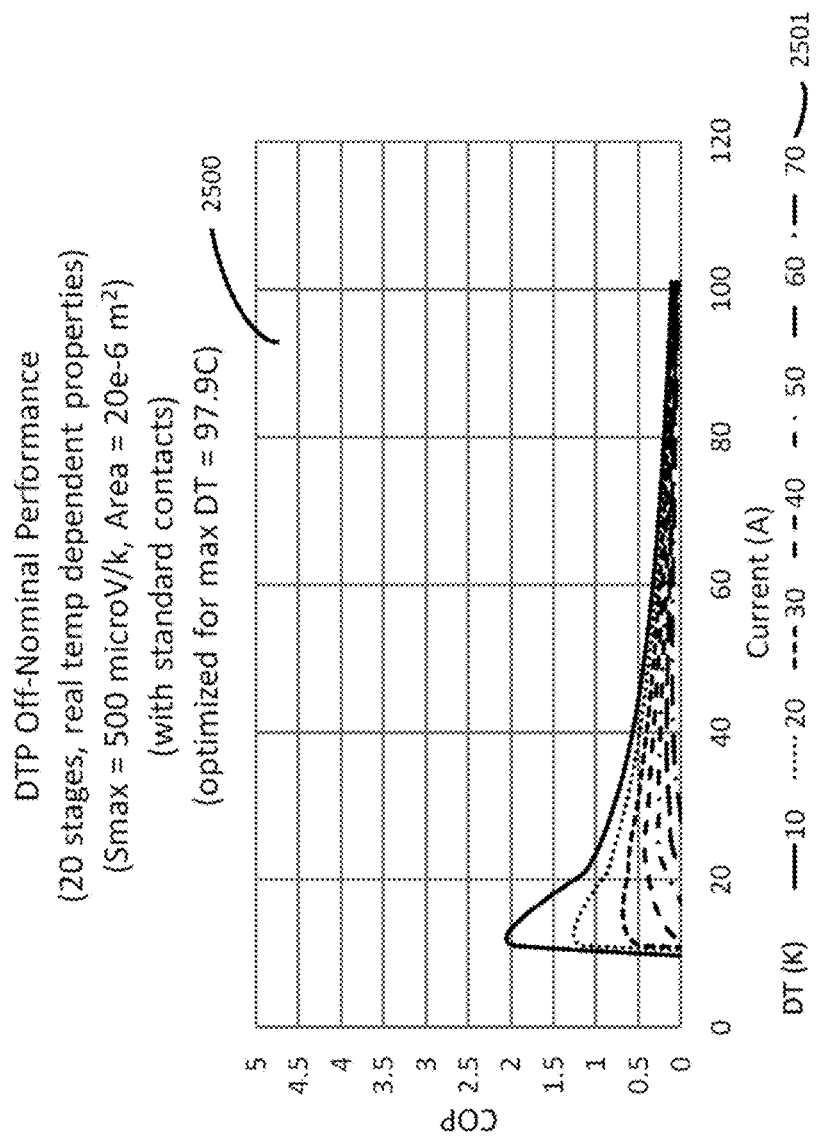
FIGS. 25A-25B are plots illustrating COP for example TE devices provided herein.
Figure 25B:
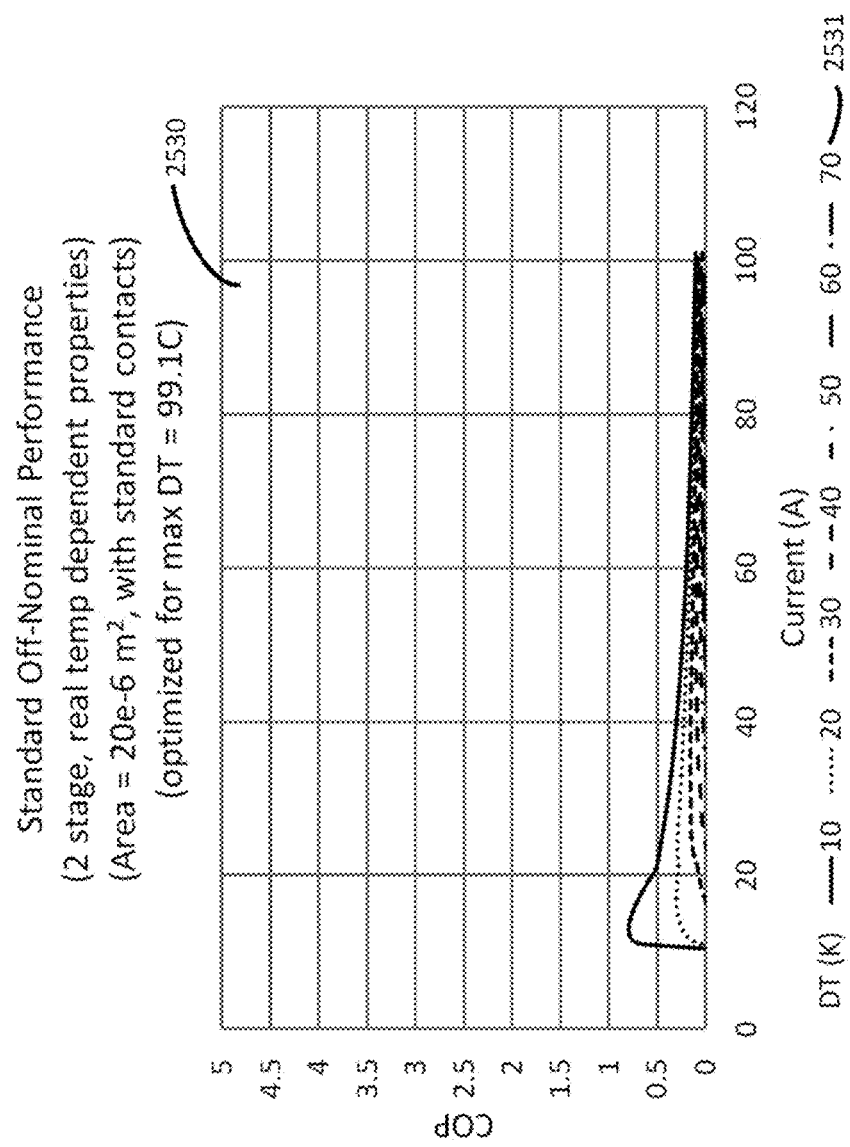

FIGS. 25A-25B are plots 2500, 2530 illustrating COP for example TE devices provided herein. FIG. 25A shows a graph for single-stage devices with 20 DTP stages. FIG. 25A, graph 2500, shows coefficient of performance as a function of current for a DTP device with 20 stages and standard contact resistances at different currents (I=0-100 A) for a range of temperature differences 2501 from 10 C to 70 C. Here, contact resistances play a more minimal role as compared to their effect on performance for two-stage devices. In FIG. 25A, the maximum temperature difference for a single-stage, 20 DTP stage device with contact resistances is 97.9 C, comparable to the 98.9 C maximum temperature difference for the two-stage cascaded device. However, peak COPs for these devices for all temperature ranges are roughly twice those of the two-stage cascaded devices. They are slightly lower, but in the same range as the peak COPs for the single-stage standard devices. For a DT=10 C, max COP is achieved at >2 while at DT=20 C, max COP >=1.25. At I >20 A for all DT>=10 C, COP <=1. The results shown in FIG. 25A are similar to those shown in FIG. 9, which describe how DTP increases the cooling range to higher currents and power levels as well as to higher cooling capacity for off-nominal conditions.

FIG. 25B shows similar graphs 2530 for two-stage cascaded devices FIG. 25B shows off-nominal coefficient of performance 2531 as a function of current for a two-stage standard device with standard contact resistances optimized for a maximum temperature difference of 99.1 C. FIG. 25B graphs curves for COP at different currents (I=0-100 A) for a range of temperature differences DT from 10 C to 70 C. For a DT=10 C, max COP is achieved of 0.8 while at DT=20 C, max COP=0.3. At I>20 A for all DT>=10 C, COP<=0.5.

Figure 26:
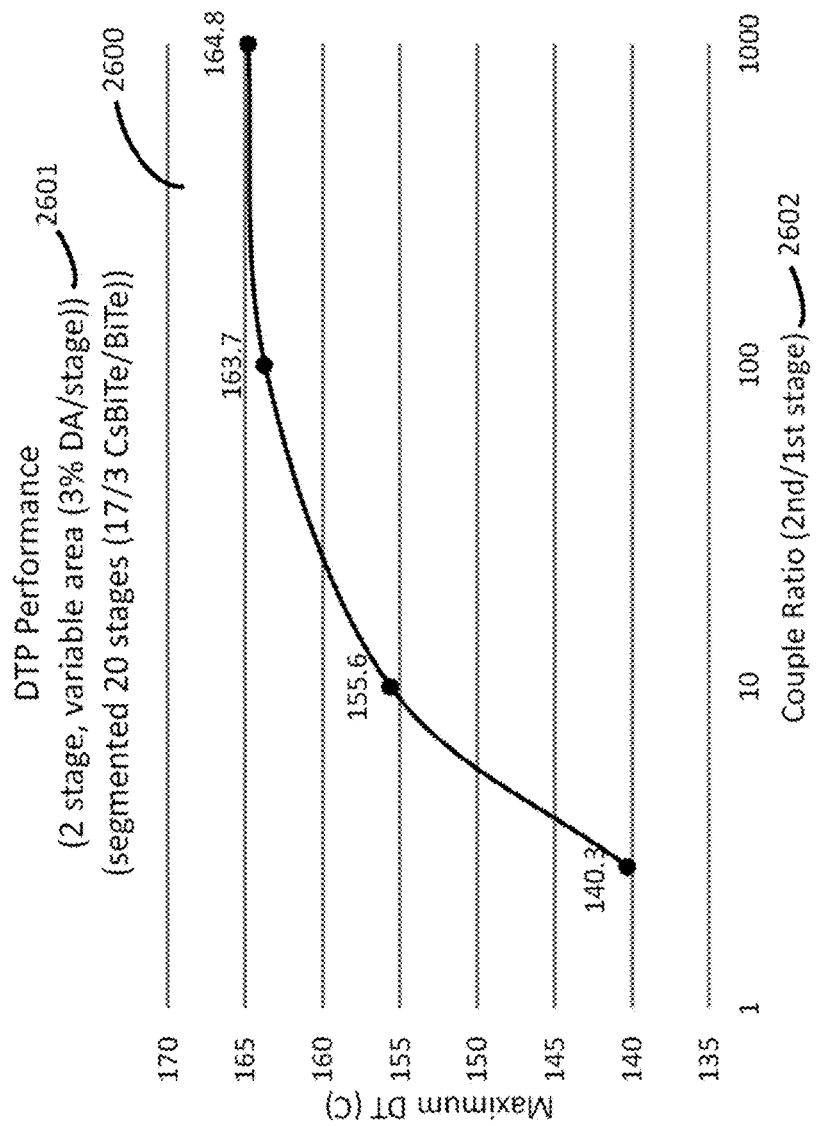
FIG. 26 is a plot illustrating maximum ΔT for example TE devices provided herein.

Furthering the analyses of materials with DTP, two-stage cascaded devices with DTP stages was also developed. FIG. 26 is a plot 2600 illustrating maximum $\Delta T$ for example TE devices provided herein. FIG. 26, graph 2600, shows performance of a 2 stage cascaded device using segmented DTP legs with variable area 2601. The ratio between the $2^{nd}$ and $1^{st}$ stages is denoted on the x-axis 2602. FIG. 26 shows that a maximum temperature difference >140 C is possible with a two-stage cascaded device with segmented legs using 20 stage DTP with variable area (30% DA/stage) 2601. Adjusting the ratio between the number of couples 2602 in the $1^{st}$ and $2^{nd}$ stage allows this value to be improved further to a maximum temperature difference >160 C. This analysis assumed perfect heat spreading between the stages. Since this level of heat spreading may be difficult to achieve, it is expected that the full level of performance modeled will be lower.

Figure 27:
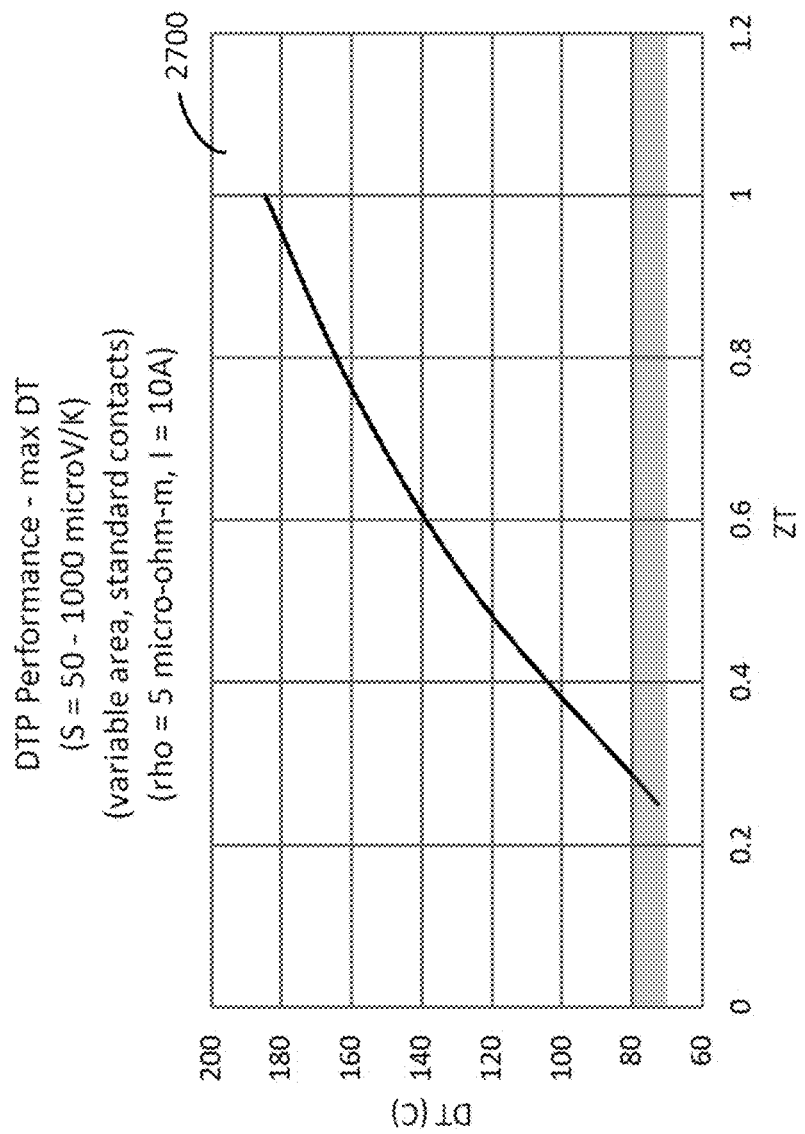
FIG. 27 is a plot illustrating maximum ΔT for example TE devices provided herein.

FIG. 27 is a plot illustrating maximum $\Delta T$ for example TE devices provided herein. FIG. 27, graph 2700, shows maximum temperature difference possible as a function of ZT with Seebeck coefficient range of 50-1000 microV/K. FIG. 27 shows how the use of distributed transport properties can boost maximum temperature difference even at lower ZTs. FIG. 27 shows that a material with a constant ZT=0.25 can have a maximum temperature difference of >70 C. This is similar to the maximum temperature difference for today's standard Bi2Te3 material and is achieved with a considerably lower average ZT.

Figure 28:
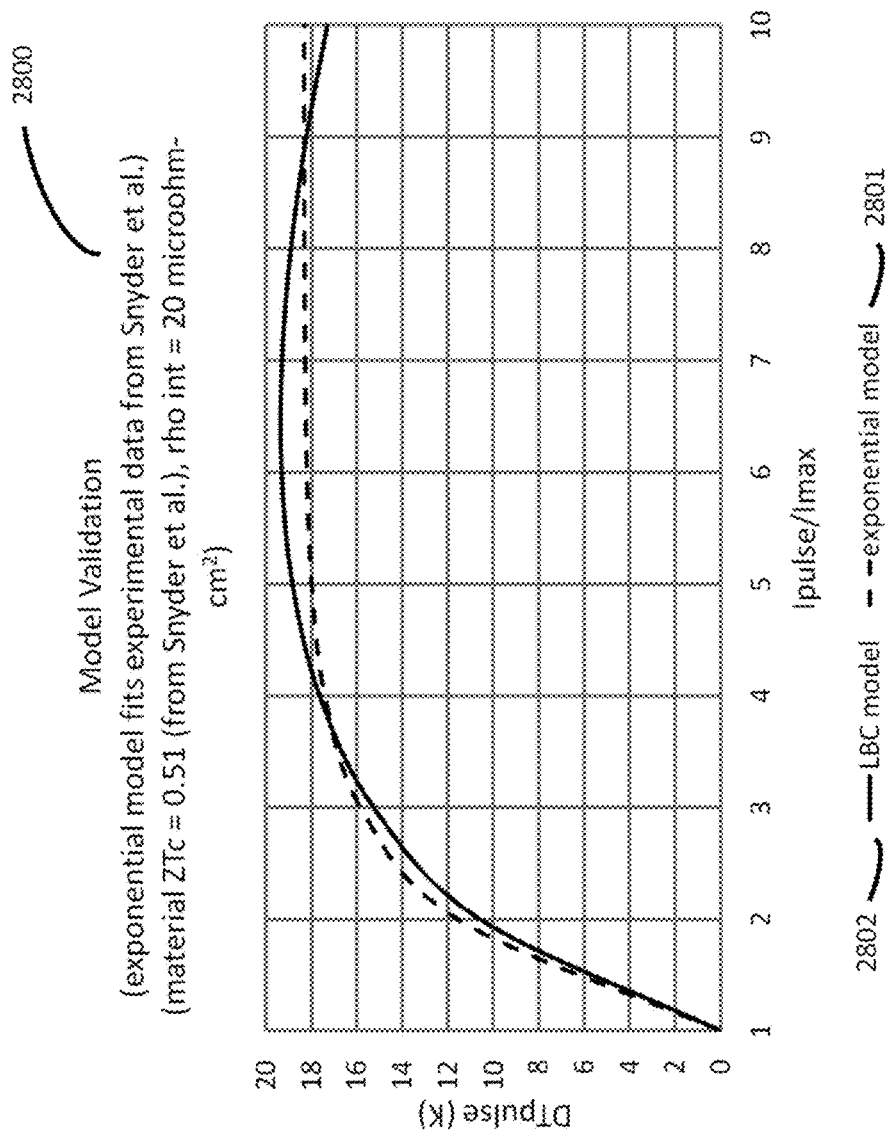
FIG. 28 is a plot illustrating transient responses of example TE devices provided herein.
Figure 29:
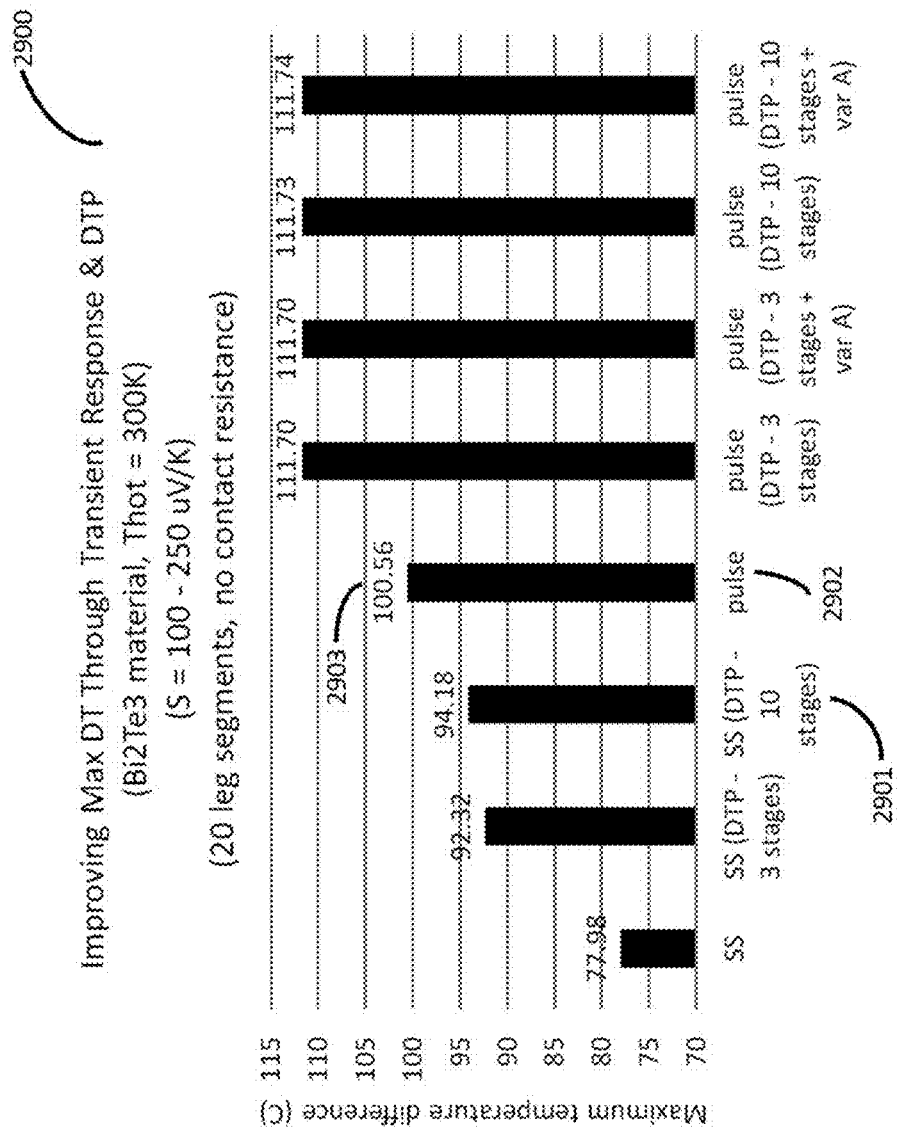
FIG. 29 is a plot illustrating maximum ΔT for example TE devices provided herein.

FIG. 28 is a plot 2800 illustrating transient responses 2801 of example TE devices provided herein, and FIG. 29 is a plot 2900 illustrating maximum $\Delta T$ for example TE devices provided herein. FIG. 28 and FIG. 29 shows how transient response can affect max DT using a similar method to that of Snyder et al. "Supercooling of Peltier cooler using a current pulse," Journal of Applied Physics 92:1564-1569 (2002), who used an exponential model. FIG. 28, graph 2800, shows transient response combined with DTP. Plotted results are from LBC current transient response model 2802 and an experimentally derived exponential model 2801 as described in Snyder et al. Exponential model is based on experimental data fit with no theoretical basis.

$$DTpulse=(DTmax/4)*(1-\exp(1-P)) \qquad [6]$$

Exponential model predicts plateauing DTpulse at P (Ipulse/Imax)>3. Snyder et al. states that "This may be due to experimental uncertainty when measuring these fast pulses, or simply due to the thermal diffusion time from the junction to the thermocouple." Other experimental studies do not test at P >3. When interfacial resistance is included at a reasonable value of 20 micro-ohm-cm^2, there is very good agreement between the numerical and exponential models, validating the numerical model.

In FIG. 29, these transient response results are similar to those of Zhou et al., "Pulsed cooling of inhomogeneous thermoelectric materials," Journal of Physics D: Applied Physics 40:4376-4381 (2007). FIG. 29 is a waterfall chart showing effects of transient response and DTP on maximum temperature difference. FIG. 29, graph 2900, shows maximum DT 2903 DTP combined with variable area 2901 and transient response 2902. Pulse can improve max DT up to 100 C compared to 78 C for steady-state with no contact resistance. Adding 3 DTP stages increases max DT to >110 C. Further increase in the number of DTP stages and variable area do not have any additional benefit for transient response.

Figure 30:
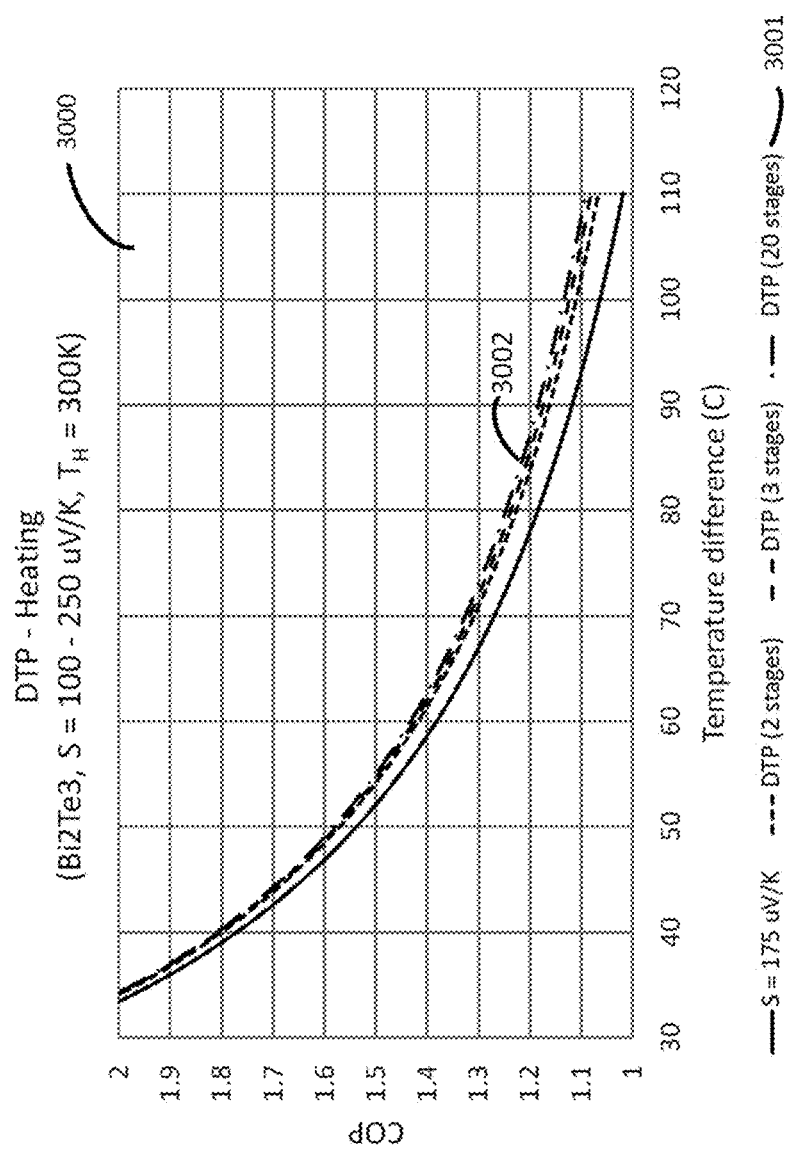
FIG. 30 is a plot illustrating COP for example TE devices provided herein.

FIG. 30 shows the effects of DTP on heating. FIG. 30, graph 3000, shows DTP temperature difference 3002 in a heat pumping application for several stage 3001 DTP systems. The largest improvement in COP is for 2 DTP stages with continued improvement with further stages but with diminishing returns. FIG. 30 shows that the improvement in COP becomes larger as the temperature difference gets closer to maximum. COP improvement due to DTP in heating by percentage is lower than it is for cooling.

The present disclosure and analysis provides higher performance in thermoelectric cooling, heating, and power generation without the need for improvement in material ZT A comprehensive numerical model has been built to study the effects of distributed transport properties using real, temperature dependent properties, guided by the Pisarenko relation, and additional parasitic losses combined with other enhancements, such as variable leg area, alternative TE materials, and segmentation. Multi-variable optimization was conducted to maximize COP, heat pumping, or temperature difference, establishing optimized temperature, Seebeck and the corresponding $\lambda$ and $\rho$, and area profiles. The model also enabled the ability to simulate off-nominal conditions after an optimal solution had been determined by fixing transport properties and leg areas and solving for temperature profiles at different currents. Key innovations introduced include the expansion of the Seebeck and the corresponding $\lambda$ and $\rho$ range and variable leg geometry. The combination of the two was shown to improve maximum temperature difference by >40% over the baseline single stage device based on real, temperature dependent properties. By combining DTP with variable leg geometry with alternative low temperature TE materials segmented with $Bi_2Te_3$, temperature differences >130 C can be achieved in a single stage device. This temperature difference is comparable to the temperature differences that can be achieved today with a four-stage cascaded device, which is more complex and expensive to build and has a much narrower temperature and current range of operation. This could enable many solid-state air conditioning applications where a wider range of operation with higher temperature differences and COPs is beneficial. When these segmented DTP legs are combined into an optimal two-stage cascade using an optimal couple ratio with improved heat spreading, temperature differences >160 C were shown to be possible. This level of temperature difference exceeds anything that can be done today even up to six cascade stages and can enable solid-state refrigeration and cryogenic cooling applications. The techniques described can not only increase the performance of current TE materials, they can be used to increase the performance of lower ZT and lower cost materials to provide the level of performance that is being achieved today. Achieving equal performance at a lower cost can further enable other cooling applications that are not considered cost effective today.

Accordingly, some embodiments herein provide a thermoelectric device in which at least one of an N-type TE material element and a P-type TE element includes, or consists essentially of, material that utilizes at least one of a spatially distributed Seebeck coefficient, electrical resistivity and thermal resistivity. Non-limiting examples of such embodiments are described with reference to FIGS. 1A-1C, 2A-2B, and 3A-3C.

Optionally, the at least one of an N-type TE material element and a P-type TE element includes, is comprised of, or consists essentially of, material with Seebeck coefficient range of 100-250 microV/K. Optionally, the at least one of an N-type TE material element and a P-type TE element includes, is comprised of, or consists essentially of, material with Seebeck coefficient range of 50-500 microV/K. Optionally, the at least one of an N-type TE material element and a P-type TE element includes, is comprised of, or consists essentially of, material with Seebeck coefficient range of 50-1000 microV/K.

Optionally, the at least one of an N-type TE material element and a P-type TE element includes, is comprised of, or consists essentially of, a thermoelectric leg that has a variable cross-sectional area in the direction of current flow.

Optionally, the thermoelectric material of the at least one of an N-type TE material element and a P-type TE element includes, is comprised of, or consists essentially of, BiTe. Optionally, the thermoelectric material of the at least one of an N-type TE material element and a P-type TE element includes, is comprised of, or consists essentially of, CsBiTe. Optionally, the thermoelectric material of the at least one of an N-type TE material element and a P-type TE element includes, is comprised of, or consists essentially of, thermo magnetic BiSb.

Optionally, the at least one of an N-type TE material element and a P-type TE element materials are segmented together. Optionally, the thermoelectric legs are included in a multi-stage cascaded device. Optionally, the multi-stage cascaded device includes improved heat spreading between stages. Optionally, the multi-stage cascaded device has an optimal couple ratio. Optionally, at least one of the TE element-electrode interface has a surface textured to reduce interfacial resistance.

In some configurations, the device is used to cool. In some configurations, the device is used to heat. In some configurations, the device is used to convert thermal power into electrical power.

Optionally, the at least one of an N-type TE material element and a P-type TE element includes, is comprised of, or consists essentially of, organic thermoelectric material. Optionally, the at least one of an N-type TE material element and a P-type TE element includes, is comprised of, or consists essentially of, metallic thermoelectric material.

The device may be used in solid-state refrigeration applications. The device may be used in cryogenic cooling applications. The device may be used in solid-state fluid conditioning applications. The device may be used in solid-state fluid heating applications.

In some embodiments, a thermoelectric element has a length and a cross-sectional area and includes a p-type or n-type material. The intrinsic Seebeck coefficient of the p-type or n-type material varies monotonically along the length of the thermoelectric element, and the intrinsic Seebeck coefficient at a first location along the length is at least 2.5 times the intrinsic Seebeck coefficient at a second location along the length. Nonlimiting embodiments of such thermoelectric elements are described, for example, with reference to FIGS. 1A-1C, 2A-2B, and 3A-3B.

Optionally, the electrical resistivity of the p-type or n-type material varies along the length of the thermoelectric element. Optionally, the electrical resistivity of the p-type or n-type material varies monotonically along the length of the thermoelectric element.

The thermoelectric element of any one of the preceding claims, wherein the thermal conductivity of the p-type or n-type material varies along the length of the thermoelectric element.

The thermoelectric element of any one of the preceding claims, wherein the thermal conductivity of the p-type or n-type material varies monotonically along the length of the thermoelectric element.

Optionally, the intrinsic Seebeck coefficient at the first location is 250 µV/K. Optionally, the intrinsic Seebeck coefficient at the first location is 500 µV/K. Optionally, the intrinsic Seebeck coefficient at the first location is 1000 µV/K. Optionally, the intrinsic Seebeck coefficient at the second location is 100 µV/K. Optionally, the intrinsic Seebeck coefficient at the second location is 50 µV/K.

Optionally, the cross-sectional area varies along the length. Optionally, the cross-sectional area varies monotonically along the length. Optionally, the cross-sectional area decreases and then increases along the length. Optionally, the cross-sectional area has an hourglass type shape along the length. Optionally, the cross-sectional area varies smoothly along the length. Optionally, the cross-sectional area includes a discontinuity along the length.

Optionally, a composition of the p-type or n-type material varies along the length. Optionally, a doping of the p-type or n-type material varies along the length. Optionally, a crystal structure of the p-type or n-type material varies along the length. Optionally, a porosity of the p-type or n-type material varies along the length.

Optionally, the p-type or n-type material includes a first segment and a second segment. Optionally, the second segment includes a different elemental composition than the first segment. Optionally, the second segment includes a different doping level than the first segment. Optionally, the second segment includes a different crystal structure than the first segment. Optionally, the second segment includes a different porosity than the first segment.

Optionally, the intrinsic Seebeck coefficient includes at least one discontinuity along the length. Optionally, the intrinsic Seebeck coefficient varies smoothly along the length. Optionally, the intrinsic Seebeck coefficient varies approximately linearly along the length. Optionally, the intrinsic Seebeck coefficient varies approximately exponentially along the length.

Optionally, the p-type or n-type material includes bismuth telluride. Optionally, the p-type or n-type material includes cesium bismuth telluride. Optionally, the p-type or n-type material includes bismuth antimony. Optionally, the p-type or n-type material includes a metallic thermoelectric material. Optionally, the p-type or n-type material includes an organic thermoelectric material. Optionally, the p-type or n-type material includes porous silicon.

In some configurations, a thermoelectric device includes a first thermoelectric element including a p-type material, a first end, a second end, a length between the first end and the second end, and a cross-sectional area. The device includes a second thermoelectric element including an n-type material, a first end, a second end, a length between the first end and the second end, and a cross-sectional area. The device includes a first electrode electrically coupled to the first end of the first thermoelectric element and to the first end of the second thermoelectric element, a second electrode electrically coupled to the second end of the first thermoelectric element, and a third electrode electrically coupled to the second end of the second thermoelectric element. The intrinsic Seebeck coefficient of at least one of the first and second thermoelectric elements varies monotonically along the length of that thermoelectric element. The intrinsic Seebeck coefficient at a first location along that length is at least 2.5 times the intrinsic Seebeck coefficient at a second location along that length.

Optionally, the intrinsic Seebeck coefficient of each of the first and second thermoelectric elements varies monotonically along the length of that thermoelectric element, and the intrinsic Seebeck coefficient at a first location along that length is at least 2.5 times the intrinsic Seebeck coefficient at a second location along that length.

Optionally, at least one respective interface between the first thermoelectric element and the first or second electrodes or between the second thermoelectric element and the first or third electrodes is textured so as to reduce interfacial resistance. Optionally, the interface includes a roughened surface. Optionally, the interface includes a roughened electrically conductive material. Optionally, the roughened electrically conductive material includes a metalized interfacial material. Optionally, the interface includes trenches. Optionally, the interface includes a changed chemical composition. Optionally, the interface includes a heavily doped TE material. Optionally, the interface includes a change in dopant concentration. Optionally, the interface includes a saw tooth shape.

Optionally, the device further includes a control module electrically coupled to the second and third electrodes. The control module optionally is configured so as to pass current in series through the first thermoelectric element, the first electrode, and the second thermoelectric element via the second and third electrodes. Optionally, the first and second thermoelectric elements respectively are configured to generate a temperature gradient between their respective first and second ends responsive to the current. Optionally, the first and second thermoelectric elements respectively are configured to pump heat from the first electrode to the second and third electrodes responsive to the current. Optionally, the temperature gradient includes a temperature difference of at least 40 K. Optionally, the temperature gradient includes a temperature difference of at least 73 K.

Optionally, the device further includes a cold sink thermally coupled to the first electrode and a heat sink thermally coupled to the second and third electrodes, the cold sink and the heat sink generating a temperature gradient between the respective first and second ends of the first and second thermoelectric elements. Optionally, the first and second thermoelectric elements respectively are configured to generate a current through the control module responsive to the temperature gradient.

Optionally, the device further includes a cold sink thermally coupled to the first electrode. Optionally, the cold sink includes a first heat exchanger. Optionally, the first heat exchanger includes a first fin heat transfer radiator. Optionally, the device further includes a heat sink thermally coupled to the second and third electrodes. Optionally, the heat sink includes a second heat exchanger. Optionally, the second heat exchanger includes a second fin heat transfer radiator.

Optionally, a first cascade stage of the thermoelectric device includes the first and second thermoelectric elements and the first, second, and third electrodes, and the thermoelectric device further includes a second cascade stage thermally coupled to and electrically insulated from the first cascade stage. The second cascade stage may include a third thermoelectric element including a p-type material, a first end, a second end, and a length between the first end and the second end. The second cascade stage may include a fourth thermoelectric element including an n-type material, a first end, a second end, and a length between the first end and the second end. The second cascade stage may include a fourth electrode electrically coupled to the first end of the third thermoelectric element and to the first end of the fourth thermoelectric element, a fifth electrode electrically coupled to the second end of the third thermoelectric element, and a sixth electrode electrically coupled to the second end of the fourth thermoelectric element. The intrinsic Seebeck coefficient of at least one of the third and fourth thermoelectric elements varies monotonically along the length of that thermoelectric element.

Optionally, the intrinsic Seebeck coefficient at a first location along the length of the at least one of the third and fourth thermoelectric elements is at least 2.5 times the intrinsic Seebeck coefficient at a second location along that length. Optionally, the device further includes an electrical insulator coupling the fourth electrode to the second and third electrodes. Optionally, the device further includes a heat sink thermally coupled to the fifth and sixth electrodes. Optionally, the device further includes a cold sink thermally coupled to the first electrode. Optionally, the device further includes a control module electrically coupled to the second and third electrodes and to the fifth and sixth electrodes. Optionally, the control module is configured so as to pass a first current in series through the first thermoelectric element, the first electrode, and the second thermoelectric element via the second and third electrodes, and so as to pass a second current in series through the third thermoelectric element, the fourth electrode, and the fourth thermoelectric element via the fifth and sixth electrodes. Optionally, the first and second thermoelectric elements respectively are configured to generate a first temperature gradient between their respective first and second ends responsive to the first current, and the third and fourth thermoelectric elements respectively are configured to generate a second temperature gradient between their respective first and second ends responsive to the second current. Optionally, the first and second thermoelectric elements respectively are configured to pump heat from the first electrode to the second and third electrodes responsive to the current, and the third and fourth thermoelectric elements respectively are configured to pump heat from the fourth electrode to the fifth and sixth electrodes responsive to the second current.

Optionally, at least one of the first and second temperature gradients includes a temperature difference of at least 40 K. Optionally, each of the first and second temperature gradients includes a temperature difference of at least 40 K. Optionally, at least one of the first and second temperature gradients includes a temperature difference of at least 73 K. Optionally, each of the first and second temperature gradients includes a temperature difference of at least 73 K.

Optionally, the device further includes a cold sink thermally coupled to the first electrode and a heat sink thermally coupled to the fifth and sixth electrodes, the cold sink and the heat sink generating a first temperature gradient between the respective first and second ends of the first and second thermoelectric elements and a second temperature gradient between the respective first and second ends of the third and fourth thermoelectric elements. Optionally, the first and second thermoelectric elements respectively are configured to generate a first current through the control module responsive to the first temperature gradient, and the third and fourth thermoelectric elements respectively are configured to generate a second current through the control module responsive to the second temperature gradient.

Optionally, the cross-sectional area of at least one of the first and second thermoelectric elements varies along the length of that thermoelectric element. Optionally, the cross-sectional area of at least one of the first and second thermoelectric elements varies along monotonically along the length of that thermoelectric element. Optionally, the cross-sectional area of at least one of the first and second thermoelectric elements decreases and then increases along the length of that thermoelectric element. Optionally, the cross-sectional area of at least one of the first and second thermoelectric elements has an hourglass type shape along the length of that thermoelectric element. Optionally, the cross-sectional area of at least one of the first and second thermoelectric elements varies smoothly along the length of that thermoelectric element. Optionally, the cross-sectional area of at least one of the first and second thermoelectric elements includes a discontinuity along the length along the length of that thermoelectric element.

Optionally, a composition of the respective p-type or n-type material of the first or second thermoelectric element varies along the length of that thermoelectric element. Optionally, a doping of the respective p-type or n-type material of the first or second thermoelectric element varies along the length of that thermoelectric element. Optionally, a crystal structure of the respective p-type or n-type material of the first or second thermoelectric element varies along the length of that thermoelectric element. Optionally, a porosity of the respective p-type or n-type material of the first or second thermoelectric element varies along the length of that thermoelectric element.

Optionally, the respective p-type or n-type material of the first or second thermoelectric element includes a first segment and a second segment. Optionally, the second segment includes a different elemental composition than the first segment. Optionally, the second segment includes a different doping level than the first segment. Optionally, the second segment includes a different crystal structure than the first segment. Optionally, the second segment includes a different porosity than the first segment.

Optionally, the intrinsic Seebeck coefficient of the first or second thermoelectric element includes at least one discontinuity along the length of that thermoelectric element. Optionally, the intrinsic Seebeck coefficient of the first or second thermoelectric element varies smoothly along the length of that thermoelectric element.

In some embodiments, a method of changing the temperature of a first object includes thermally contacting the first object with a first thermoelectric device. Nonlimiting embodiments of such a method are described, for example, with reference to FIGS. 1A-1C, 2A-2B, and 3A-3B. The first thermoelectric device includes a first thermoelectric element including a p-type material, a first end, a second end, a length between the first end and the second end, and a cross-sectional area. The first thermoelectric device also includes a second thermoelectric element including an n-type material, a first end, a second end, a length between the first end and the second end, and a cross-sectional area. The first thermoelectric device also includes a first electrode electrically coupled to the first end of the first thermoelectric element and to the first end of the second thermoelectric element, a second electrode electrically coupled to the second end of the first thermoelectric element, and a third electrode electrically coupled to the second end of the second thermoelectric element. The first thermoelectric device also includes a control module electrically coupled to the second and third electrodes. The intrinsic Seebeck coefficient of at least one of the first and second thermoelectric elements varies monotonically along the length of that thermoelectric element, and the intrinsic Seebeck coefficient at a first location along that length is at least 2.5 times the intrinsic Seebeck coefficient at a second location along that length. The method includes passing, by the control module, a first current in series through the first thermoelectric element, the first electrode, and the second thermoelectric element via the second and third electrodes so as induce a first temperature gradient along the length of each of the first and second thermoelectric elements.

Optionally, the intrinsic Seebeck coefficient of each of the first and second thermoelectric elements varies monotonically along the length of that thermoelectric element, and the intrinsic Seebeck coefficient at a first location along that length is at least 2.5 times the intrinsic Seebeck coefficient at a second location along that length.

Optionally, at least one respective interface between the first thermoelectric element and the first or second electrodes or between the second thermoelectric element and the first or third electrodes is textured so as to reduce interfacial resistance.

Optionally, the first and second thermoelectric elements respectively pump heat from the first electrode to the second and third electrodes responsive to the current.

Optionally, the first temperature gradient includes a temperature difference of at least 40 K. Optionally, the first temperature gradient includes a temperature difference of at least 73 K.

Optionally, the first object includes a cold sink thermally coupled to the first electrode. Optionally, the cold sink includes a heat exchanger. Optionally, the heat exchanger includes a fin heat transfer radiator.

Optionally, the first object includes a heat sink thermally coupled to the second and third electrodes. Optionally, the heat sink includes a heat exchanger. Optionally, the heat exchanger includes a fin heat transfer radiator.

Optionally, the method includes providing a second thermoelectric device thermally coupled to and electrically insulated from the first thermoelectric device. The second thermoelectric device includes a third thermoelectric element including a p-type material, a first end, a second end, and a length between the first end and the second end. The second thermoelectric device includes a fourth thermoelectric element including an n-type material, a first end, a second end, and a length between the first end and the second end. The second thermoelectric device includes a fourth electrode electrically coupled to the first end of the third thermoelectric element and to the first end of the fourth thermoelectric element, a fifth electrode electrically coupled to the second end of the third thermoelectric element, and a sixth electrode electrically coupled to the second end of the fourth thermoelectric element. The intrinsic Seebeck coefficient of at least one of the third and fourth thermoelectric elements varies monotonically along the length of that thermoelectric element.

Optionally, the intrinsic Seebeck coefficient at a first location along the length of the at least one of the third and fourth thermoelectric elements is at least 2.5 times the intrinsic Seebeck coefficient at a second location along that length.

Optionally, the method further includes providing an electrical insulator coupling the fourth electrode to the second and third electrodes.

Optionally, the first object includes a cold sink thermally coupled to the first electrode. Optionally, the method further includes thermally coupling a second object to the fifth and sixth electrodes. Optionally, the second object includes a heat sink. Optionally, the control module further is configured so as to pass a second current in series through the third thermoelectric element, the fourth electrode, and the fourth thermoelectric element via the fifth and sixth electrodes. The third and fourth thermoelectric elements respectively are optionally configured to generate a second temperature gradient between their respective first and second ends responsive to the second current. Optionally, the first and second thermoelectric elements respectively are configured to pump heat from the first electrode to the second and third electrodes responsive to the first current, and the third and fourth thermoelectric elements respectively are configured to pump heat from the fourth electrode to the fifth and sixth electrodes responsive to the second current.

Optionally, at least one of the first and second temperature gradients includes a temperature difference of at least 40 K. Optionally, each of the first and second temperature gradients includes a temperature difference of at least 40 K. Optionally, at least one of the first and second temperature gradients includes a temperature difference of at least 73 K. Optionally, each of the first and second temperature gradients includes a temperature difference of at least 73 K.

Optionally, the cross-sectional area of at least one of the first and second thermoelectric elements varies along the length of that thermoelectric element. Optionally, the cross-sectional area of at least one of the first and second thermoelectric elements varies along monotonically along the length of that thermoelectric element. Optionally, the cross-sectional area of at least one of the first and second thermoelectric elements decreases and then increases along the length of that thermoelectric element. Optionally, the cross-sectional area of at least one of the first and second thermoelectric elements has an hourglass type shape along the length of that thermoelectric element. Optionally, the cross-sectional area of at least one of the first and second thermoelectric elements varies smoothly along the length of that thermoelectric element. Optionally, the cross-sectional area of at least one of the first and second thermoelectric elements includes a discontinuity along the length along the length of that thermoelectric element.

Optionally, a composition of the respective p-type or n-type material of the first or second thermoelectric element varies along the length of that thermoelectric element. Optionally, a doping of the respective p-type or n-type material of the first or second thermoelectric element varies along the length of that thermoelectric element. Optionally, a crystal structure of the respective p-type or n-type material of the first or second thermoelectric element varies along the length of that thermoelectric element. Optionally, a porosity of the respective p-type or n-type material of the first or second thermoelectric element varies along the length of that thermoelectric element. Optionally, the respective p-type or n-type material of the first or second thermoelectric element includes a first segment and a second segment. Optionally, the second segment includes a different elemental composition than the first segment. Optionally, the second segment includes a different doping level than the first segment. Optionally, the second segment includes a different crystal structure than the first segment. Optionally, the second segment includes a different porosity than the first segment.

Optionally, the intrinsic Seebeck coefficient of the first or second thermoelectric element includes at least one discontinuity along the length of that thermoelectric element. Optionally, the intrinsic Seebeck coefficient of the first or second thermoelectric element varies smoothly along the length of that thermoelectric element.

In some configurations, a thermoelectric element has a length and a cross-sectional area and including a p-type or n-type material. The intrinsic Seebeck coefficient of the p-type or n-type material varies monotonically along the length of the thermoelectric element, and the cross-sectional area varies along the length of the thermoelectric element.

All of the references described above are hereby incorporated by reference herein in their entireties.

Several different embodiments and combinations in accordance with the present invention have been described above. The embodiments are intended to be exemplary rather than restrictive. Variations and combinations of the above embodiments may be made without departing from the invention. Accordingly, the invention is defined by the following claims and their equivalents.

What is claimed is:

1. A method of designing a thermoelectric element having a length between a hot end and a cold end, the method comprising:

selecting spatially varying properties of a p-type or n-type material so as to define two or more of: a Seebeck coefficient (S) having an absolute value that generally increases from the cold end to the hot end as a function of position when no current is flowing, an electrical resistivity (ρ) having an absolute value that generally increases from the cold end to the hot end as a function of position when no current is flowing, and a thermal conductivity (λ) having an absolute value that generally increases from the cold end to the hot end as a function of position when no current is flowing, wherein at least one of such increases is nonlinear.

2. The method of claim 1, further comprising calculating variations in the Seebeck coefficient (S) of the p-type or n-type material using $$S(\varepsilon, x) = S_C e^{A(\varepsilon)\frac{x}{x_0}} \text{ where } A(\varepsilon) = \frac{ZT\varepsilon^2 + \ln^2\left(\frac{T_H}{T_C}\right)}{ZT\varepsilon - \ln\left(\frac{T_H}{T_C}\right)}$$

wherein x is position along the thermoelectric element, ε is dimensionless current, $T_C$ is temperature at the cold end (x=0), $T_H$ is temperature at the hot end (x=$x_0$), $S_C$ is the Seebeck coefficient at the cold end, and ZT is a thermoelectric figure of merit and is constant.

3. The method of claim 1, further comprising calculating variations in the thermal conductivity (λ) of the p-type or n-type material using $$\lambda(\varepsilon, x) = \lambda_C e^{B(\varepsilon)\frac{x}{x_0}} \text{ where } B(\varepsilon) = \frac{ZT\varepsilon^2 + \ln^2\left(\frac{T_H}{T_C}\right)}{ZT\varepsilon - \ln\left(\frac{T_H}{T_C}\right)}$$

wherein x is position along the thermoelectric element, ε is dimensionless current, $T_C$ is temperature at the cold end (x=0), $T_H$ is temperature at the hot end (x=$x_0$), $\lambda_C$ is the thermal conductivity at the cold end, and ZT is a thermoelectric figure of merit and is constant.

4. The method of claim 1, further comprising calculating variations in the electrical resistivity (ρ) of the p-type or n-type material using $$\rho(\varepsilon, x) = \rho_C e^{C(\varepsilon)\frac{x}{x_0}} \text{ where } C(\varepsilon) = \frac{\varepsilon + \ln\left(\frac{T_H}{T_C}\right)}{1 - \frac{\ln\left(\frac{T_H}{T_C}\right)}{ZT\varepsilon}}$$

wherein x is position along the thermoelectric element, ε is dimensionless current, $T_C$ is temperature at the cold end (x=0), $T_H$ is temperature at the hot end (x=$x_0$), $\rho_C$ is the electrical resistivity at the cold end, and ZT is a thermoelectric figure of merit and is constant.

5. The method of claim 1, comprising selecting spatially varying properties of the p-type or n-type material so as to define all three of the absolute value of S, ρ, and λ generally increasing along the length from the cold end to the hot end.

6. The method of claim 1, comprising selecting a spatially varying cross-sectional area of the p-type or n-type material.

7. The method of claim 1, wherein the spatially varying properties comprise spatially varying compositions, dopings, crystal structures, or porosities of the p-type or n-type materials.

8. The method of claim 1, comprising selecting spatially varying properties of the p-type or n-type material such that S at a first location along the length is at least 1.5 times S at a second location along the length in the direction of the cold end.

9. The method of claim 1, wherein the p-type or n-type material is selected from the group consisting of bismuth telluride, cesium bismuth telluride, and bismuth antimony, or comprises a metallic thermoelectric material, an organic thermoelectric material, or porous silicon, or a combination of one or more of such materials.

10. The method of claim 1, comprising selecting spatially varying properties of the p-type or n-type material so as to define that each of two or more of the absolute value of S, ρ, and λ increases at two or more positions between the cold end to the hot end.

11. The method of claim 1, comprising selecting spatially varying properties of the p-type or n-type material so as to define that at least one of the absolute value of S, ρ, and λ increase continuously over at least part of said thermoelectric element.

12. The method of claim 1, comprising selecting spatially varying properties of the p-type or n-type material so as to define that each of two or more of S, ρ, and λ are such that at maximum coefficient of performance (COP), a curve describing temperatures between the cold end and the hot end has at least two positions that are below temperatures represented by a straight line between said cold end and said hot end.

13. A method of fabricating a thermoelectric element having a length between a hot end and a cold end, the method comprising:

selecting spatially varying properties of a p-type or n-type material so as to define two or more of: a Seebeck coefficient (S) having an absolute value that generally increases from the cold end to the hot end as a function of position when no current is flowing, an electrical resistivity (ρ) having an absolute value that generally increases from the cold end to the hot end as a function of position when no current is flowing, and a thermal conductivity (λ) having an absolute value that generally increases from the cold end to the hot end as a function of position when no current is flowing, wherein at least one of such increases is nonlinear; and manufacturing the p-type or n-type material having approximately the selected spatially varying properties.

14. The method of claim 13, further comprising calculating variations in the Seebeck coefficient (S) of the p-type or n-type material using $$S(\varepsilon, x) = S_C e^{A(\varepsilon)\frac{x}{x_0}} \text{ where } A(\varepsilon) = \frac{ZT\varepsilon^2 + \ln^2\left(\frac{T_H}{T_C}\right)}{ZT\varepsilon - \ln\left(\frac{T_H}{T_C}\right)}$$

wherein x is position along the thermoelectric element, $\varepsilon$ is dimensionless current, $T_C$ is temperature at the cold end (x=0), $T_H$ is temperature at the hot end (x=$x_0$), $S_C$ is the Seebeck coefficient at the cold end, and ZT is a thermoelectric figure of merit and is constant.

15. The method of claim 13, further comprising calculating variations in the thermal conductivity ($\lambda$) of the p-type or n-type material using $$\lambda(\varepsilon, x) = \lambda_C e^{B(\varepsilon)\frac{x}{x_0}} \text{ where } B(\varepsilon) = \frac{ZT\varepsilon^2 + \ln^2\left(\frac{T_H}{T_C}\right)}{ZT\varepsilon - \ln\left(\frac{T_H}{T_C}\right)}$$

wherein x is position along the thermoelectric element, $\varepsilon$ is dimensionless current, $T_C$ is temperature at the cold end (x=0), $T_H$ is temperature at the hot end (x=$x_0$), $\lambda_C$ is the thermal conductivity at the cold end, and ZT is a thermoelectric figure of merit and is constant.

16. The method of claim 13, further comprising calculating variations in the electrical resistivity ($\rho$) of the p-type or n-type material using $$\rho(\varepsilon, x) = \rho_C e^{C(\varepsilon)\frac{x}{x_0}} \text{ where } C(\varepsilon) = \frac{\varepsilon + \ln\left(\frac{T_H}{T_C}\right)}{1 - \frac{\ln\left(\frac{T_H}{T_C}\right)}{ZT\varepsilon}}$$

wherein x is position along the thermoelectric element, $\varepsilon$ is dimensionless current, $T_C$ is temperature at the cold end (x=0), $T_H$ is temperature at the hot end (x=$x_0$), $\rho_C$ is the electrical resistivity at the cold end, and ZT is a thermoelectric figure of merit and is constant.

17. The method of claim 13, comprising selecting spatially varying properties of the p-type or n-type material so as to define all three of the absolute value of S, $\rho$, and $\lambda$ generally increasing along the length from the cold end to the hot end.

18. The method of claim 13, comprising selecting a spatially varying cross-sectional area of the p-type or n-type material.

19. The method of claim 13, wherein the spatially varying properties comprise spatially varying compositions, dopings, crystal structures, or porosities of the p-type or n-type materials.

20. The method of claim 13, comprising selecting spatially varying properties of the p-type or n-type material such that S at a first location along the length is at least 1.5 times S at a second location along the length in the direction of the cold end.

21. The method of claim 13, wherein the p-type or n-type material is selected from the group consisting of bismuth telluride, cesium bismuth telluride, and bismuth antimony, or comprises a metallic thermoelectric material, an organic thermoelectric material, or porous silicon, or a combination of one or more of such materials.

22. The method of claim 13, comprising selecting spatially varying properties of the p-type or n-type material so as to define that each of two or more of the absolute value of S, $\rho$, and $\lambda$ increases at two or more positions between the cold end to the hot end.

23. The method of claim 13, comprising selecting spatially varying properties of the p-type or n-type material so as to define that at least one of the absolute value of S, $\rho$, and $\lambda$ increase continuously over at least part of said thermoelectric element.

24. The method of claim 13, comprising selecting spatially varying properties of the p-type or n-type material so as to define that each of two or more of S, $\rho$, and $\lambda$ are such that at maximum coefficient of performance (COP), a curve describing temperatures between the cold end and the hot end has at least two positions that are below temperatures represented by a straight line between said hot end and said cold end.

* * * * *